(12) United States Patent
Yokogawa et al.

(10) Patent No.: US 12,085,410 B2
(45) Date of Patent: Sep. 10, 2024

(54) SOLID-STATE IMAGING DEVICE AND DISTANCE MEASUREMENT DEVICE

(71) Applicant: SONY SEMICONDUCTOR SOLUTIONS CORPORATION, Kanagawa (JP)

(72) Inventors: Sozo Yokogawa, Kanagawa (JP); Yusuke Moriyama, Kanagawa (JP); Nobuhiro Kawai, Kanagawa (JP); Yuhi Yorikado, Kanagawa (JP); Fumihiko Koga, Kanagawa (JP); Yoshiki Ebiko, Kanagawa (JP); Suzunori Endo, Kanagawa (JP); Hayato Wakabayashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 333 days.

(21) Appl. No.: 17/611,970

(22) PCT Filed: Apr. 27, 2020

(86) PCT No.: PCT/JP2020/017964
§ 371 (c)(1),
(2) Date: Nov. 17, 2021

(87) PCT Pub. No.: WO2020/241151
PCT Pub. Date: Dec. 3, 2020

(65) Prior Publication Data
US 2022/0244046 A1     Aug. 4, 2022

(30) Foreign Application Priority Data

May 24, 2019   (JP) .................................. 2019-097969

(51) Int. Cl.
*G01C 3/06*         (2006.01)
*H04N 25/705*       (2023.01)
(Continued)

(52) U.S. Cl.
CPC ............. *G01C 3/06* (2013.01); *H04N 25/705* (2023.01); *H04N 25/772* (2023.01); *H04N 25/778* (2023.01)

(58) Field of Classification Search
CPC ...... G01C 3/06; H04N 25/778; H04N 25/705; H04N 25/772
See application file for complete search history.

(56) References Cited

U.S. PATENT DOCUMENTS

2006/0132633 A1   6/2006  Nam
2009/0108176 A1   4/2009  Blanquart
(Continued)

FOREIGN PATENT DOCUMENTS

CA      3065343 A1    12/2018
CN      109148493 A    1/2019
(Continued)

OTHER PUBLICATIONS

International Search Report prepared by the Japan Patent Office on May 27, 2020, for International Application No. PCT/JP2020/017964, 2 pgs.

*Primary Examiner* — Georgia Y Epps
*Assistant Examiner* — Don J Williams
(74) *Attorney, Agent, or Firm* — SHERIDAN ROSS P.C.

(57) ABSTRACT

A distance measurement accuracy is improved. A solid-state imaging device according to an embodiment includes a pixel array part in which a plurality of pixels is arranged in a matrix, in which each of the pixels includes a plurality of photoelectric conversion units that each photoelectrically converts incident light to generate a charge, a floating diffusion region that accumulates the charge, a plurality of transfer circuits that transfer the charge generated in each of the plurality of photoelectric conversion units to the floating diffusion region, and a first transistor that causes a pixel signal of a voltage value corresponding to a charge amount (Continued)

of the charge accumulated in the floating diffusion region to appear in a signal line.

17 Claims, 61 Drawing Sheets

(51) Int. Cl.
 *H04N 25/772* (2023.01)
 *H04N 25/778* (2023.01)

(56) References Cited

U.S. PATENT DOCUMENTS

| | | |
|---|---|---|
| 2010/0252718 A1 | 10/2010 | Lee |
| 2011/0134296 A1 | 6/2011 | Kuroda |
| 2011/0273597 A1 | 11/2011 | Ishiwata |
| 2012/0248514 A1 | 10/2012 | Korekado |
| 2015/0002717 A1 | 1/2015 | Kudoh |
| 2016/0020236 A1 | 1/2016 | Tanaka |
| 2016/0056199 A1 | 2/2016 | Kim |
| 2016/0165159 A1 | 6/2016 | Hseih |
| 2016/0306045 A1 | 10/2016 | Van Der Tempel |
| 2017/0269630 A1 | 9/2017 | Kamezawa |
| 2018/0219035 A1 | 8/2018 | Otsuki |
| 2018/0366504 A1* | 12/2018 | Jin .................. H01L 27/1461 |

FOREIGN PATENT DOCUMENTS

| | | |
|---|---|---|
| JP | 2009-008537 | 1/2009 |
| JP | 2012217059 A | 11/2012 |
| JP | 2016096471 A | 5/2016 |
| JP | 2017-201760 | 11/2017 |
| JP | 2018198272 A | 12/2018 |
| JP | 2019-004149 | 1/2019 |
| JP | 2019-029906 | 2/2019 |
| WO | WO 2017/056347 | 4/2017 |

* cited by examiner

H DIRECTION: FD SHARING IS IMPOSSIBLE
V DIRECTION: FD SHARING IS IMPOSSIBLE

H DIRECTION: FD SHARING IS IMPOSSIBLE
V DIRECTION: FD SHARING IS POSSIBLE

H DIRECTION: FD SHARING IS POSSIBLE
V DIRECTION: FD SHARING IS IMPOSSIBLE

H DIRECTION: FD SHARING IS POSSIBLE
V DIRECTION: FD SHARING IS POSSIBLE

CANCELLATION IMPOSSIBLE OF CHARACTERISTIC DIFFERENCE

CANCELLATION POSSIBLE OF CHARACTERISTIC DIFFERENCE

H DIRECTION: FD SHARING IS POSSIBLE
V DIRECTION: FD SHARING IS IMPOSSIBLE

CANCELLATION IMPOSSIBLE OF CHARACTERISTIC DIFFERENCE

CANCELLATION IMPOSSIBLE OF CHARACTERISTIC DIFFERENCE

CANCELLATION POSSIBLE OF CHARACTERISTIC DIFFERENCE

H DIRECTION: FD SHARING IS IMPOSSIBLE
V DIRECTION: FD SHARING IS POSSIBLE

CANCELLATION IMPOSSIBLE OF
CHARACTERISTIC DIFFERENCE

H DIRECTION: FD SHARING IS IMPOSSIBLE
V DIRECTION: FD SHARING IS POSSIBLE

H DIRECTION: FD SHARING IS POSSIBLE
V DIRECTION: FD SHARING IS IMPOSSIBLE

H DIRECTION: FD SHARING IS POSSIBLE
V DIRECTION: FD SHARING IS POSSIBLE

H DIRECTION: FD SHARING IS IMPOSSIBLE
V DIRECTION: FD SHARING IS POSSIBLE

H DIRECTION: FD SHARING IS POSSIBLE
V DIRECTION: FD SHARING IS IMPOSSIBLE

H DIRECTION: FD SHARING IS POSSIBLE
V DIRECTION: FD SHARING IS POSSIBLE

SOLID-STATE IMAGING DEVICE AND DISTANCE MEASUREMENT DEVICE

CROSS REFERENCE TO RELATED APPLICATIONS

This application is a national stage application under 35 U.S.C. 371 and claims the benefit of PCT Application No. PCT/JP2020/017964 having an international filing date of 27 Apr. 2020, which designated the United States, which PCT application claimed the benefit of Japanese Patent Application No. 2019-097969 filed 24 May 2019, the entire disclosures of each of which are incorporated herein by reference.

FIELD

The present disclosure relates to a solid-state imaging device and a distance measurement device.

BACKGROUND

In the related art, a distance measurement sensor (hereinafter, referred to as an indirect ToF sensor) using an indirect time of flight (ToF) method is known. In the indirect ToF sensor, a distance to an object is measured based on a signal charge obtained by emitting light from a light source at a certain phase and receiving the reflected light.

CITATION LIST

Patent Literature

Patent Literature 1: JP 2019-4149 A

SUMMARY

Technical Problem

As a pixel architecture of an indirect ToF sensor, a 2-tap type pixel architecture in which one pixel has two memories is common. In the 2-tap type pixel architecture, a distance image indicating a distance to an object is generated based on a ratio of charges accumulated in each of the two memories of each pixel.

Here, there is usually a characteristic difference between the two memories included in each pixel. This characteristic difference causes an individual difference in an amount of charge accumulated in the memory of each pixel, and thus, causes a problem that a distance measurement accuracy of the indirect ToF sensor is lowered.

Therefore, the present disclosure proposes a solid-state imaging device and distance measurement device capable of improving distance measurement accuracy.

DESCRIPTION OF EMBODIMENTS

Figure 1:
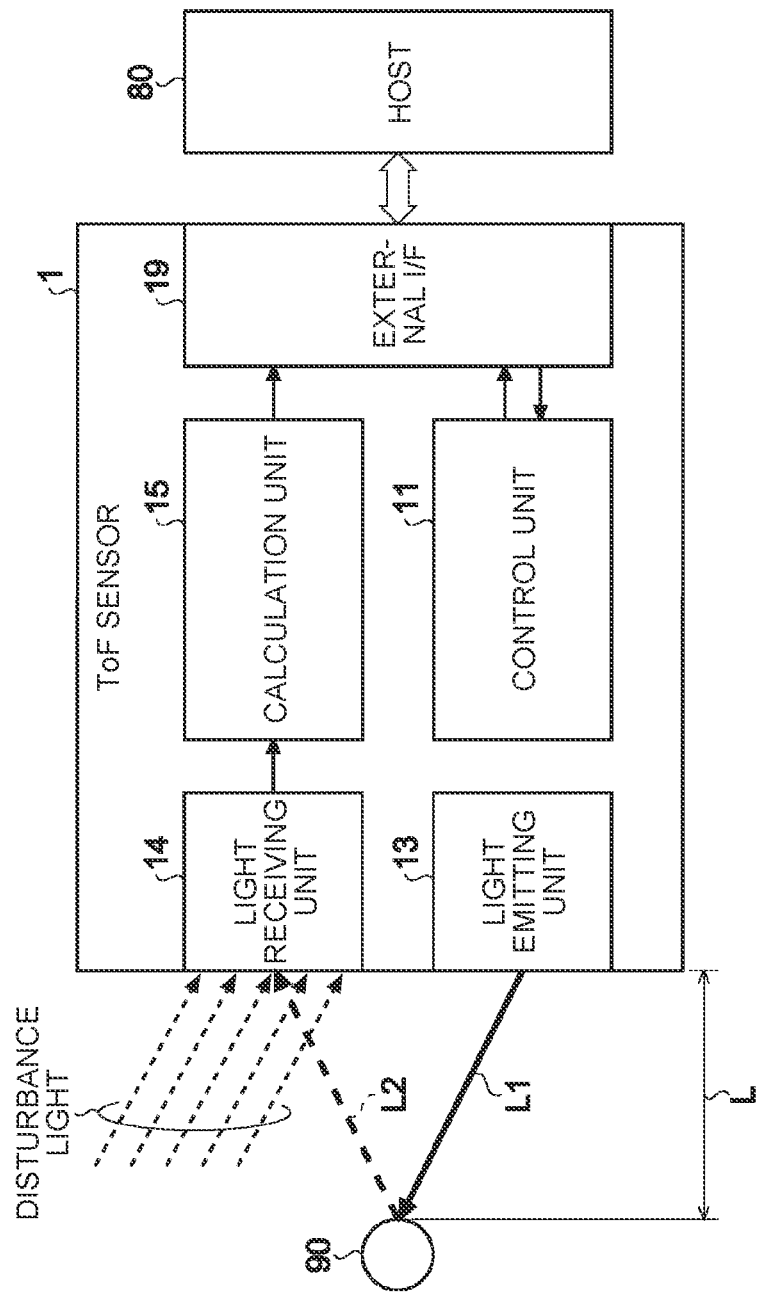
FIG. 1 is a block diagram illustrating a schematic configuration example of a ToF sensor as a distance measurement device according to a first embodiment.

Hereinafter, an embodiment of the present disclosure will be described in detail with reference to the drawings. Note that, in the following embodiments, the same portions are denoted by the same reference numerals, and redundant description will be omitted.

In addition, the present disclosure will be described according to the following item order.
1. First Embodiment
1.1 Distance measurement device (ToF sensor)
1.2 Configuration example of solid-state imaging device
1.3 Basic configuration example of unit pixel
1.4 Basic layout example of unit pixel
1.5 Outline of indirect ToF method
1.6 Configuration example of unit pixel
1.6.1 First configuration example
1.6.2 Second configuration example
1.6.3 Third configuration example
1.6.4 Fourth configuration example
1.6.5 Fifth configuration example
1.6.6 Sixth configuration example
1.6.7 Seventh configuration example
1.7 Pixel isolation structure
1.7.1 First layout example
1.7.2 Second layout example
1.7.3 Third layout example
1.8 Cross-sectional structure example of unit pixel
1.8.1 First cross-sectional structure example
1.8.2 Second cross-sectional structure example
1.8.3 Third cross-sectional structure example
1.8.4 Fourth cross-sectional structure example
1.9 Layout for FD sharing
1.9.1 First variation
1.9.2 Second variation
1.9.3 Third variation
1.9.4 Fourth variation
1.9.5 Fifth variation
1.9.6 Sixth variation
1.9.7 Seventh variation
1.9.8 Eighth variation
1.9.9 Ninth variation
1.9.10 Tenth variation
1.9.11 Eleventh variation
1.9.12 Twelfth variation
1.9.13 Thirteenth variation
1.9.14 Fourteenth variation
1.9.15 Fifteenth variation
1.9.16 Sixteenth variation
1.10 Cancellation of characteristic difference
1.11 Example of reading operation of distance measurement image (depth frame)
1.12 Drive pulse example
1.12.1 First drive pulse example
1.12.1.1 Modification example
1.12.2 Second drive pulse example
1.13 Encoding of accumulation period
1.13.1 Noise due to interference
1.13.1.1 Interference due to background light
1.13.1.2 Interference from another ToF sensor
1.13.1.2.1 When reflected light from another ToF sensor is incident during non-accumulation period
1.13.1.2.2 When reflected light from another ToF sensor is incident during accumulation period
1.13.2 Noise cancellation by interference
1.13.2.1 Example of noise cancellation by encoding of accumulation period
1.13.2.1.1 Case where modulation frequency of interference light from another ToF sensor is different from modulation frequency of its own irradiation light
1.13.2.1.2 Case where modulation frequency of interference light from another ToF sensor is the same as modulation frequency of its own irradiation light
1.13.2.1.3 Case where modulation frequency and phase of interference light from another ToF sensor are the same as modulation frequency and phase of its own irradiation light
1.13.3 Noise generated at the time of phase switching
1.13.3.1 Example of noise cancellation operation at the time of phase switching (in case of 2-tap type)
1.13.3.2 Modification example of noise cancellation operation at the time of phase switching
1.13.3.3 Modification example of noise cancellation operation at the time of phase switching (in case of multi-tap type of three taps or more)
1.14 Action and effect
2. Second Embodiment
2.1 First configuration example
2.2 Second configuration example
2.3 Third configuration example 3. Configuration example of laminated solid-state imaging device to which technology according to present disclosure can be applied
4. Example of electronic device to which technology according to the present disclosure can be applied
5. Various application examples
6. Application example to mobile body

1. FIRST EMBODIMENT

First, a first embodiment will be described in detail below with reference to the drawings. Note that, in the first embodiment, for example, a solid-state imaging device and a distance measurement device that measure a distance to an object by an indirect ToF method will be described with an example.

The solid-state imaging device and the distance measurement device according to the present embodiment and the embodiments exemplified below can be applied to, for example, an in-vehicle system that is mounted on a vehicle and measures a distance to an object outside the vehicle, a gesture recognition system that measures a distance to an object such as a hand of a user and recognizes a gesture of the user based on a measurement result, or the like. In this case, a result of the gesture recognition can also be used for, for example, an operation of a car navigation system.

1.1 Distance Measurement Device (ToF Sensor)

FIG. 1 is a block diagram illustrating a schematic configuration example of a ToF sensor as a distance measurement device according to a first embodiment. As illustrated in FIG. 1, a ToF sensor 1 includes a control unit 11, a light emitting unit 13, a light receiving unit 14, a calculation unit 15, and an external interface (I/F) 19.

The control unit 11 includes, for example, an information processing device such as a central processing unit (CPU) and controls each unit of the ToF sensor 1.

The external I/F 19 may be, for example, a communication adapter for establishing communication with the external host 80 via a communication network conforming to an arbitrary standard such as a controller area network (CAN), a local interconnect network (LIN), FlexRay (registered trademark), a mobile industry processor interface (MIPI), or low voltage differential signaling (LVDS) in addition to a wireless local area network (LAN) or a wired LAN.

Here, for example, when the ToF sensor 1 is mounted on an automobile or the like, the host 80 may be an engine control unit (ECU) mounted on the automobile or the like. Furthermore, in a case where the ToF sensor 1 is mounted on an autonomous mobile robot such as a domestic pet robot or an autonomous mobile body such as a robot cleaner, an unmanned aerial vehicle, or a following conveyance robot, the host 80 may be a control device or the like that controls the autonomous mobile body. Furthermore, in a case where the ToF sensor 1 is mounted on an electronic device such as a mobile phone, a smartphone, or a tablet terminal, the host 80 may be a CPU incorporated in the electronic device, a server (including a cloud server or the like) connected to the electronic device via a network, or the like.

The light emitting unit 13 includes, for example, one or a plurality of semiconductor laser diodes as a light source, and emits pulsed laser light (hereinafter, referred to as irradiation light) L1 having a predetermined time width at a predetermined cycle (also referred to as a light emission cycle). The light emitting unit 13 emits the irradiation light L1 at least toward an angle range equal to or larger than an angle of view of the light receiving unit 14. In addition, the light emitting unit 13 emits the irradiation light L1 having a time width of several nanoseconds (ns) to 5 ns at a cycle of 100 megahertz (MHz), for example. For example, in a case where an object 90 is present within the distance measurement range, the irradiation light L1 emitted from the light emitting unit 13 is reflected by the object 90 and is incident on the light receiving unit 14 as reflected light L2.

Although details will be described later, the light receiving unit 14 includes, for example, a plurality of pixels arranged in a two-dimensional lattice pattern, and outputs signal intensity (hereinafter, also referred to as a pixel signal) detected in each pixel after light emission of the light emitting unit 13.

The calculation unit 15 generates a depth image within the angle of view of the light receiving unit 14 based on the pixel signal output from the light receiving unit 14. At that time, the calculation unit 15 may execute predetermined processing such as noise removal on the generated depth image. The depth image generated by the calculation unit 15 can be output to the host 80 or the like via the external I/F 19, for example.

1.2 Configuration Example of Solid-State Imaging Device

Figure 2:
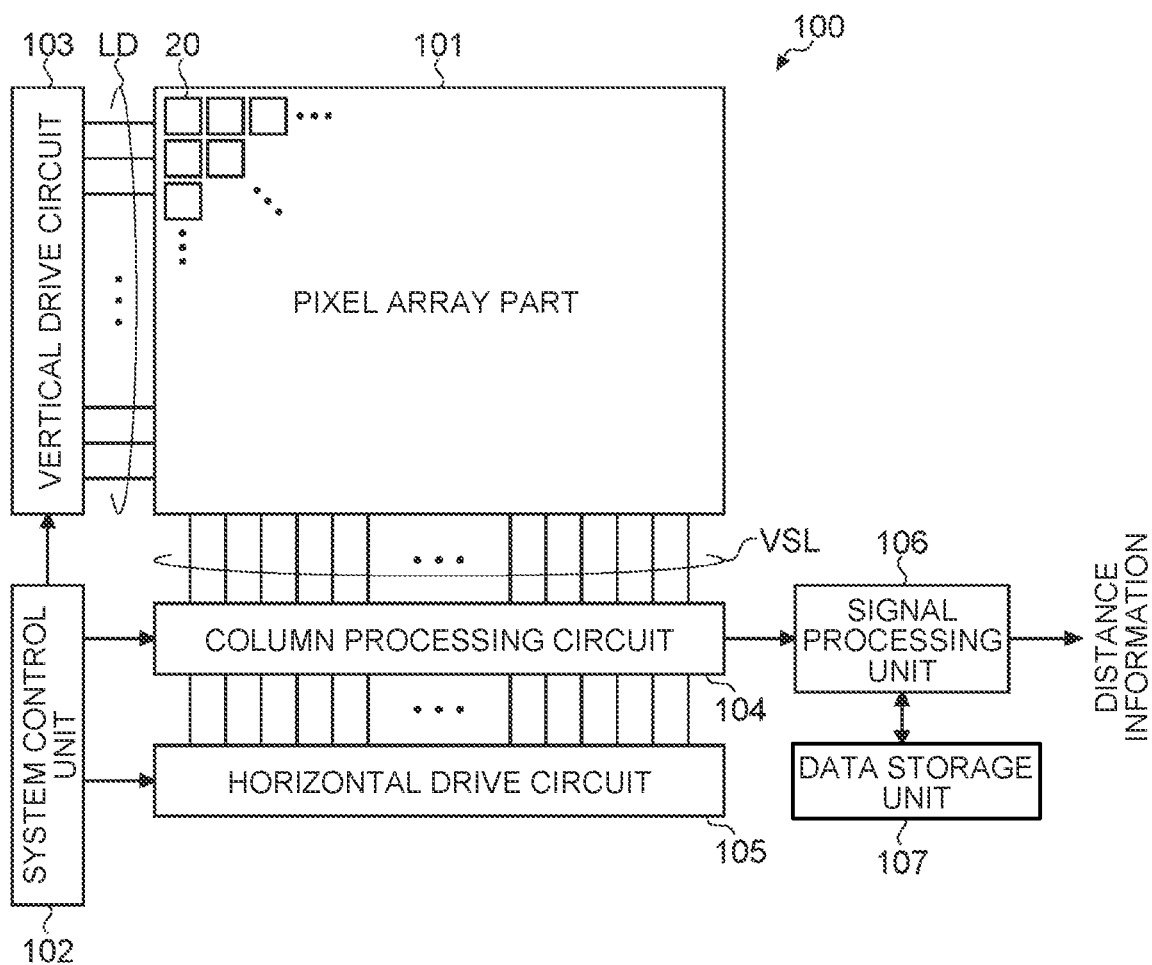
FIG. 2 is a block diagram illustrating a schematic configuration example of a solid-state imaging device serving as a light receiving unit according to the first embodiment.

FIG. 2 is a block diagram illustrating a schematic configuration example of the solid-state imaging device as the light receiving unit according to the first embodiment.

A solid-state imaging device 100 illustrated in FIG. 2 is a back-illuminated indirect ToF sensor, and is provided in a distance measurement device having a distance measurement function.

The solid-state imaging device 100 includes a pixel array part 101 and a peripheral circuit. The peripheral circuit may include, for example, a vertical drive circuit 103, a column processing circuit 104, a horizontal drive circuit 105, and a system control unit 102.

The solid-state imaging device 100 further includes a signal processing unit 106 and a data storage unit 107. Note that the signal processing unit 106 and the data storage unit 107 may be mounted on the same substrate as the solid-state imaging device 100, or may be arranged on a substrate different from the solid-state imaging device 100 in the distance measurement device.

The pixel array part 101 has a configuration in which pixels (hereinafter, also referred to as a unit pixel) 20 that generate charges according to the amount of received light and output signals according to the charges are arranged in a row direction and a column direction, that is, on a matrix (also referred to as a two-dimensional lattice shape).

Here, the row direction refers to an arrangement direction (later direction in drawings) of the unit pixels 20 in the pixel row, and the column direction refers to an arrangement direction (longitudinal direction in drawings) of the unit pixels 20 in the pixel column.

In the pixel array part 101, a pixel drive line LD is wired along the row direction for each pixel row and two vertical signal lines VSL are wired along the column direction for each pixel column with respect to the pixel array in the matrix form. The pixel drive line LD transmits a drive signal for driving when reading a signal from the unit pixel 20. Note that, in FIG. 2, the pixel drive line LD is illustrated as one wire, but is not limited to one. One end of the pixel drive line LD is connected to an output terminal corresponding to each row of the vertical drive circuit 103.

The vertical drive circuit 103 includes a shift register, an address decoder, and the like, and drives each unit pixel 20 of the pixel array part 101 at the same time for all pixels or in units of rows. That is, the vertical drive circuit 103 constitutes a drive unit that controls the operation of each unit pixel 20 of the pixel array part 101 together with the system control unit 102 that controls the vertical drive circuit 103.

Note that, in distance measurement by the indirect ToF method, the number of elements to be driven at a high speed connected to one pixel drive line LD affects controllability of high-speed driving and driving accuracy. Here, in most cases, the pixel array part of the solid-state imaging device used for distance measurement by the indirect ToF method is a rectangular region long in the row direction. Therefore, in such a case, the vertical signal line VSL or another control line extending in the column direction may be used as the pixel drive line LD of the element to be driven at a high speed. In the case of such a configuration, for example, the plurality of unit pixels 20 arranged in the column direction are connected to the vertical signal line VSL and other control lines extending in the column direction, and driving of the unit pixels 20, that is, driving of the solid-state imaging device 100 is performed by the drive unit, the horizontal drive circuit 105, and the like provided separately from the vertical drive circuit 103 via the vertical signal line VSL or other control lines.

A signal output from each unit pixel 20 of the pixel row according to the drive control by the vertical drive circuit 103 is input to the column processing circuit 104 through the vertical signal line VSL. The column processing circuit 104 performs predetermined signal processing on the signal output from each unit pixel 20 through the vertical signal line VSL, and temporarily holds the pixel signal after the signal processing.

Specifically, the column processing circuit 104 performs noise removal processing, analog to digital (AD) conversion processing, and the like as signal processing.

The horizontal drive circuit 105 includes a shift register, an address decoder, and the like, and sequentially selects unit circuits corresponding to pixel columns of the column processing circuit 104. By selective scanning by the horizontal drive circuit 105, pixel signals subjected to signal processing for each unit circuit in the column processing circuit 104 are sequentially output.

The system control unit 102 includes a timing generator that generates various timing signals and the like, and performs drive control of the vertical drive circuit 103, the column processing circuit 104, the horizontal drive circuit 105, and the like on the basis of the various timing signals generated by the timing generator.

The signal processing unit 106 has at least an arithmetic processing function, executes various types of signal processing such as arithmetic processing on the basis of the pixel signal output from the column processing circuit 104, and outputs distance information for each pixel calculated thereby to the outside. The data storage unit 107 temporarily stores data necessary for signal processing in the signal processing unit 106.

1.3 Basic Configuration Example of Unit Pixel

Figure 3:
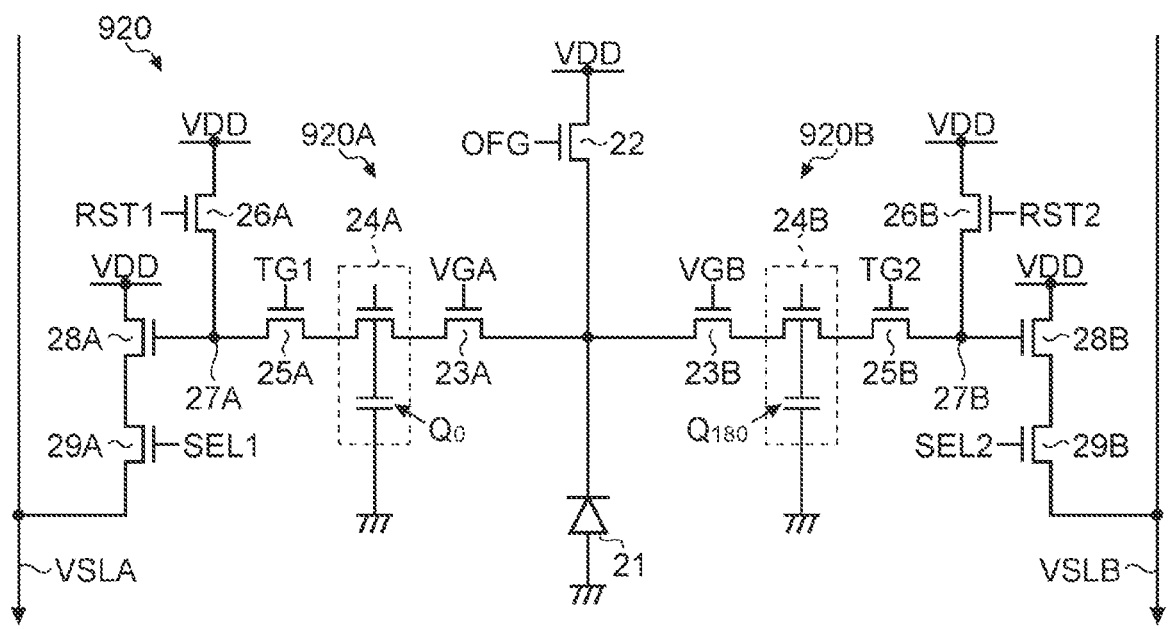
FIG. 3 is a circuit diagram illustrating a circuit configuration example of a unit pixel serving as a base of a unit pixel according to the first embodiment.

Here, a basic configuration example of the unit pixel 20 according to the present embodiment will be described using a circuit configuration of the unit pixel 920 as a base thereof. FIG. 3 is a circuit diagram illustrating a circuit configuration example of a unit pixel serving as a base of the unit pixel according to the first embodiment.

As illustrated in FIG. 3, the unit pixel 920 has a so-called 2-tap type circuit configuration including a photodiode 21, an over flow gate (OFG) transistor 22, and two readout circuits 920A and 920B. Note that the 2-tap type may be a configuration in which two transfer gate transistors (also referred to as taps) 23A and 23B are provided for one photodiode 21.

The photodiode 21 may be a photoelectric conversion element that photoelectrically converts incident light to generate a charge. A source of the OFG transistor 22 is connected to a cathode of the photodiode 21. A drain of the OFG transistor 22 is connected to, for example, a power supply line VDD. Furthermore, the gate of the OFG transistor 22 is connected to the vertical drive circuit 103 via the pixel drive line LD (not illustrated).

The readout circuit 920A includes, for example, the transfer gate transistor 23A, a memory (also referred to as a tap) 24A, a transfer transistor 25A, a reset transistor 26A, an amplification transistor 28A, and a selection transistor 29A.

In the present description, the transfer gate transistor, the memory, and the transfer transistor in each readout circuit are also referred to as, for example, a transfer circuit that transfers the charge generated in the photodiode 21 to a floating diffusion region 27.

A source of the transfer gate transistor 23A is connected to the cathode of the photodiode 21, and a drain thereof is connected to the memory 24A.

The memory 24A is, for example, a metal-oxide-semiconductor (MOS) type memory including a transistor and a capacitor, and temporarily holds the charge flowing from the photodiode 21 via the transfer gate transistor 23A in the capacitor under the control of the vertical drive circuit 103.

A source of the transfer transistor 25A is connected to the memory 24A, a drain thereof is connected to a gate of the amplification transistor 28A, and a gate thereof is connected to the vertical drive circuit 103 via the pixel drive line LD (not illustrated).

A node connecting the drain of the transfer transistor 25A and the gate of the amplification transistor 28A forms a floating diffusion region (FD) 27A that converts a charge into a voltage having a voltage value corresponding to the amount of charge.

A source of the amplification transistor 28A is connected to the power supply line VDD, and a drain thereof is connected to a vertical signal line VSLA via the selection transistor 29A. The amplification transistor 28A causes a voltage value of the voltage applied to the gate, that is, a voltage value corresponding to the amount of charge accumulated in the floating diffusion region 27A to appear in the vertical signal line VSLA as a pixel signal.

A source of the selection transistor 29A is connected to the drain of the amplification transistor 28A, a drain thereof is connected to the vertical signal line VSLA, and a gate thereof is connected to the vertical drive circuit 103 via a pixel drive line LD (not illustrated). Under the control of the vertical drive circuit 103, the selection transistor 29A causes a pixel signal having a voltage value corresponding to the amount of charge accumulated in the floating diffusion region 27A to appear in the vertical signal line VSLA.

A source of the reset transistor 26A is connected to a node connecting the drain of the transfer transistor 25A and the gate of the amplification transistor 28A, that is, the floating diffusion region 27A. A drain of the reset transistor 26A is connected to the power supply line VDD, and a gate thereof is connected to the vertical drive circuit 103 via a pixel drive line LD (not illustrated). The reset transistor 26A releases the charge accumulated in the floating diffusion region 27A under the control of the vertical drive circuit 103. That is, the reset transistor 26A initializes (resets) the floating diffusion region 27A according to the control from the vertical drive circuit 103.

Meanwhile, the readout circuit 920B similarly includes a transfer gate transistor 23B, a memory 24B, a transfer transistor 25B, a reset transistor 26B, an amplification transistor 28B, and a selection transistor 29B. A connection relationship and a function of each circuit element may be similar to those of the readout circuit 920A.

1.4 Basic Layout Example of Unit Pixel

Figure 4:
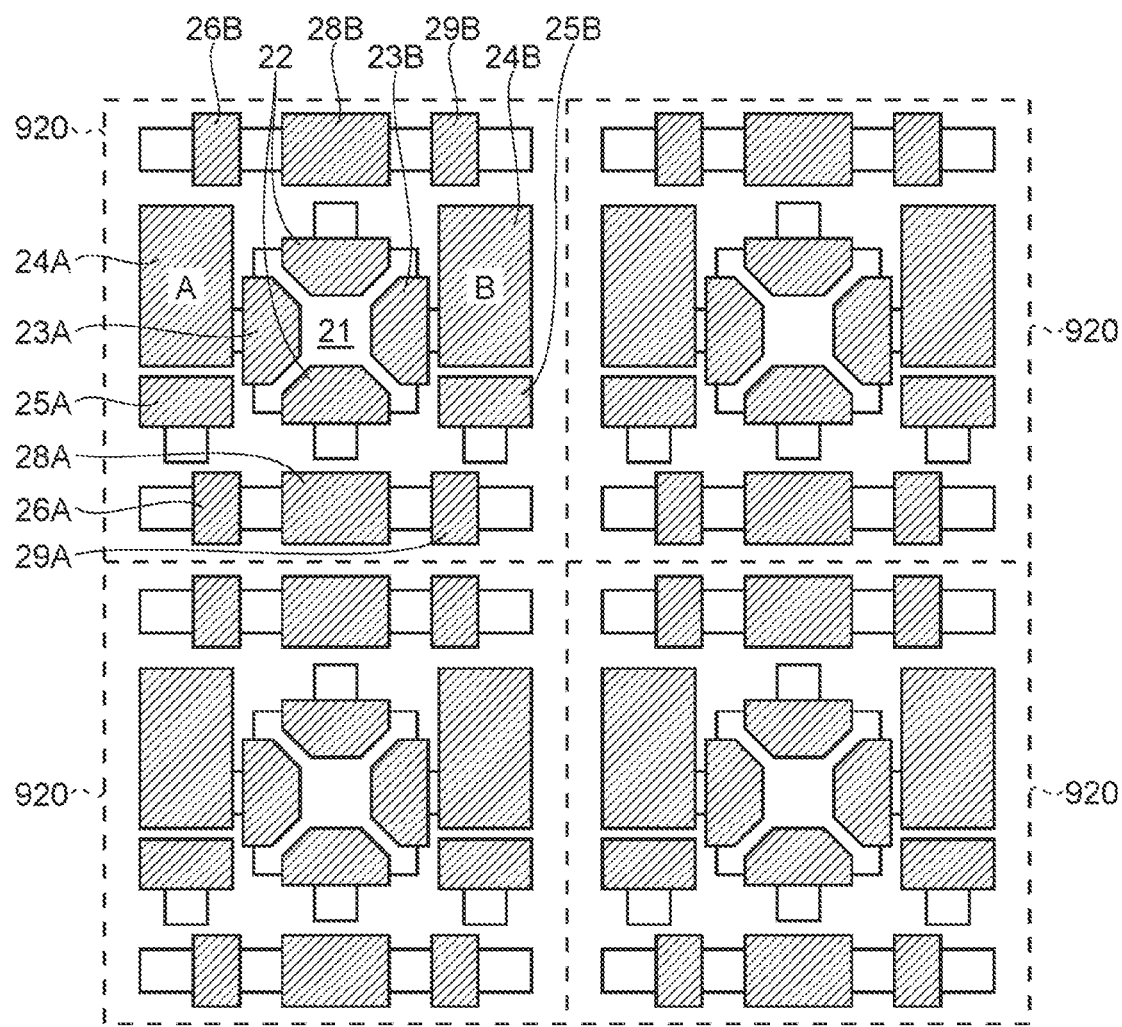
FIG. 4 is a plan view illustrating a layout example of the unit pixel exemplified in FIG. 3.

FIG. 4 is a plan view illustrating a layout example of the unit pixel illustrated in FIG. 3. Note that FIG. 4 illustrates a planar layout example of an element formation surface of a semiconductor substrate on which the photodiodes 21 of the unit pixels 920 are formed.

As illustrated in FIG. 4, each unit pixel 920 has a layout in which the photodiode 21, the OFG transistor 22, and the two readout circuits 920A and 920B are arranged in a rectangular region when the element formation surface of the semiconductor substrate is viewed from a vertical direction.

The rectangular region (hereinafter, also referred to as a pixel region) on the element formation surface of the semiconductor substrate is allocated to each unit pixel 920. The photodiode 21 is arranged at a center of the pixel region, for example. The OFG transistors 22 are arranged on two opposing sides among four sides of the photodiode 21, and the transfer gate transistors 23A and 23B of the two readout circuits 920A and 920B are arranged on the remaining two sides.

The remaining circuit elements of each of the readout circuits 920A and 920B are laid out around the photodiode 21 so as to surround the photodiode 21. In this case, by laying out the memory 24A of the readout circuit 920A and the memory 24B of the readout circuit 920B so as to be point-symmetric or line-symmetric about the photodiode 21 as a center (hereinafter, referred to as "ensuring of symmetry"), it is possible to reduce a characteristic difference between the two memories 24A and 24B. Similarly, by laying out the remaining circuit elements of the readout circuit 920A and the remaining circuit elements of the readout circuit 920B so as to be point-symmetric or line-symmetric about the photodiode 21 as a center, it is possible to reduce a characteristic difference between the readout circuits 920A and 920B.

1.5 Outline of Indirect ToF Method

Figure 5:
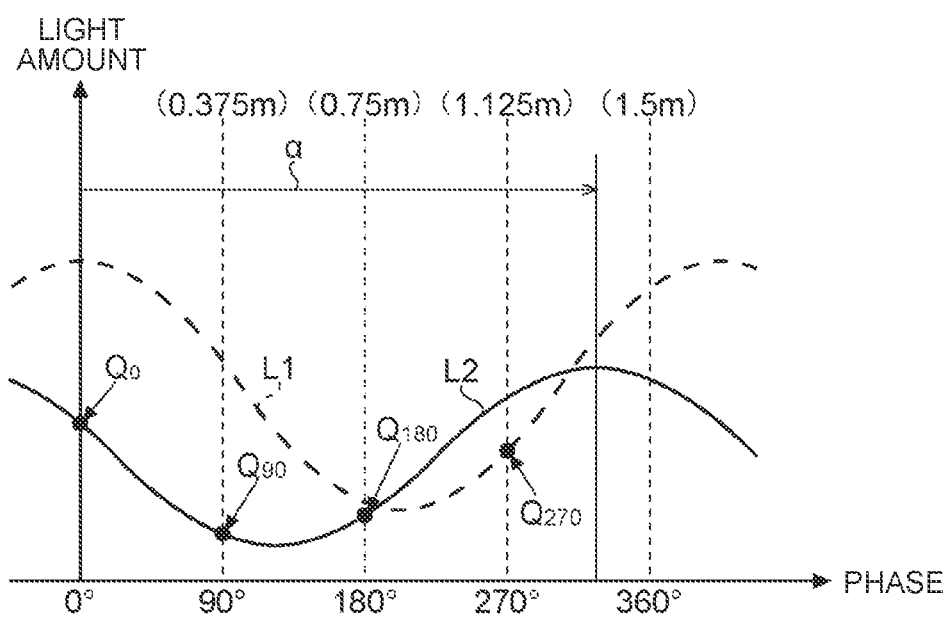
FIG. 5 is a diagram for describing an outline of a distance measurement method by an indirect ToF method (part 1).
Figure 6:
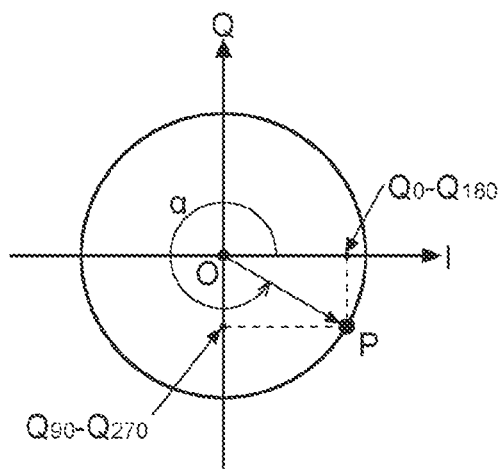
FIG. 6 is a diagram for describing the outline of the distance measurement method by the indirect ToF method (part 2).

Here, an outline of a distance measurement method by the indirect ToF method will be described. FIGS. 5 and 6 are diagrams for describing the outline of the distance measurement method by the indirect ToF method.

As illustrated in FIG. 5, in the indirect ToF method, a light amount $Q_0$ of the reflected light L2 having a phase angle (also referred to as a phase difference) of 0 degrees with respect to irradiation light L1 emitted from the light emitting unit 13, a light amount $Q_{90}$ of the reflected light L2 having a phase angle of 90 degrees, a light amount $Q_{180}$ of the reflected light L2 having a phase angle of 180 degrees, and a light amount $Q_{270}$ of the reflected light L2 having a phase angle of 270 degrees are detected by the light receiving unit 14. The phase here is a phase angle between a pulse of the irradiation light L1 and a pulse of the reflected light L2.

A phase angle α of the pulse of the reflected light L2 with respect to the irradiation light L1 can be expressed using, for example, a circle as illustrated in FIG. 6. In FIG. 6, a horizontal axis represents a difference between the light amount $Q_0$ of the reflected light L2 having the phase angle of 0 degrees and the light amount $Q_{180}$ of the reflected light L2 having the phase angle of 180 degrees, and a vertical axis represents a difference between the light amount $Q_{90}$ of the reflected light L2 having the phase angle of 90 degrees and the light amount $Q_{270}$ of the reflected light L2 having the phase angle of 270 degrees.

Then, the phase angle α can be obtained, for example, by substituting the light amounts $Q_0$, $Q_{90}$, $Q_{180}$, and $Q_{270}$ detected as described above into the following formula (1).

$$\alpha = \arctan\left(\frac{Q_{90} - Q_{270}}{Q_0 - Q_{180}}\right) \tag{1}$$

Here, the phase angle α of the pulse of the reflected light L2 with respect to the irradiation light L1 corresponds to reciprocation of a distance D from the ToF sensor 1 to the object 90. Therefore, the distance D from the ToF sensor 1 to the object 90 can be calculated by substituting the phase angle α calculated by Formula (1) into the following Formula (2). In Formula (2), Δt is a time difference from emission of the irradiation light L1 to reception of the reflected light L2, ω is an angular frequency of the modulation frequency $f_{mod}$, and c is a speed of light.

$$D = \frac{c \times \Delta t}{2} = \frac{c \times \alpha}{2\omega} = \frac{c \times \alpha}{4\pi f_{mod}} \tag{2}$$

However, in the above method, since the uncertainty of the phase angle of 360 degrees is degenerated, the distance D to the object 90 in which the phase angle α exceeds 360 degrees cannot be accurately measured. For example, in a case where the modulation frequency $f_{mod}$ of the irradiation light L1 is 100 megahertz (MHz), the distance D cannot be obtained for the object 90 present at a position exceeding about 1.5 meters (m) in consideration of the distance for reciprocation to the object 90.

Therefore, in such a case, the distance to the object 90 is measured using different modulation frequencies fmod. Accordingly, since the degeneracy can be solved on the basis of the result, it is possible to specify the distance D to the object 90 existing at a certain distance or more.

As described above, in the ToF sensor 1, one distance image is created by acquiring four types of phase information of 0 degrees, 90 degrees, 180 degrees, and 270 degrees.

Then, as the pixel architecture, a 2-tap type pixel architecture in which one unit pixel includes two memories as described above with reference to FIGS. 3 and 4 is general, and in this case, four subframes are required to acquire one distance measurement image (hereinafter, referred to as a depth map or a depth frame).

Specifically, four subframes of 0 degrees/180 degrees, 90 degrees/270 degrees, 180 degrees/0 degrees, and 270 degrees/90 degrees are required. Note that the subframe of 0 degrees/180 degrees is a subframe obtained by subtracting the light amount $Q_{180}$ of 180 degrees from the light amount $Q_0$ of which the phase angle α is 0 degrees. Similarly, the subframe of 90 degrees/270 degrees is a subframe obtained by subtracting the light amount $Q_{270}$ of 270 degrees from the light amount $Q_{90}$ of 90 degrees of the phase angle α, the subframe of 180 degrees/0 degrees is a subframe obtained by subtracting the light amount $Q_0$ of 0 degrees from the light amount $Q_{180}$ of 180 degrees of the phase angle α, and the subframe of 270 degrees/90 degrees is a subframe obtained by subtracting the light amount $Q_{90}$ of 90 degrees from the light amount $Q_{270}$ of 270 degrees of the phase angle α.

Here, the reason why, for example, a subframe of 0 degrees/180 degrees and a subframe of 180 degrees/0 degrees, which is antiphase data of the subframe, are required is that the charges accumulated in the two memories of each unit pixel have a difference (hereinafter, referred to as a characteristic difference) due to the arrangement (including wiring distance and the like) of the readout circuit, an incident angle (that is, image height) of the incident light, and the like. That is, in order to acquire an accurate depth frame, it is necessary to offset the characteristic difference appearing in the two memories by acquiring the antiphase data and adding or subtracting the antiphase data.

As described above, in the 2-tap type pixel architecture, since the characteristic difference appears in the two memories, there is a problem that the number of subframes required to acquire one depth frame increases.

Therefore, in the following description, a configuration for enabling more efficient acquisition of subframes will be described with some examples.

1.6 Configuration Example of Unit Pixel

Hereinafter, a configuration example of the unit pixel 20 according to the first embodiment will be described with some examples.

1.6.1 First Configuration Example

Figure 7:
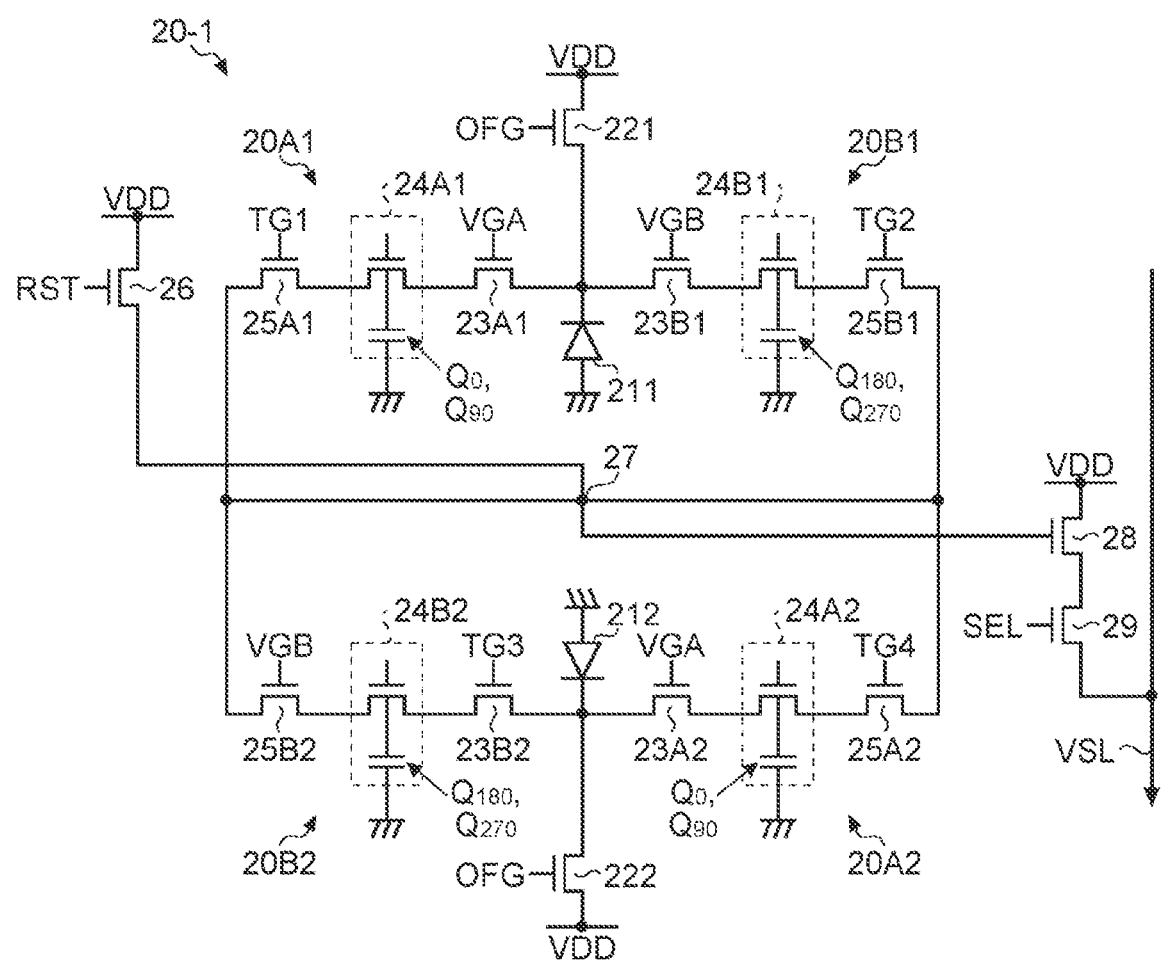
FIG. 7 is a circuit diagram illustrating a circuit configuration example of a unit pixel according to a first configuration example of the first embodiment.
Figure 8:
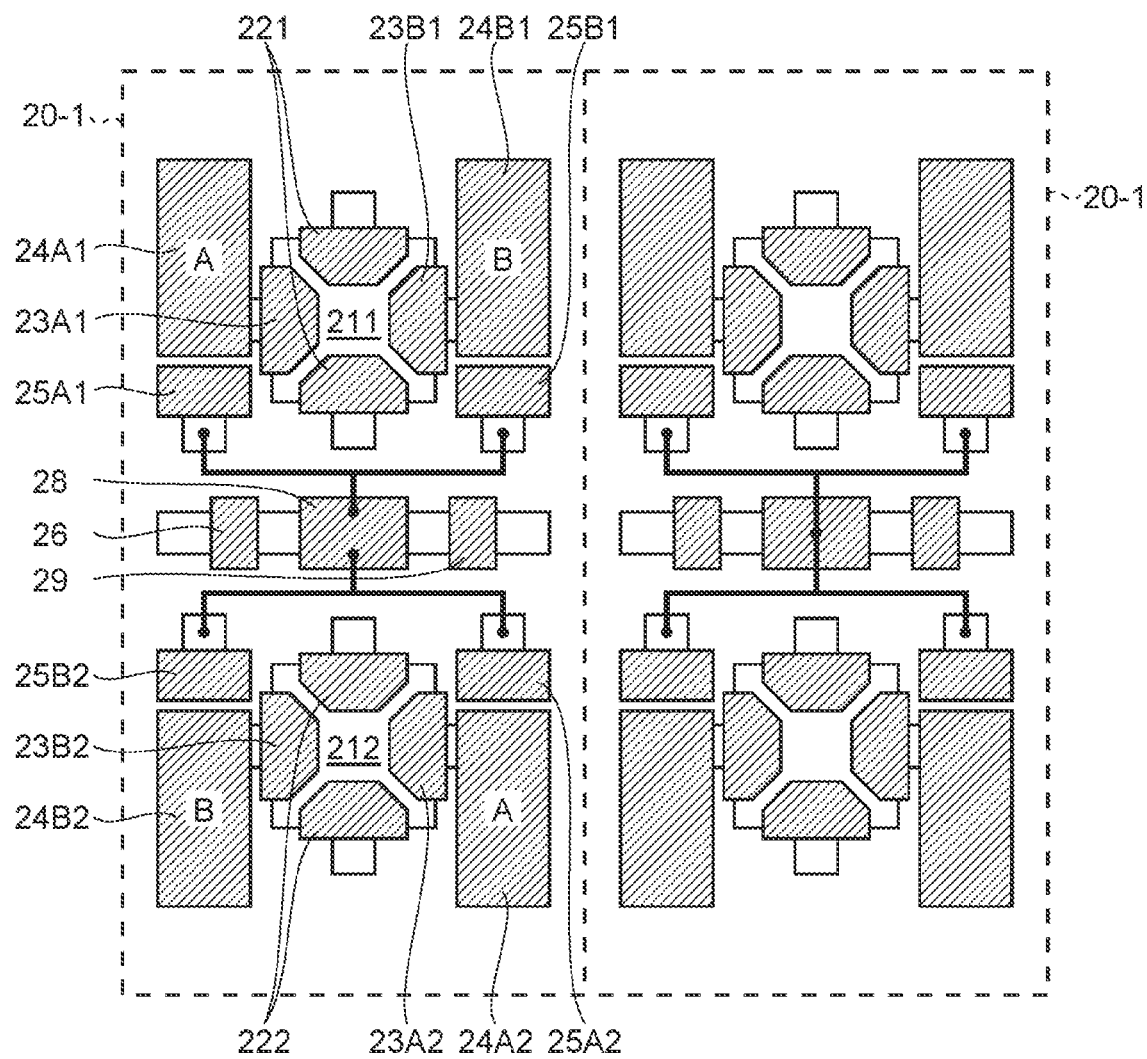
FIG. 8 is a plan view illustrating a planar layout example of the unit pixel according to the first configuration example of the first embodiment.

FIG. 7 is a circuit diagram illustrating a circuit configuration example of a unit pixel according to a first configuration example of the first embodiment. FIG. 8 is a plan view illustrating a planar layout example of the unit pixel according to the first configuration example of the first embodiment. Note that FIG. 8 illustrates a planar layout example of the element formation surface of the semiconductor substrate on which photodiodes 211 and 212 of a unit pixel 20-1 are formed. In the following description, when the photodiodes 211 and 212 are not distinguished from each other, the reference numeral thereof is 21.

As illustrated in FIG. 7, the unit pixel 20-1 according to the first configuration example includes two sets of 2-tap type circuit configurations, and has a circuit configuration in which four readout circuits 20A1, 20A2, 20B1, and 20B2 constituting the circuit share one floating diffusion region 27. In the following description, when the readout circuits 20A1 and 20A2 are not distinguished from each other, they are referred to as a readout circuit A, and when the readout circuits 20B1 and 20B2 are not distinguished from each other, they are referred to as a readout circuit B.

The readout circuit 20A1 includes a transfer gate transistor 23A1, a memory 24A1, a transfer transistor 25A1, the reset transistor 26, the floating diffusion region 27, the amplification transistor 28, and the selection transistor 29. Similarly, the readout circuit 20A2 includes a transfer gate transistor 23A2, a memory 24A2, a transfer transistor 25A2, the reset transistor 26, the floating diffusion region 27, the amplification transistor 28, and the selection transistor 29, the readout circuit 20B1 includes a transfer gate transistor 23B1, a memory 24B1, a transfer transistor 25B1, the reset transistor 26, the floating diffusion region 27, the amplification transistor 28, and the selection transistor 29, and the readout circuit 20B2 includes a transfer gate transistor 23B2, a memory 24B2, a transfer transistor 25B2, the reset transistor 26, the floating diffusion region 27, the amplification transistor 28, and the selection transistor 29.

A cathode of the photodiode 211 is connected to the readout circuits 20A1 and 20B1, and a cathode of the photodiode 212 is connected to the readout circuits 20A2 and 20B2.

Furthermore, an OFG transistor 221 is connected to the cathode of the photodiode 211, and an OFG transistor 222 is connected to the cathode of the photodiode 212.

Among the four readout circuits 20A1, 20A2, 20B1, and 20B2, the readout circuit A is configured to detect the light amount $Q_0$ or $Q_{90}$ of components having the phase angle α of 0 degrees or 90 degrees with respect to the irradiation light L1 in the reflected light L2, and the readout circuit B is configured to detect the light amount $Q_{180}$ or $Q_{270}$ of components having the phase angle α of 180 degrees or 270 degrees with respect to the irradiation light L1 in the reflected light L2. Note that the light amount $Q_{90}$ of the component having the phase angle α of 90 degrees and the light amount $Q_{270}$ of the component having the phase angle α of 270 degrees, and the light amount $Q_0$ of the component having the phase angle α of 0 degrees and the light amount $Q_{180}$ of the component having the phase angle α of 180 degrees may be read in a time division manner, for example, by alternately switching and reading from the same unit pixel 20-1.

Furthermore, the two readout circuits A are connected to the cathodes of the photodiodes 211, and the remaining two readout circuits B are connected to the cathodes of the photodiodes 212.

Furthermore, the four readout circuits 20A1, 20A2, 20B1, and 20B2 share the floating diffusion region 27, the reset transistor 26, the amplification transistor 28, and the selection transistor 29. The connection relationship of the circuit elements in each of the readout circuits 20A1, 20A2, 20B1, and 20B2 may be similar to the connection relationship of the circuit elements in the readout circuits 20A and 20B of the unit pixel 920 described above with reference to FIG. 3.

As illustrated in FIG. 8, in the planar layout of the unit pixel 20-1, the readout circuits A and B for detecting components having the same phase angle α are arranged in a pixel region allocated to one unit pixel 20-1 so as to be point-symmetric or line-symmetric with respect to the center or a straight line passing through the center of the pixel region as an axis. For example, the readout circuits 20A1 and 20A2 are arranged diagonally in the pixel region allocated to one unit pixel 20-1, and the readout circuits 20B1 and 20B2 are also arranged diagonally in the pixel region allocated to one unit pixel 20-1.

Specifically, in the example illustrated in FIG. 8, the readout circuit 20A1 is arranged at an upper left and the readout circuit 20A2 is arranged at a lower right, in the pixel region. Meanwhile, among the readout circuits 20B1 and 20B2, the readout circuit 20B1 is arranged at an upper right and the readout circuit 20B2 is arranged at a lower left, in the pixel region.

As described above, in the first configuration example, the four readout circuits 20A1, 20A2, 20B1, and 20B2 are laid out such that the readout circuits for detecting the light amount Q of the same phase angle α are arranged in a crossed manner.

Note that the photodiodes 211 and 212 may be arranged between readout circuits for generating the same subframe. For example, the photodiode 211 may be arranged between the readout circuits 20A1 and 20B1, and the photodiode 212 may be arranged between the readout circuits 20A2 and 20B2.

In such a configuration, when the light amount $Q_0$ or $Q_{90}$ with the phase angle α of 0 degrees or 90 degrees is detected, both the charge stored in the memory 24A1 of the readout circuit 20A1 and the charge stored in the memory 24A2 of the readout circuit 20A2 are transferred to the floating diffusion region 27. Similarly, when the light amount $Q_{180}$ or $Q_{270}$ with the phase angle α of 180 degrees or 270 degrees is detected, both the charge stored in the memory 24B1 of the readout circuit 20B1 and the charge stored in the memory 24B2 of the readout circuit 20B2 are transferred to the floating diffusion region 27.

As described above, in one unit pixel 20-1, the readout circuit for detecting the component of the same phase angle α is positioned diagonally, and the charge stored in the memory at the time of readout is simultaneously transferred to the common floating diffusion region 27, and thus, it is possible to reduce a difference in amounts of accumulated charge due to the characteristic difference caused by the position (image height) of the readout circuit or the like. As a result, it is possible to generate a high-quality depth frame without acquiring antiphase data, and thus, it is possible to generate a high-quality depth frame at a high frame rate.

In addition, by sharing the configuration (reset transistor 26, amplification transistor 28, selection transistor 29, vertical signal line VSL, AD converter in column processing circuit 104, and the like) downstream of the floating diffusion region 27 in each of the readout circuits 20A1, 20A2, 20B1, and 20B2, it is possible to eliminate the characteristic difference caused by the downstream configuration, and thus, it is possible to generate a depth frame of higher quality. Note that the downstream means a downstream in the flow of signals and data.

1.6.2 Second Configuration Example

Figure 9:
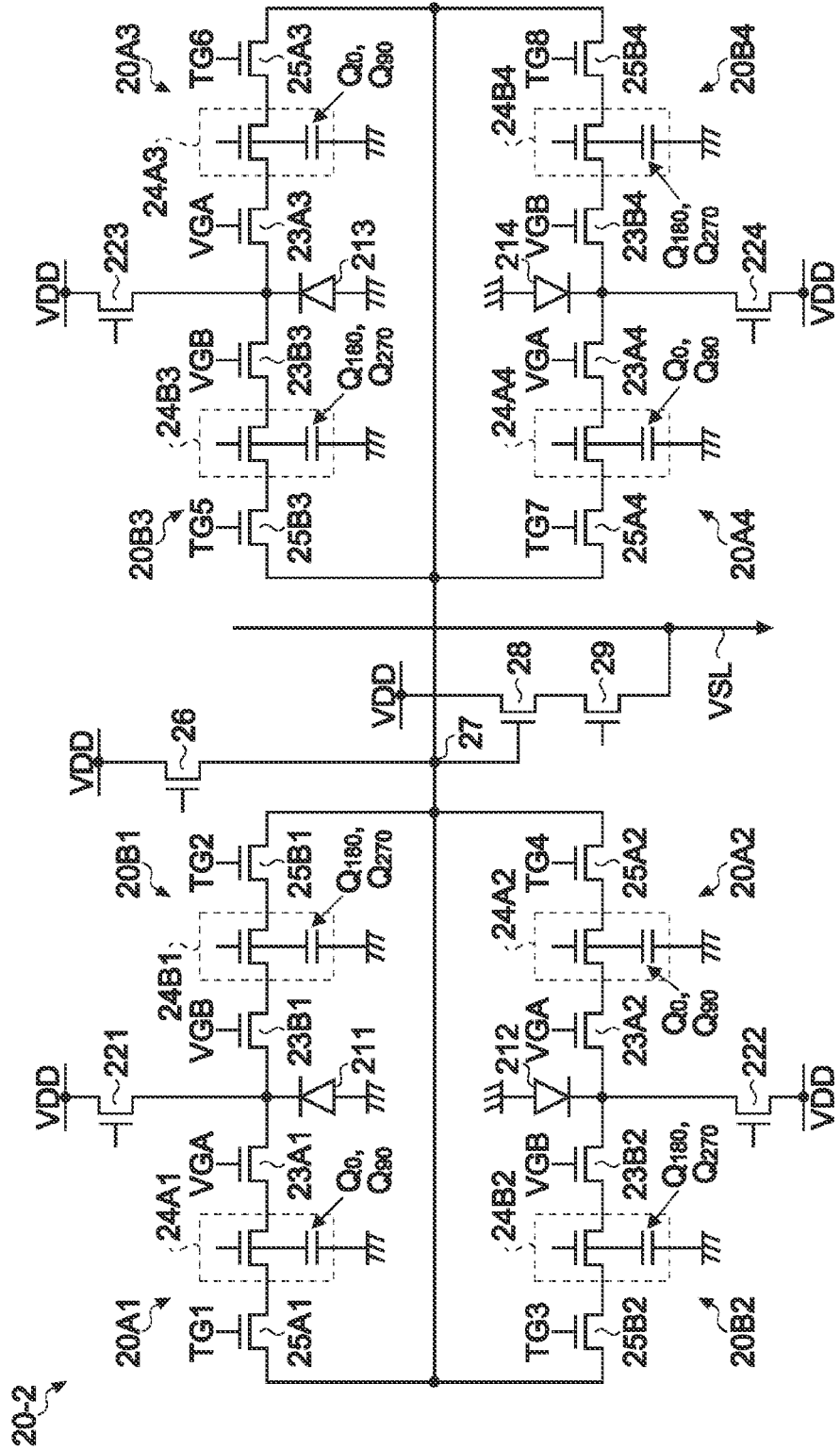
FIG. 9 is a circuit diagram illustrating a circuit configuration example of a unit pixel according to a second configuration example of the first embodiment.
Figure 10:
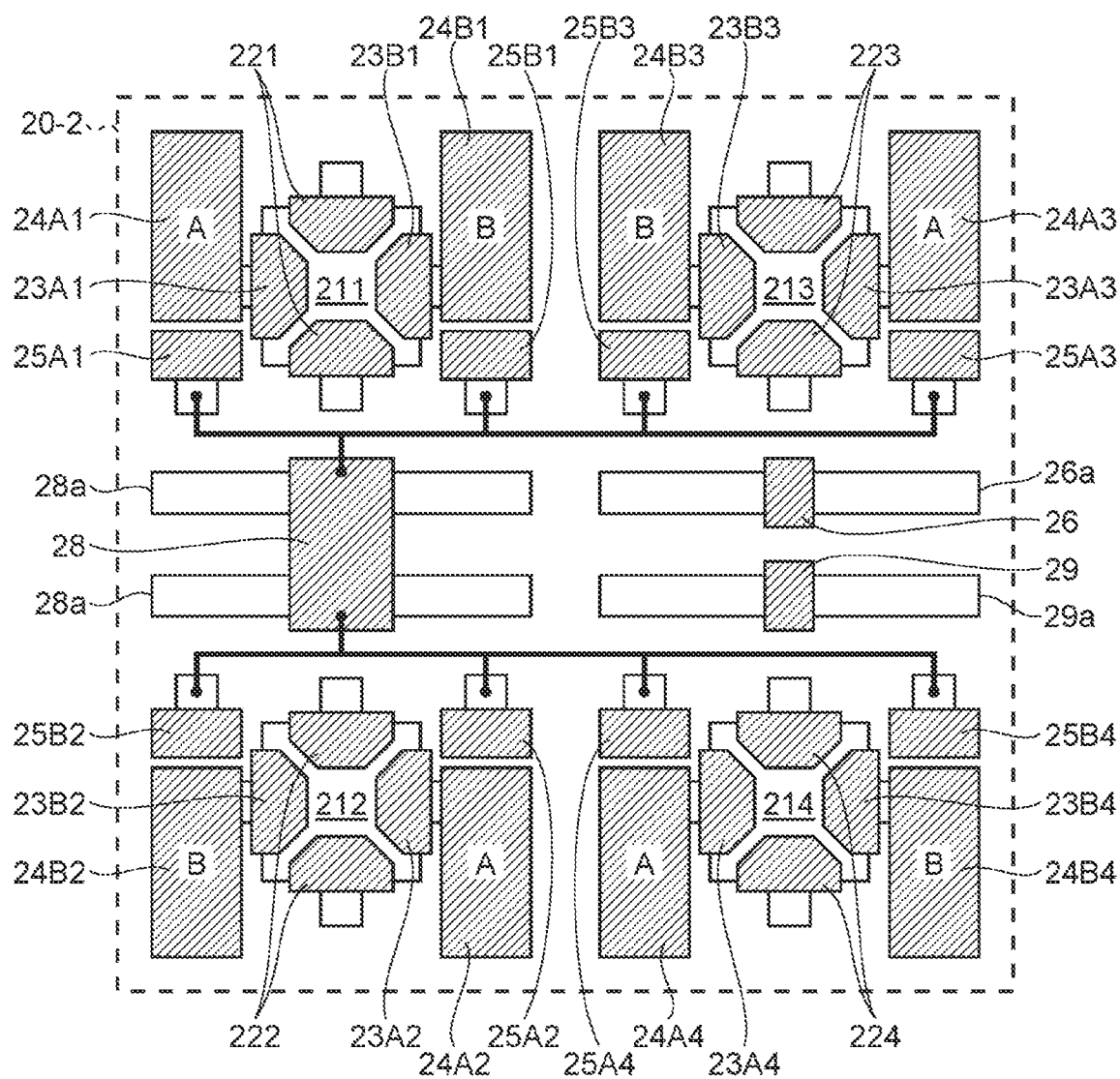
FIG. 10 is a plan view illustrating a planar layout example of the unit pixel according to the second configuration example of the first embodiment.

FIG. 9 is a circuit diagram illustrating a circuit configuration example of a unit pixel according to a second configuration example of the first embodiment. FIG. 10 is a plan view illustrating a planar layout example of the unit pixel according to the second configuration example of the first embodiment. Note that FIG. 10 illustrates a planar layout example of an element formation surface of a semiconductor substrate on which photodiodes 211 to 214 of a unit pixels 20-2 are formed.

As illustrated in FIG. 9, the unit pixel 20-2 according to the second configuration example includes four sets of 2-tap type circuit configurations, and includes a circuit configuration in which eight readout circuits 20A1 to 20A4 and 20B1 to 20B4 constituting the circuit share one floating diffusion region 27. In the following description, when the readout circuits 20A1 to 20A4 are not distinguished from each other, they are referred to as the readout circuit A, and when the readout circuits 20B1 to 20B4 are not distinguished from each other, they are referred to as the readout circuit B.

The circuits of the readout circuits 20A1, 20A2, 20B1, and 20B2 may be similar to the circuit configuration described with reference to FIG. 7 in the first configuration example. Furthermore, the readout circuit 20A3 includes a transfer gate transistor 23A3, a memory 24A3, a transfer transistor 25A3, the reset transistor 26, the floating diffusion region 27, the amplification transistor 28, and the selection transistor 29, the readout circuit 20A4 includes a transfer gate transistor 23A4, a memory 24A4, a transfer transistor 25A4, the reset transistor 26, the floating diffusion region 27, the amplification transistor 28, and the selection transistor 29, the readout circuit 20B3 includes a transfer gate transistor 23B3, a memory 24B3, a transfer transistor 25B3, the reset transistor 26, the floating diffusion region 27, the amplification transistor 28, and the selection transistor 29, and the readout circuit 20B4 includes a transfer gate transistor 23B4, a memory 24B4, a transfer transistor 25B4, the reset transistor 26, the floating diffusion region 27, the amplification transistor 28, and the selection transistor 29.

The cathode of the photodiode 211 is connected to the readout circuits 20A1 and 20B1, the cathode of the photodiode 212 is connected to the readout circuits 20A2 and 20B2, a cathode of the photodiode 213 is connected to the readout circuits 20A3 and 20B3, and a cathode of the photodiode 214 is connected to the readout circuits 20A4 and 20B4.

Furthermore, the OFG transistor 221 is connected to the cathode of the photodiode 211, the OFG transistor 222 is connected to the cathode of the photodiode 212, the OFG transistor 223 is connected to the cathode of the photodiode 213, and the OFG transistor 224 is connected to the cathode of the photodiode 214.

Among the eight readout circuits 20A1 to 20A4 and 20B1 to 20B4, the readout circuit A is configured to detect the light amount $Q_0$ or $Q_{90}$ of the component having the phase angle α of 0 degrees or 90 degrees with respect to the irradiation light L1 in the reflected light L2, and the readout circuit B is configured to detect the light amount $Q_{180}$ or $Q_{270}$ of the component having the phase angle α of 180 degrees or 270 degrees with respect to the irradiation light L1 in the reflected light L2.

In addition, the eight readout circuits 20A1 to 20A4 and 20B1 to 20B4 share the floating diffusion region 27, the reset transistor 26, the amplification transistor 28, and the selection transistor 29. The connection relationship of the circuit elements in each of the readout circuits 20A1 to 20A4 and 20B1 to 20B4 may be similar to the connection relationship of the circuit elements in the readout circuits 20A and 20B of the unit pixel 920 described above with reference to FIG. 3.

As illustrated in FIG. 10, in the planar layout of the unit pixel 20-2, the readout circuits A or B for detecting components having the same phase angle α are arranged in a pixel region allocated to one unit pixel 20-2 so as to be point-symmetric or line-symmetric with respect to the center or a straight line passing through the center of the pixel region as an axis.

At that time, among the eight readout circuits 20A1 to 20A4 and 20B1 to 20B4, the readout circuits for generating the same subframe are arranged so as to be adjacent to each other across the photodiodes to which they are connected. For example, the readout circuits 20A1 and 20B1 are adjacent to each other with the photodiode 211 interposed therebetween, the readout circuits 20A2 and 20B2 are adjacent to each other with the photodiode 212 interposed therebetween, the readout circuits 20A3 and 20B3 are adjacent to each other with the photodiode 213 interposed therebetween, and the readout circuits 20A4 and 20B4 are adjacent to each other with the photodiode 214 interposed therebetween.

In the example illustrated in FIG. 10, among the readout circuits 20A1 to 20A4 for detecting the light amount $Q_0$ of the component having the phase angle $\alpha$ of 0 degrees or 90 degrees, the readout circuit 20A1 is arranged at the upper left in the pixel region, the readout circuit 20A3 is arranged at the upper right, and the readout circuits 20A2 and 20A4 are arranged at the lower side close to the center in the pixel region. Meanwhile, among the readout circuits 20B1 to 20B4 for detecting the light amount $Q_{180}$ of the component having the phase angle $\alpha$ of 180 degrees or 270 degrees, the readout circuit 20B1 is arranged at the lower left in the pixel region, the readout circuit 20B3 is arranged at the lower right, and the readout circuits 20B2 and 20B4 are arranged at the upper side close to the center in the pixel region.

That is, in the example illustrated in FIG. 10, the layout is such that two of the cross hanging arrangement illustrated in FIG. 8 and the arrangement obtained by inverting the cross hanging arrangement are arranged.

In such a configuration, when the light amount $Q_0$ with the phase angle $\alpha$ of 0 degrees or 90 degrees is detected, the charges stored in the memories 24A1 to 24A4 of the readout circuits 20A1 to 20A4 are simultaneously transferred to the floating diffusion region 27. Similarly, when the light amount $Q_{180}$ with the phase angle $\alpha$ of 180 degrees or 270 degrees is detected, the charges stored in the memories 24B1 to 24B4 of the readout circuits 20B1 to 20B4 are simultaneously transferred to the floating diffusion region 27.

With such an operation, in addition to the effect obtained in the first configuration example, it is possible to further reduce the differences in the amounts of accumulated charges due to the characteristic difference caused by the position (image height) of the readout circuit or the like as compared with the first configuration example. This makes it possible to generate a higher-quality depth frame without acquiring antiphase data.

1.6.3 Third Configuration Example

Figure 11:
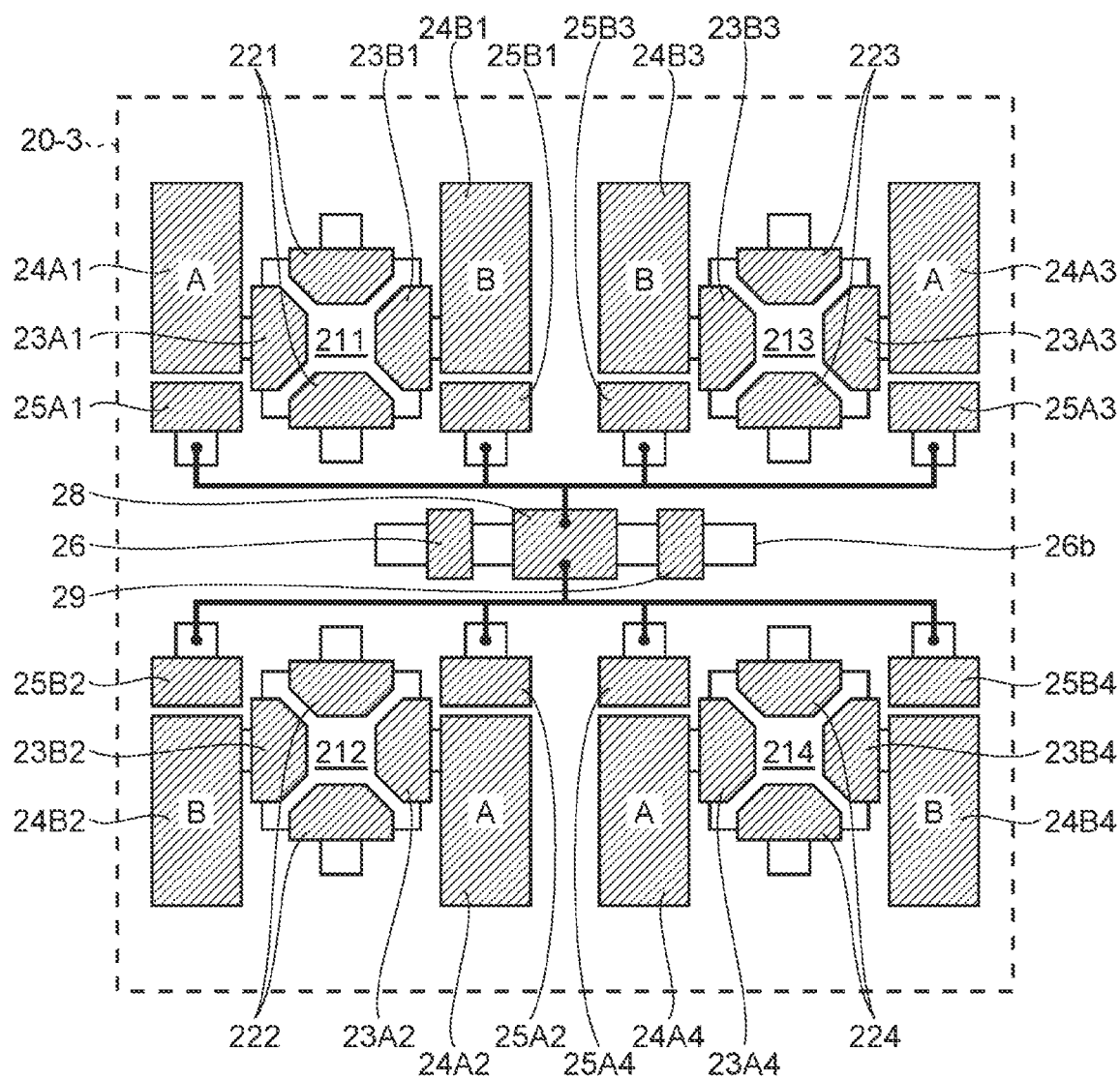
FIG. 11 is a plan view illustrating a planar layout example of a unit pixel according to a third configuration example of the first embodiment.

The circuit configuration example of a unit pixel 20-3 according to a third configuration example may be, for example, similar to the circuit configuration example described with reference to FIG. 9 in the second configuration example. FIG. 11 is a plan view illustrating a planar layout example of the unit pixel according to the third configuration example of the first embodiment. Note that FIG. 11 illustrates a planar layout example of the element formation surface of the semiconductor substrate on which the photodiodes 211 to 214 of the unit pixels 20-3 are formed.

As can be seen by comparing FIGS. 10 and 11, in the second configuration example, the reset transistor 26, the amplification transistor 28, and the selection transistor 29 are provided in the separate diffusion regions 26a, 28a, and 29a, respectively, whereas in the third configuration example, the reset transistor 26, the amplification transistor 28, and the selection transistor 29 are provided in the common diffusion region 26b.

According to such a configuration, a circuit area in each unit pixel 20-3 can be reduced. As a result, it is possible to increase the light receiving areas of the photodiode 211 to 214, increase memory capacities of the memories 24A1 to 24A4 and 24B1 to 24B4, and the like, and thus, it is possible to generate a higher quality depth frame in addition to the effects obtained in the second configuration example.

1.6.4 Fourth Configuration Example

In the first to third configuration examples described above, by alternately switching and using one unit pixel 20, the light amount $Q_{90}$ of the component having the phase angle $\alpha$ of 90 degrees and the light amount $Q_{270}$ of the component having the phase angle $\alpha$ of 270 degrees, and the light amount $Q_0$ of the component having the phase angle $\alpha$ of 0 degrees and the light amount $Q_{180}$ of the component having the phase angle $\alpha$ of 180 degrees are read in a time division manner.

Meanwhile, in the fourth configuration example, a case where the light amount $Q_{90}$ of the component having the phase angle $\alpha$ of 90 degrees and the light amount $Q_{270}$ of the component having the phase angle $\alpha$ of 270 degrees, and the light amount $Q_0$ of the component having the phase angle $\alpha$ of 0 degrees and the light amount $Q_{180}$ of the component having the phase angle $\alpha$ of 180 degrees can be simultaneously read from one unit pixel 20 will be described with an example.

Figure 12:
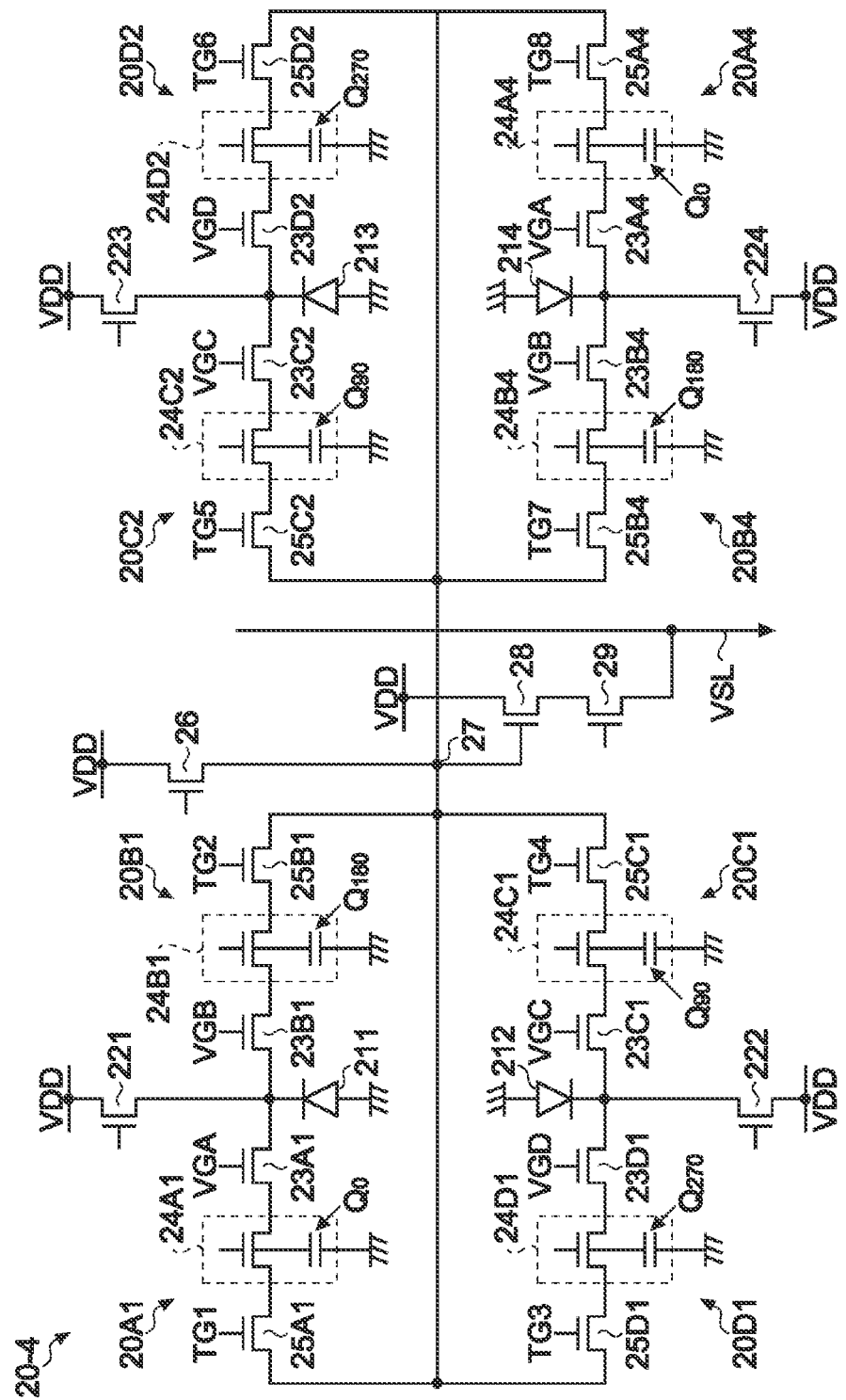
FIG. 12 is a circuit diagram illustrating a circuit configuration example of a unit pixel according to a fourth configuration example of the first embodiment.
Figure 13:
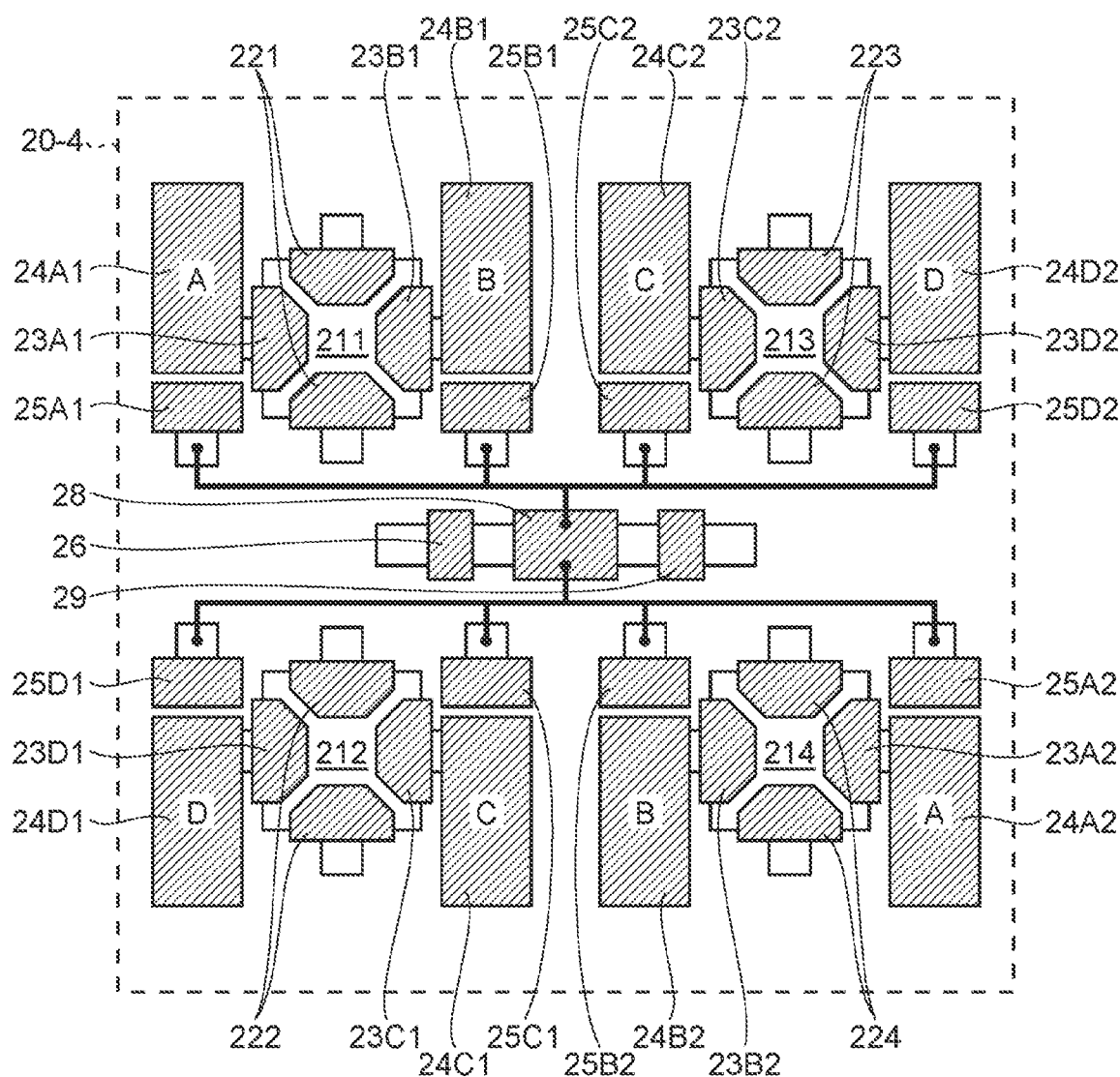
FIG. 13 is a plan view illustrating a planar layout example of the unit pixel according to the fourth configuration example of the first embodiment.

FIG. 12 is a circuit diagram illustrating a circuit configuration example of a unit pixel according to a fourth configuration example of the first embodiment. FIG. 13 is a plan view illustrating a planar layout example of the unit pixel according to the fourth configuration example of the first embodiment. Note that FIG. 13 illustrates a planar layout example of the element formation surface of the semiconductor substrate on which the photodiodes 211 to 214 of the unit pixel 20-4 are formed.

As illustrated in FIG. 12, the unit pixel 20-4 according to the fourth configuration example has, for example, a circuit configuration similar to that of the unit pixel 20-2 described with reference to FIG. 9 in the second configuration example. However, in the fourth configuration example, among the eight readout circuits 20A1 to 20A4 and 20B1 to 20B4 in the second configuration example, the two readout circuits 20A1 and 20A4 are used as the readout circuit A for reading the light amount $Q_0$ of the component having the phase angle $\alpha$ of 0 degrees, and the two readout circuits 20B1 and 20B4 are used as the readout circuit B for reading the light amount $Q_{180}$ of the component having the phase angle $\alpha$ of 180 degrees. Then, among the remaining readout circuits 20A2, 20A3, 20B2, and 20B3 in the second configuration example, the readout circuits 20A2 and 20B3 are used as the readout circuits 20C1 and 20C2 for reading the light amount $Q_{90}$ of the component having the phase angle $\alpha$ of 90 degrees, and the readout circuits 20A3 and 20B2 are used as the readout circuits 20D1 and 20D2 for reading the light amount $Q_{270}$ of the component having the phase angle $\alpha$ of 270 degrees. In the following description, when the readout circuits 20C1 and 20C2 are not distinguished from each other, they are referred to as a readout circuit C, and when the readout circuits 20D1 and 20D2 are not distinguished from each other, they are referred to as a readout circuit D.

In this manner, by allocating two of the eight readout circuits 20A1, 20A4, 20B1, 20B4, 20C1, 20C2, 20D1, and 20D2 to readout of the light amounts $Q_0$, $Q_{90}$, $Q_{180}$, and $Q_{270}$ of the components with the phase angles $\alpha$ of 0 degrees, 90 degrees, 180 degrees, and 270 degrees, respectively, it is possible to acquire four subframes of 0 degrees/ 180 degrees, 90 degrees/270 degrees, 180 degrees/0 degrees, and 270 degrees/90 degrees at a time. In other words, by spatially dividing the eight readout circuits 20A1, 20A4, 20B1, 20B4, 20C2, 20C3, 20D2, and 20D3 with respect to the components of the phase angles $\alpha$ of 0 degrees, 90 degrees, 180 degrees, and 270 degrees, it is possible to acquire four subframes of 0 degrees/180 degrees, 90 degrees/270 degrees, 180 degrees/0 degrees, and 270 degrees/90 degrees at a time.

As a result, it is possible to significantly shorten the read operation when generating one distance image, and thus, it is possible to generate a high-quality depth frame at a high frame rate.

Note that, as illustrated in FIG. 13, also in the fourth configuration example, in the planar layout of the unit pixel 20-4, by arranging the readout circuits for detecting the components of the same phase angle α within the pixel region allocated to one unit pixel 20-4 so as to be point-symmetric or line-symmetric with respect to the center of the pixel region or a straight line passing through the center as an axis, it is possible to reduce the difference in the amounts of the accumulated charges due to the characteristic difference caused by the position (image height) of the readout circuit or the like, and thus, it is possible to generate a high-quality depth frame at a high frame rate.

1.6.5 Fifth Configuration Example

In a fifth configuration example, a basic configuration of the 2-tap type unit pixel 20 sharing one floating diffusion region 27 will be exemplified.

Figure 14:
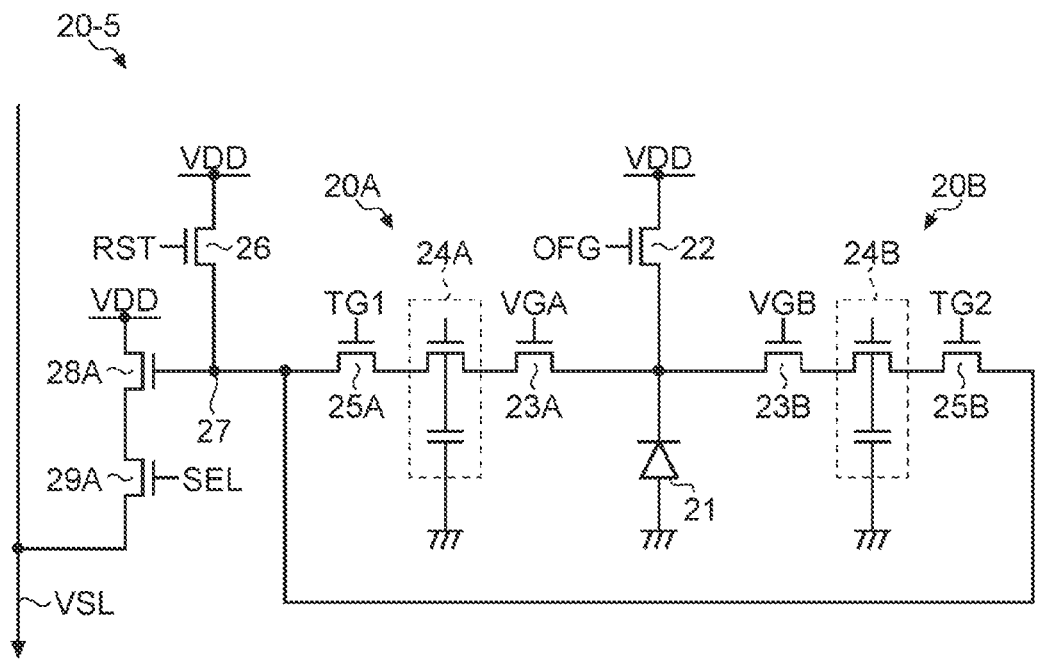
FIG. 14 is a circuit diagram illustrating a circuit configuration example of a unit pixel according to a fifth configuration example of the first embodiment.

FIG. 14 is a circuit diagram illustrating a circuit configuration example of a unit pixel according to the fifth configuration example of the first embodiment. As illustrated in FIG. 14, the unit pixel 20-5 according to the fifth configuration example has a circuit configuration in which two readout circuits 20A and 20B are connected to one photodiode 21, and the two readout circuits 20A and 20B share one floating diffusion region 27.

According to such a circuit configuration, as described above, by simultaneously transferring the charges stored in the memory at the time of reading to the common floating diffusion region 27, it is possible to reduce the difference in the amounts of the accumulated charges due to the characteristic difference caused by the position (image height) of the readout circuit or the like. As a result, it is possible to generate a high-quality depth frame without acquiring antiphase data, and thus, it is possible to generate a high-quality depth frame at a high frame rate.

In addition, by sharing the configuration (reset transistor 26, amplification transistor 28, selection transistor 29, vertical signal line VSL, AD converter in column processing circuit 104, and the like) downstream of the floating diffusion region 27 in each of the readout circuits 20A and 20B, it is possible to eliminate the characteristic difference caused by the downstream configuration, and thus, it is possible to generate a depth frame of higher quality.

1.6.6 Sixth Configuration Example

In the first to fifth configuration examples described above, a so-called 2-tap type circuit configuration in which one photodiode 21 is shared by two readout circuits has been exemplified, but the present invention is not limited to such a configuration. For example, it is also possible to adopt a so-called 3-tap type circuit configuration in which one photodiode 21 is shared by three readout circuits.

Figure 15:
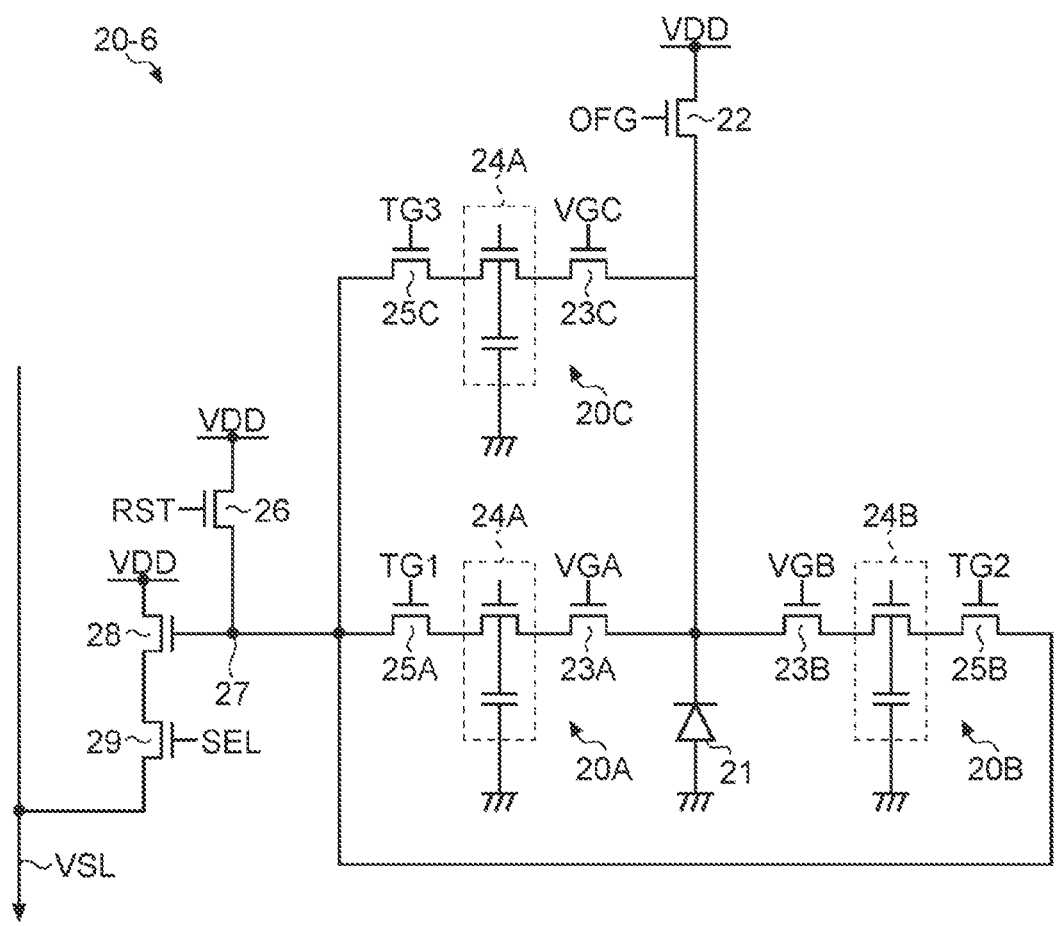
FIG. 15 is a circuit diagram illustrating a circuit configuration example of a unit pixel according to a sixth configuration example of the first embodiment.

FIG. 15 is a circuit diagram illustrating a circuit configuration example of a unit pixel according to a sixth configuration example of the first embodiment. As illustrated in FIG. 15, the unit pixel 20-6 according to the sixth configuration example has a circuit configuration in which three readout circuits 20A, 20B, and 20C are connected to one photodiode 21, and the three readout circuits 20A, 20B, and 20C share one floating diffusion region 27.

Even in such a 3-tap type unit pixel 20-6, similarly to the above-described configuration example, it is possible to generate a high-quality depth frame without acquiring antiphase data, and thus, it is possible to generate a high-quality depth frame at a high frame rate.

In addition, by sharing the configuration (reset transistor 26, amplification transistor 28, selection transistor 29, vertical signal line VSL, AD converter in column processing circuit 104, and the like) downstream of the floating diffusion region 27 in each of the readout circuits 20A, 20B, and 20C, it is possible to eliminate the characteristic difference caused by the downstream configuration, and thus, it is possible to generate a depth frame of higher quality.

1.6.7 Seventh Configuration Example

Furthermore, it is also possible to adopt a so-called 4-tap type circuit configuration in which four readout circuits share one photodiode 21.

Figure 16:
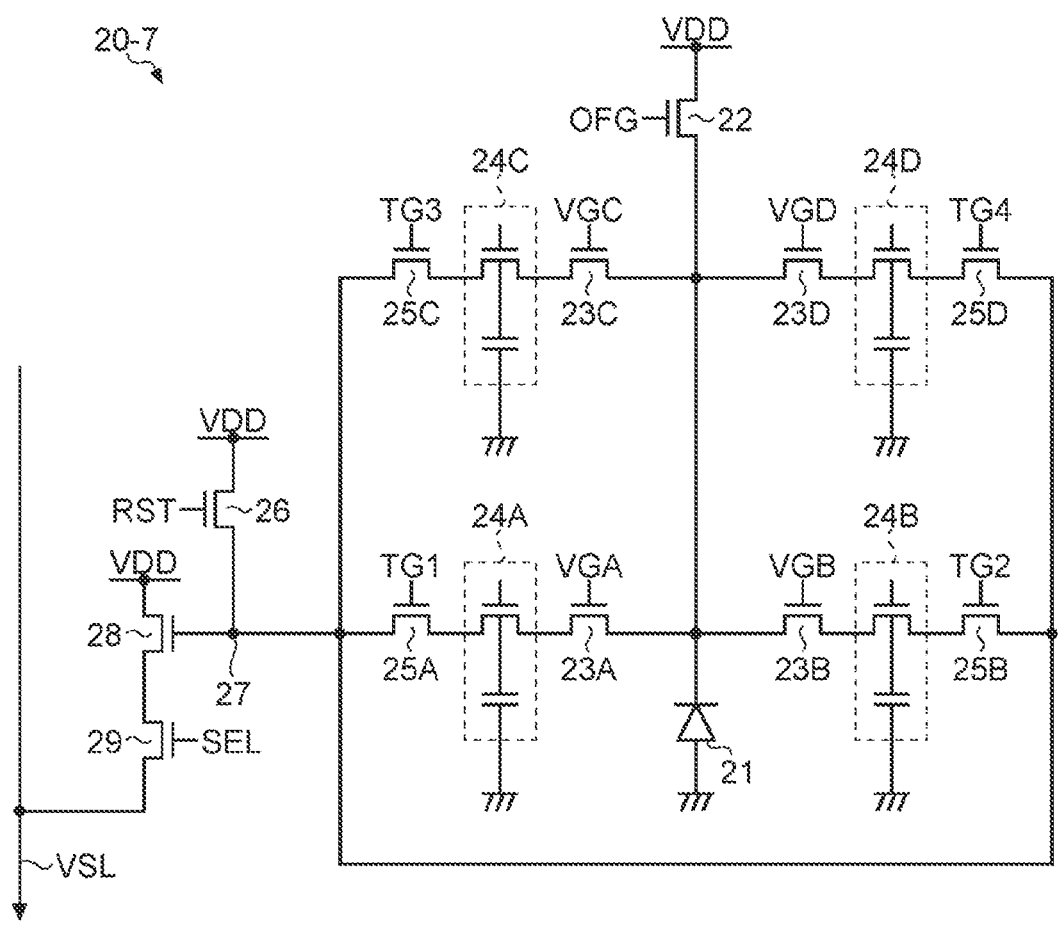
FIG. 16 is a circuit diagram illustrating a circuit configuration example of a unit pixel according to a seventh configuration example of the first embodiment.

FIG. 16 is a circuit diagram illustrating a circuit configuration example of a unit pixel according to a seventh configuration example of the first embodiment. As illustrated in FIG. 16, the unit pixel 20-7 according to the seventh configuration example has a circuit configuration in which four readout circuits 20A, 20B, 20C, and 20D are connected to one photodiode 21, and the four readout circuits 20A, 20B, 20C, and 20D share one floating diffusion region 27.

Even in such a 4-tap type unit pixel 20-7, similarly to the above-described configuration examples, it is possible to generate a high-quality depth frame without the acquiring antiphase data, and thus, it is possible to generate a high-quality depth frame at a high frame rate.

In addition, by sharing the configuration (reset transistor 26, amplification transistor 28, selection transistor 29, vertical signal line VSL, AD converter in column processing circuit 104, and the like) downstream of the floating diffusion region 27 in each of the readout circuits 20A, 20B, 20C, and 20D, it is possible to eliminate the characteristic difference caused by the downstream configuration, and thus, it is possible to generate a depth frame of higher quality.

1.7 Pixel Isolation Structure

Next, a structure for optically separating the plurality of unit pixels 20 arranged adjacent to each other in the pixel array part 101 will be described.

By optically separating adjacent unit pixels 20 from each other, it is possible to reduce crosstalk caused by light incident on a certain unit pixel 20 being incident on another adjacent unit pixel 20, and thus, it is possible to generate the depth frame with higher accuracy.

For the optical separation of the adjacent unit pixels 20, for example, a pixel separation portion formed by forming a trench in a semiconductor substrate on which the photodiode 21 is formed and embedding a predetermined material in the trench can be used.

Therefore, a planar layout example of the pixel separation portion will be described with some examples. Note that the planar layout example in the following description is assumed to be a planar layout example on the element formation surface of the semiconductor substrate on which the photodiode 21 is formed.

1.7.1 First Layout Example

Figure 17:
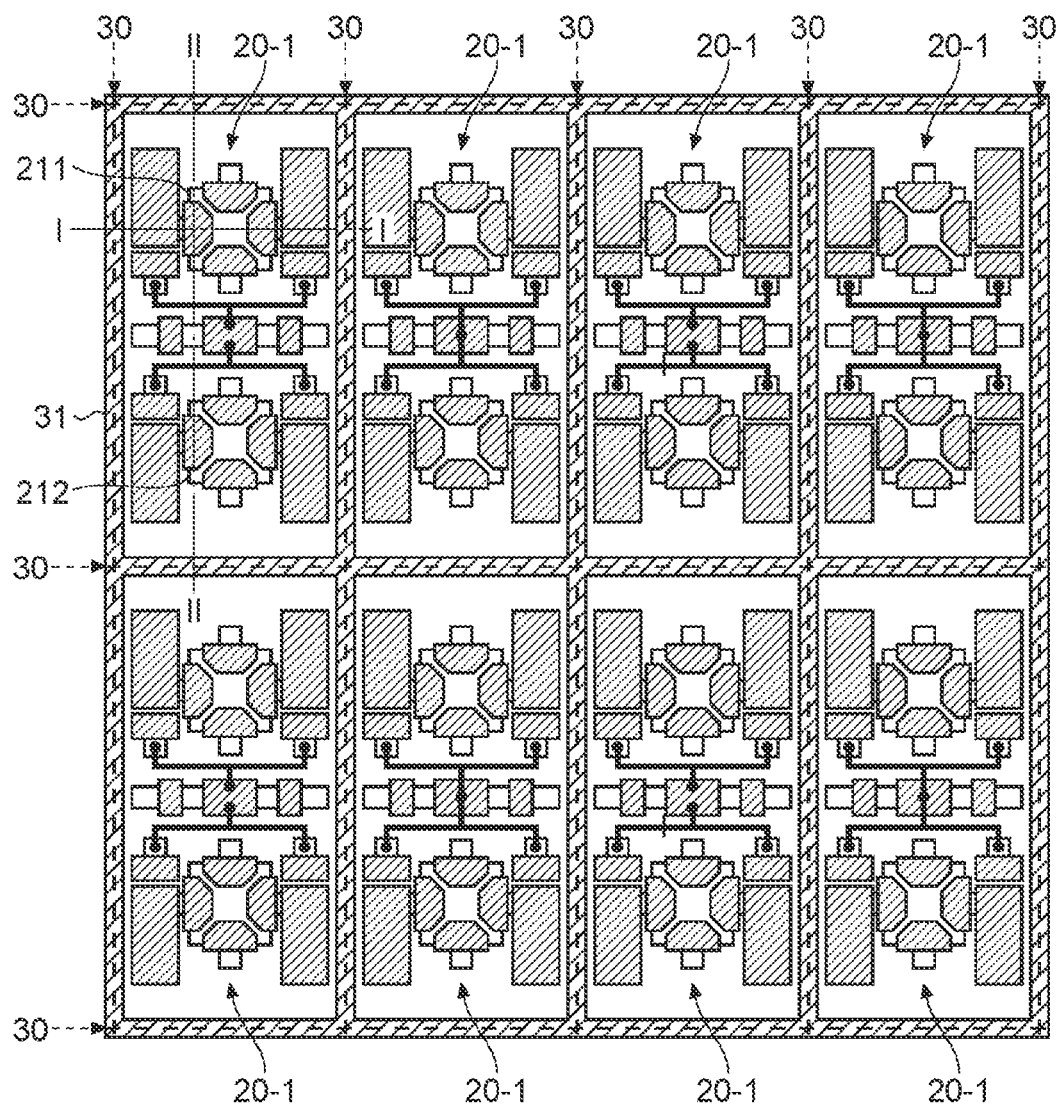
FIG. 17 is a plan view illustrating a planar layout example of a pixel separation portion according to a first layout example of the first embodiment.

FIG. 17 is a plan view illustrating a planar layout example of the pixel separation portion according to the first layout example of the first embodiment. Note that, in the first layout example, a case where the unit pixels 20-1 according to the first configuration example described with reference to FIGS. 7 and 8 are optically separated using the pixel separation portion will be described.

As illustrated in FIG. 17, for the unit pixels 20-1 arranged in a matrix in the pixel array part 101, a pixel separation portion 31 is provided along a boundary portion 30 between the adjacent unit pixels 20-1. Therefore, each unit pixel 20-1 is surrounded by the pixel separation portion 31 from all directions.

1.7.2 Second Layout Example

Figure 18:
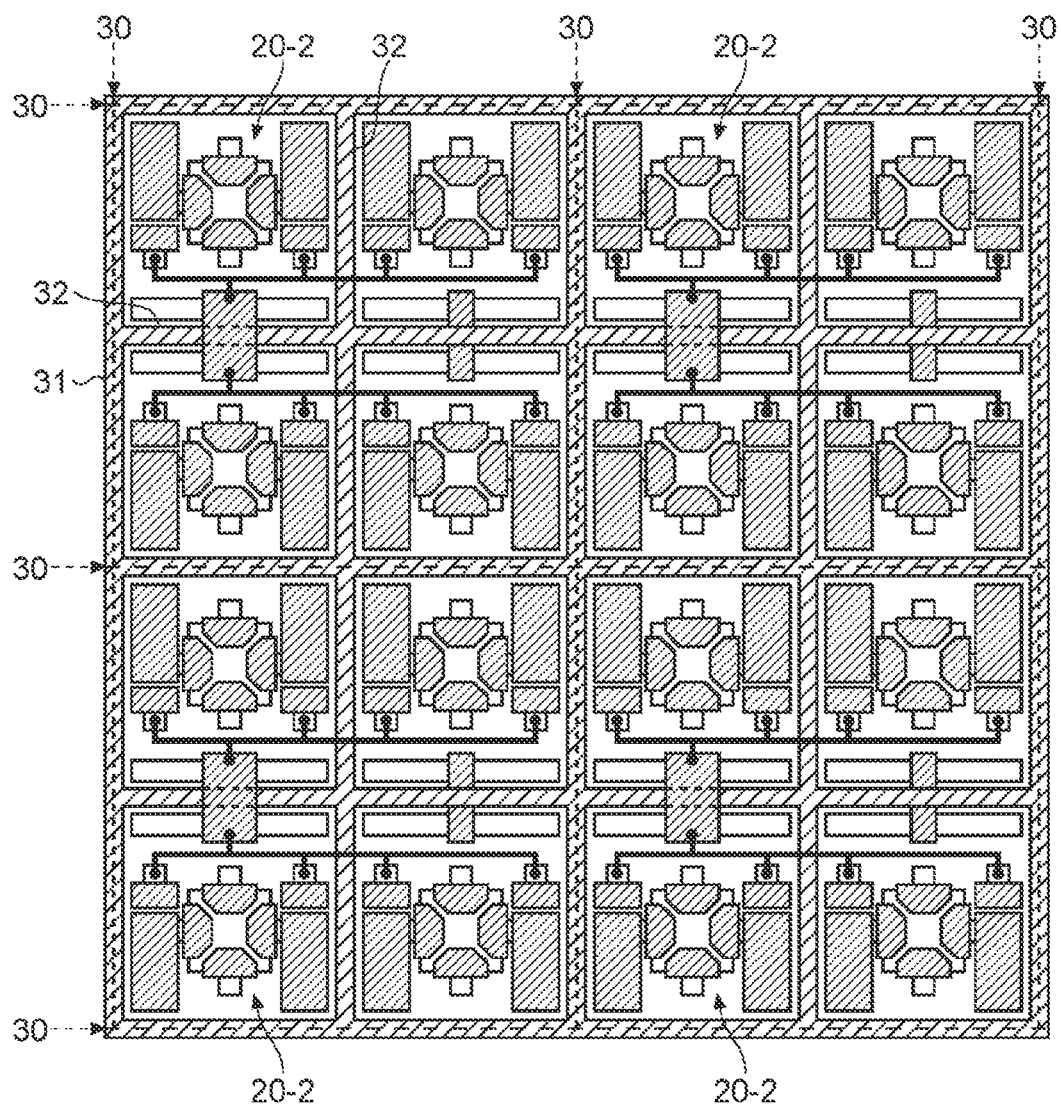
FIG. 18 is a plan view illustrating a planar layout example of a pixel separation portion according to a second layout example of the first embodiment.

FIG. 18 is a plan view illustrating a planar layout example of the pixel separation portion according to the second layout example of the first embodiment. Note that, in the second layout example, a case where the unit pixels 20-2 according to the second configuration example described with reference to FIGS. 9 and 10 are optically separated using the pixel separation portion will be described.

As illustrated in FIG. 18, for the unit pixels 20-2 arranged in a matrix in the pixel array part 101, similarly to the first layout example illustrated in FIG. 17, the pixel separation portion 31 is provided along the boundary portion 30 between the adjacent unit pixels 20-2. Therefore, each unit pixel 20-2 is surrounded by the pixel separation portion 31 from all directions.

Furthermore, in the second layout example, in the pixel region surrounded by the pixel separation portion 31, the boundary portions 30 of the paired readout circuits 20A1 and 20B1, 20B2 and 20A2, 20B3 and 20A3, and 20A4 and 20B4 are optically separated by an element separation portion 32.

Specifically, the element separation portion 32 is each provided between the readout circuits 20A1 and 20B1 and the readout circuits 20B2 and 20A2, between the readout circuits 20A1 and 20B1 and the readout circuits 20B3 and 20A3, between the readout circuits 20B2 and 20A2 and the readout circuits 20A4 and 20B4, and between the readout circuits 20B3 and 20A3 and the readout circuits 20A4 and 20B4.

By optically separating the paired readout circuits, it is possible to reduce crosstalk of light between the plurality of photodiodes 211 to 214 included in the unit pixel 20, and thus, it is possible to generate a depth frame with higher accuracy.

Note that the structure of the element separation portion 32 may be, for example, similar to that of the pixel separation portion 31.

1.7.3 Third Layout Example

Figure 19:
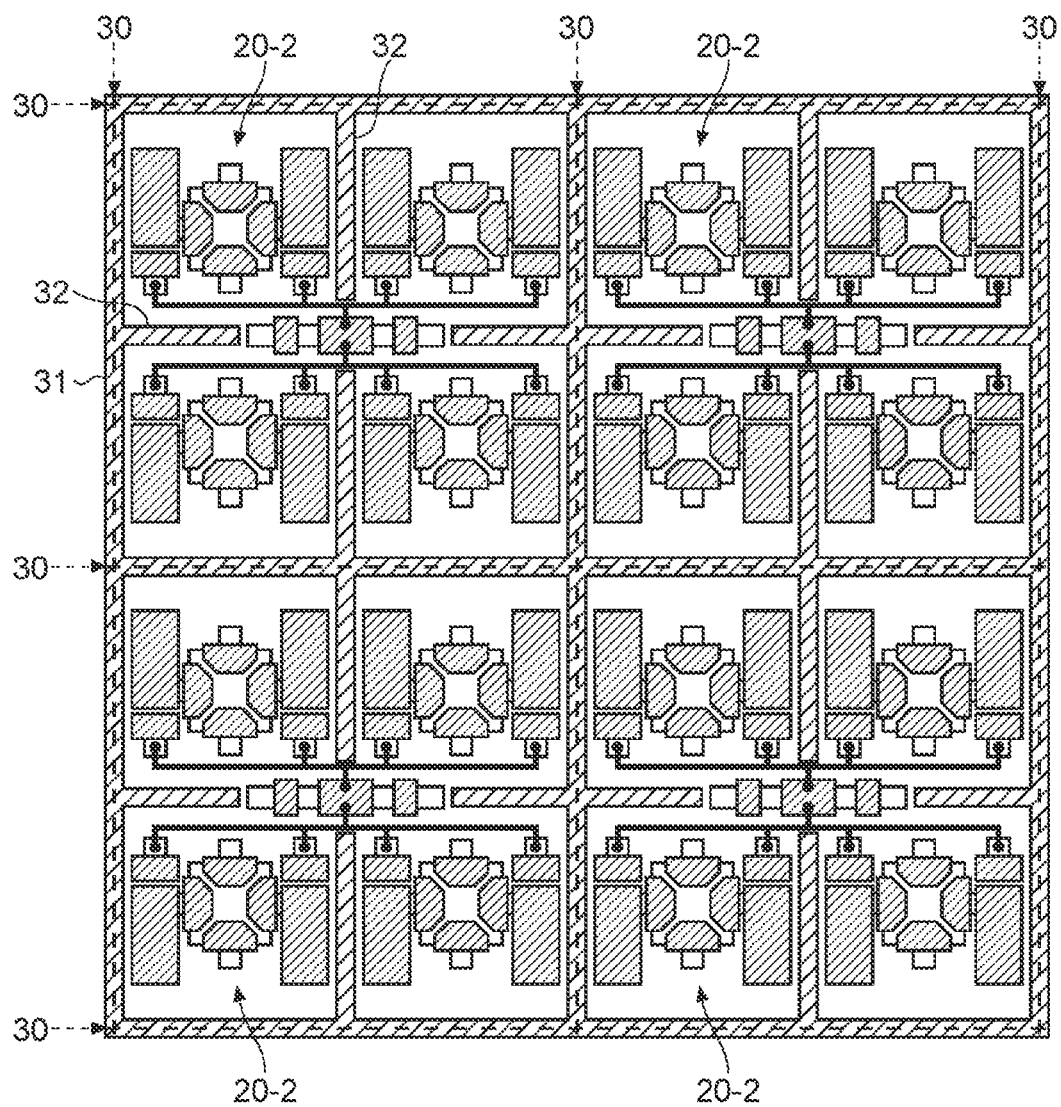
FIG. 19 is a plan view illustrating a planar layout example of a pixel separation portion according to a third layout example of the first embodiment.

FIG. 19 is a plan view illustrating a planar layout example of the pixel separation portion according to the third layout example of the first embodiment. Note that, in the third layout example, a case where the unit pixel 20-3 according to the third configuration example described with reference to FIGS. 9 and 11 is optically separated using the pixel separation portion will be described, but a similar structure can also be applied to the unit pixel 20-4 according to the fourth configuration example described with reference to FIGS. 12 and 13.

As illustrated in FIG. 19, the pixel separation portion 31 and the element separation portion 32 according to the third layout example have structures similar to those of the pixel separation portion 31 and the element separation portion 32 exemplified in the second layout example. However, in the third layout example, the element separation portion 32 is divided at the central portion of the pixel region partitioned by the pixel separation portion 31.

The reset transistor 26, the floating diffusion region 27, the amplification transistor 28, and the selection transistor 29 shared by the plurality of readout circuits 20A1 to 20A4 and 20B1 to 20B4 are arranged in the central portion of the pixel region partitioned by the pixel separation portion 31. This is because by arranging these circuit elements in the central portion of the pixel region, variations in the wiring distance from each photodiode 211 to 214 to the circuit elements can be minimized.

Even with such a structure, since the paired readout circuits are optically separated, it is possible to reduce crosstalk and generate a depth frame with higher accuracy.

1.8 Cross-Sectional Structure Example of Unit Pixel

Next, a cross-sectional structure example of the unit pixel 20 will be described with some examples. In the following description, cross-sectional structures of a cross section taken along line I-I and a cross section taken along line II-II in FIG. 17 will be described by way of example. However, in the cross-sectional structure of the cross section taken along line II-II, a configuration around one photodiode 212 of the two photodiodes 211 and 212 and the diffusion region between the amplification transistor 28 and the reset transistor 26 are omitted for simplification of description.

1.8.1 First Cross-Sectional Structure Example

Figure 20:
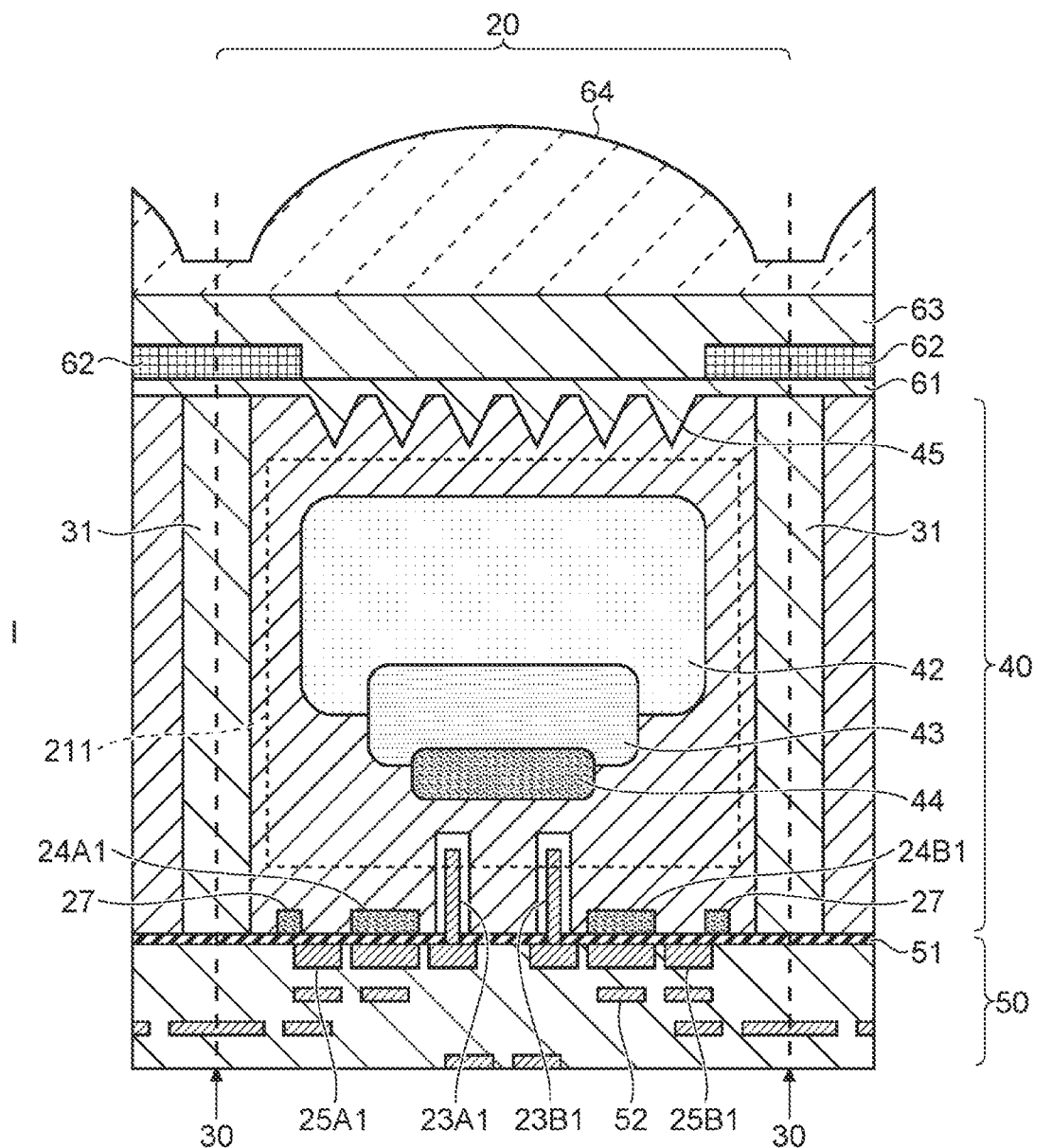
FIG. 20 is a cross-sectional view taken along line I-I illustrating a cross-sectional structure example of a unit pixel according to a first cross-sectional structure example of the first embodiment.
Figure 21:
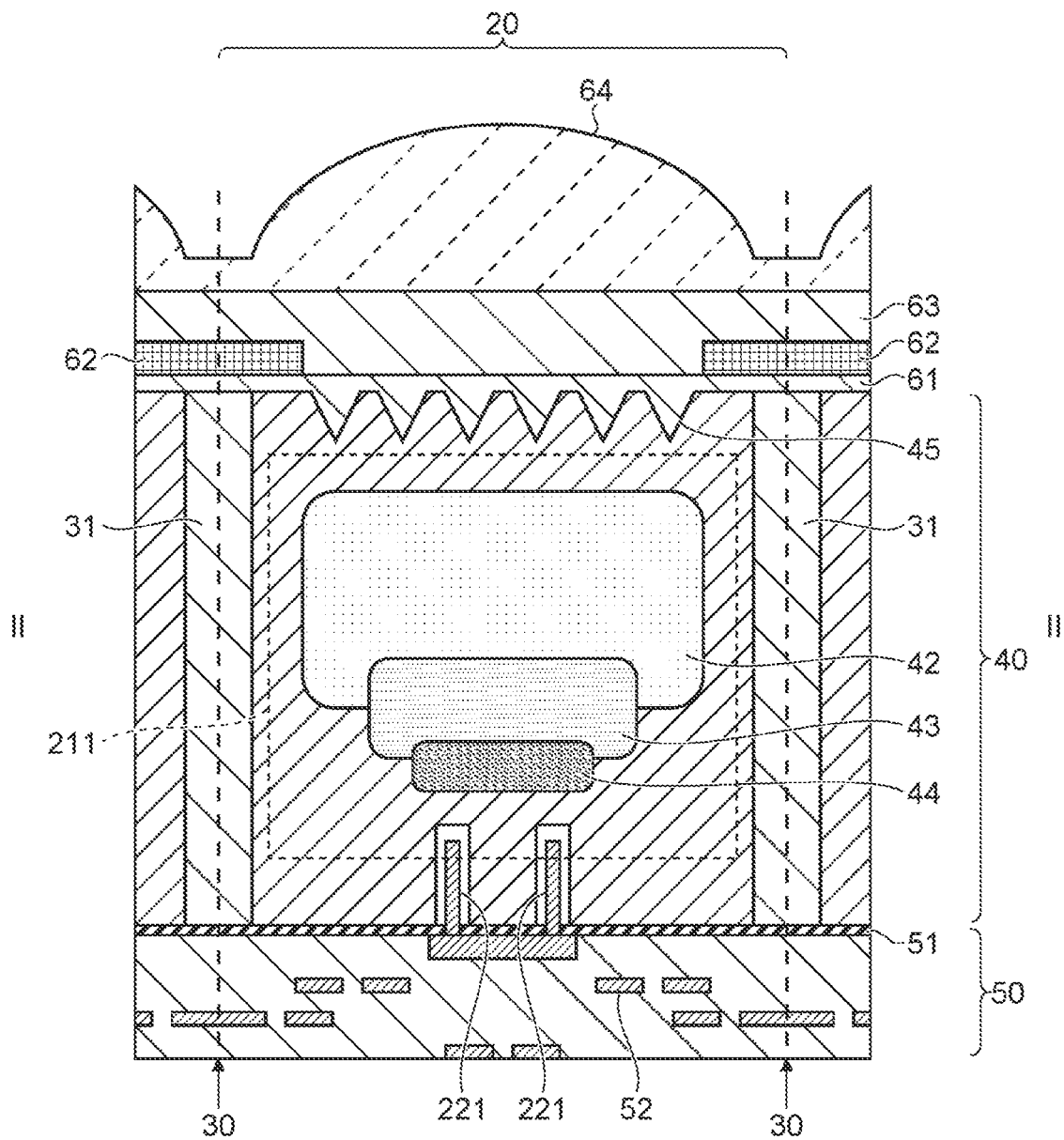
FIG. 21 is a cross-sectional view taken along line II-II illustrating the cross-sectional structure example of the unit pixel according to the first cross-sectional structure example of the first embodiment.

FIG. 20 is a cross-sectional view taken along line I-I illustrating an example of a cross-sectional structure of the unit pixel according to the first cross-sectional structure example of the first embodiment, and FIG. 21 is a cross-sectional view taken along line II-II illustrating an example of the cross-sectional structure of the unit pixel according to the first cross-sectional structure example of the first embodiment.

As illustrated in FIGS. 20 and 21, the unit pixel 20 has, for example, a configuration in which photodiode 211 (and 212) is formed in the region partitioned by the pixel separation portion 31 in a semiconductor substrate 40.

The photodiode 211 (and 212) includes, for example, an n− type semiconductor region 42 in which a donor is diffused at a low concentration, an n type semiconductor region 43 in which a donor concentration is higher than that of the n− type semiconductor region 42, and an n+ type semiconductor region 44 in which a donor is diffused at a higher concentration. Charges generated by photoelectric conversion in the n type semiconductor regions 42 and 43 are taken into the n+ type semiconductor region 44 having a deep potential along a potential gradient, and are transferred to the memory 24A or 24B at timing when the transfer gate 23A or 23B having a dug portion opens.

The circuit elements described with reference to FIGS. 7 and 8, that is, the OFG transistors 221 (and 222), the transfer gate transistors 23A1, 23A2, 23B1, and 23B2, the memories 24A1, 24A2, 24B1, and 24B2, the transfer transistors 25A1, 25A2, 25B1, and 25B2, the reset transistor 26, the floating diffusion region 27, the amplification transistor 28, and the selection transistor 29 are formed on the element formation surface (in the drawings, lower surface) of the semiconductor substrate 40. Among them, FIG. 20 illustrates the transfer gate transistors 23A1 and 23B1, the memories 24A1 and 24B1, the transfer transistors 25A1 and 25B1, and the floating diffusion region 27, and FIG. 21 illustrates the OFG transistor 221 (and 222). Note that, although the floating diffusion regions 27 is illustrated separately in FIG. 20, the floating diffusion regions may be connected via a wire 52 in a wiring layer 50 described later.

As illustrated in FIG. 20, the transfer gate transistors 23A1 and 23B1 (and 23A2 and 23B2) may be vertical transistors having a vertical structure formed in a substrate thickness direction of the semiconductor substrate 40. Furthermore, as illustrated in FIG. 21, the OFG transistors 221 (and 222) may be twin vertical transistors formed in the substrate thickness direction of the semiconductor substrate 40. Furthermore, the transfer gate transistors 23A1 and 23B1 (and 23A2 and 23B2) and the OFG transistor 221 (and 222) may be vertical transistors having a twin structure including the above-described two vertical structures. However, these are merely examples, and various modifications may be made. Note that an insulating film 51 in FIGS. 20 and 21 is a gate insulating film of each circuit element formed on the semiconductor substrate 40.

On the element formation surface of the semiconductor substrate 40, the wiring layer 50 including the wire 52 connected to each circuit element formed on the semiconductor substrate 40 is formed.

For example, an uneven structure 45 is formed on a back surface (upper surface in the drawings) of the semiconductor substrate 40, that is, the light incident surface. In this manner, by providing the uneven structure 45 on the light incident surface, the incident surface can have a structure in which a refractive index gradually changes. As a result, the incident light is efficiently diffracted to lengthen an optical path length of the incident light in the semiconductor substrate 40, and a reflectance of the incident light is reduced, and thus, more light can be incident on the photodiode 211 (and 212). As a result, since quantum efficiency of the photodiode 211 (and 212) is improved, a depth frame with higher accuracy can be generated. Note that a period of the periodic uneven structure 45 can be, for example, 300 nm or more.

On the back surface of the semiconductor substrate 40, an insulating film 61, a flattening film 63 on the insulating film 61, and an on-chip lens 64 on the flattening film 63 are provided.

Furthermore, a light shielding film 62 for preventing color mixture between adjacent pixels is provided at the boundary portion 30 between the adjacent unit pixels 20 on the flattening film 63. For the light shielding film 62, for example, a material having a light shielding property such as tungsten (W) may be used.

As the semiconductor substrate 40, for example, a p-type silicon substrate or the like can be used, and a substrate thickness thereof is reduced to, for example, a thickness of 20 μm (micrometers) or less. Note that the thickness of the semiconductor substrate 40 may be 20 μm or more, and the thickness may be appropriately determined according to target characteristics or the like of the light receiving unit 14.

The insulating film 61 has a function of an antireflection film for incident light in addition to a function of pinning the incident surface of the semiconductor substrate 40. The insulating film 61 is made of, for example, silicon nitride (SiN), aluminum oxide ($Al_2O_3$), silicon oxide ($SiO_2$), hafnium oxide ($HfO_2$), tantalum oxide ($Ta_2O_5$), or the like. A thickness of the insulating film 61 is an optical thickness of about a ¼ wave plate with respect to near infrared rays, and can be, for example, 50 nm or more and 150 nm or less. The flattening film 63 may be, for example, a film formed using an insulating material such as silicon oxide ($SiO_2$) or silicon nitride (SiN).

For the on-chip lens 64, for example, silicon oxide ($SiO_2$), a transparent resin, or the like can be used, and a curvature thereof is set such that the incident light is condensed in the vicinity of the center of the photodiode 211 (or 212).

The pixel separation portion 31 according to the first cross-sectional structure example has, for example, a so-called full front trench isolation (FFTI) type structure formed by embedding an insulating material such as silicon oxide ($SiO_2$) in a trench penetrating from the element formation surface to the back surface of the semiconductor substrate 40.

1.8.2 Second Cross-Sectional Structure Example

Figure 22:
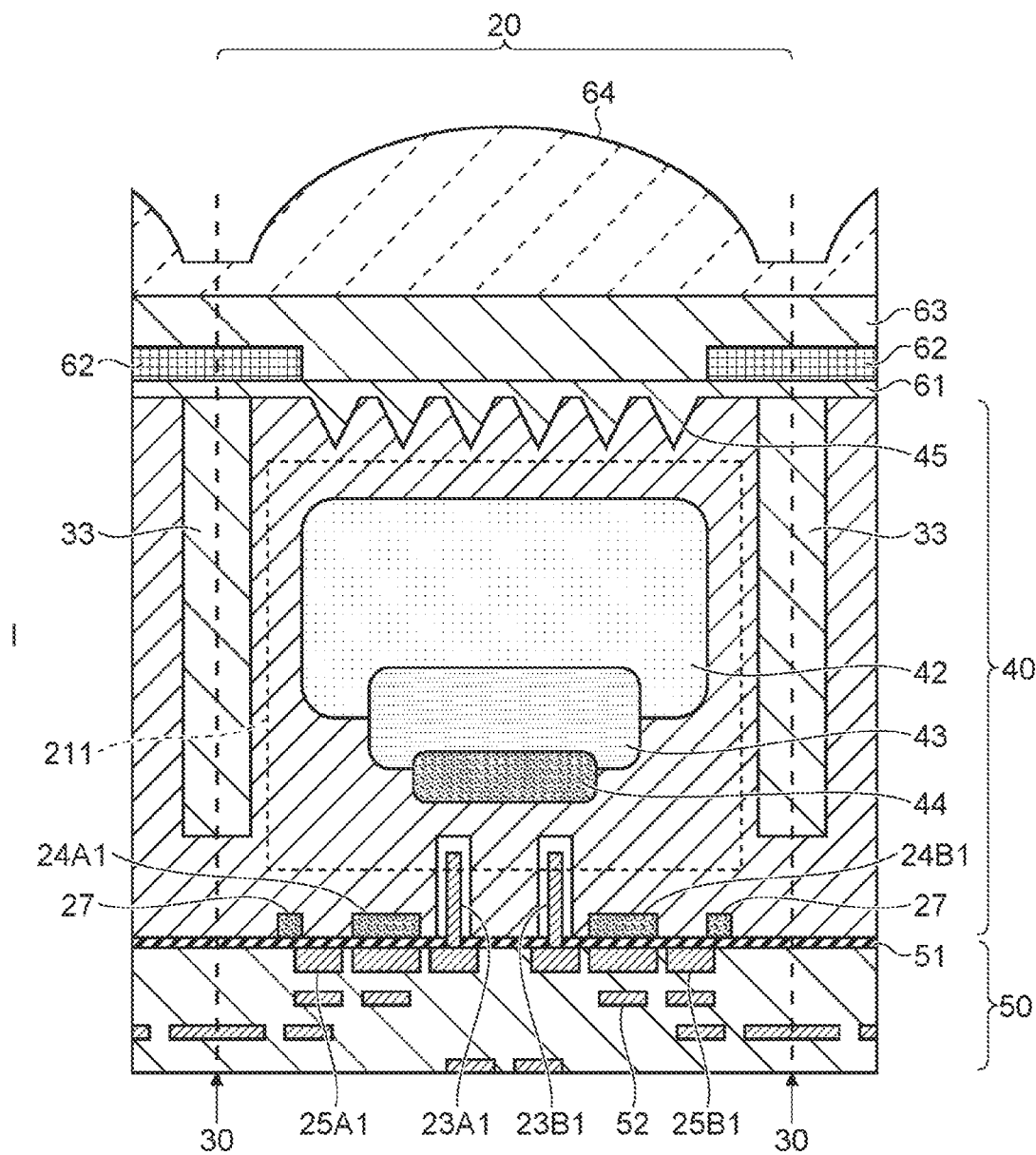
FIG. 22 is a cross-sectional view taken along line I-I illustrating a cross-sectional structure example of a unit pixel according to a second cross-sectional structure example of the first embodiment.
Figure 23:
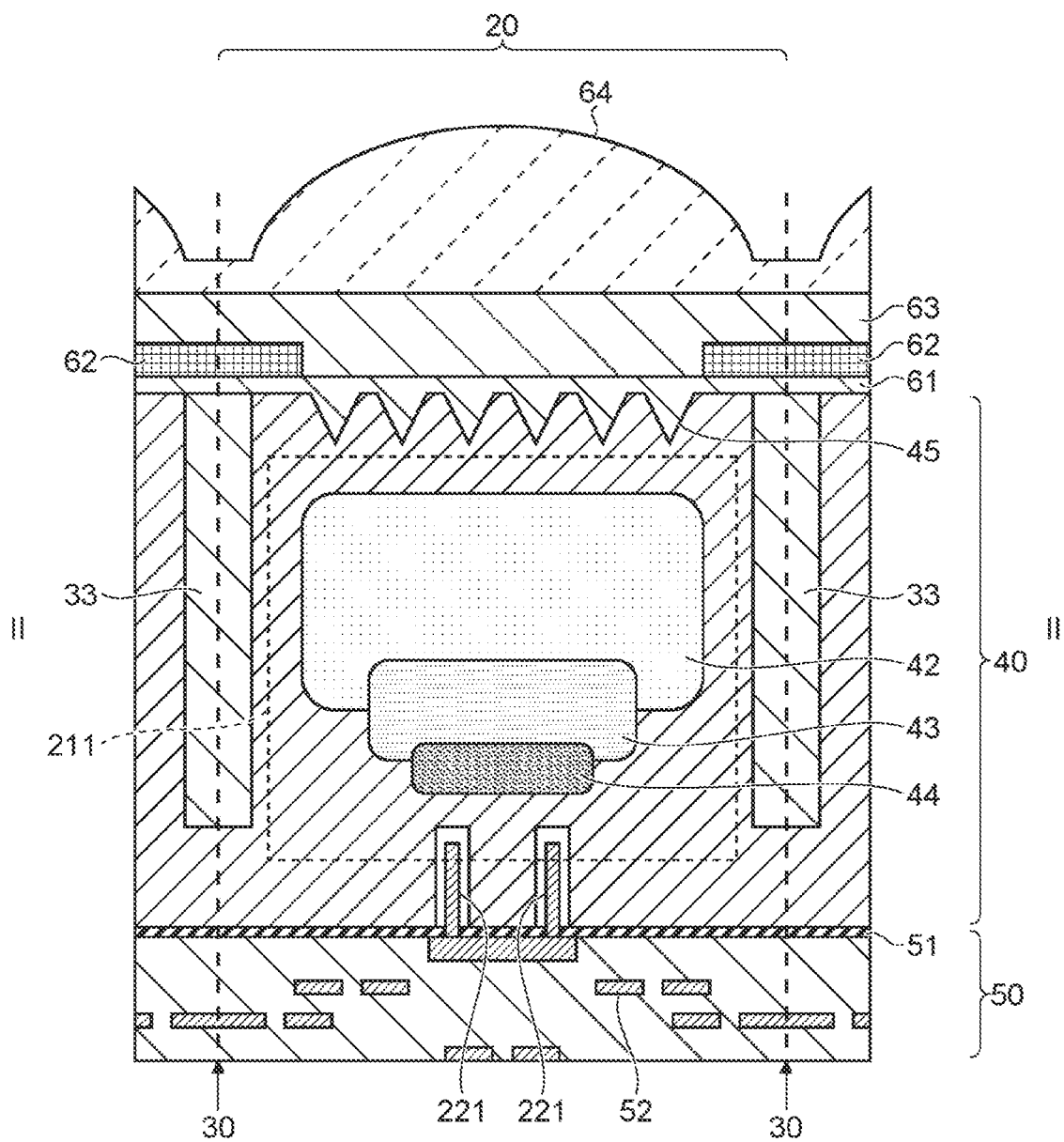
FIG. 23 is a cross-sectional view taken along line II-II illustrating the cross-sectional structure example of the unit pixel according to the second cross-sectional structure example of the first embodiment.

FIG. 22 is a cross-sectional view taken along line I-I illustrating a cross-sectional structure example of a unit pixel according to a second cross-sectional structure example of the first embodiment, and FIG. 23 is a cross-sectional view taken along line II-II illustrating the cross-sectional structure example of the unit pixel according to the second cross-sectional structure example of the first embodiment.

As can be seen by comparing FIGS. 20 and 21 with FIGS. 22 and 23, the unit pixel 20 according to the second cross-sectional structure example has a cross-sectional structure in which an FFTI type pixel separation portion 31 is replaced with a so-called reverse deep trench isolation (RDTI) type pixel separation portion 33 in a cross-sectional structure similar to that of the unit pixel 20 according to the first cross-sectional structure example.

The RDTI type pixel separation portion 33 can be formed, for example, by embedding an insulating material such as silicon oxide ($SiO_2$) in a trench engraved from the element formation surface of the semiconductor substrate 40 to such an extent that the trench does not penetrate the semiconductor substrate 40.

Note that the configuration of the pixel separation portion 33 can also be applied to the element separation portion 32.

1.8.3 Third Cross-Sectional Structure Example

Figure 24:
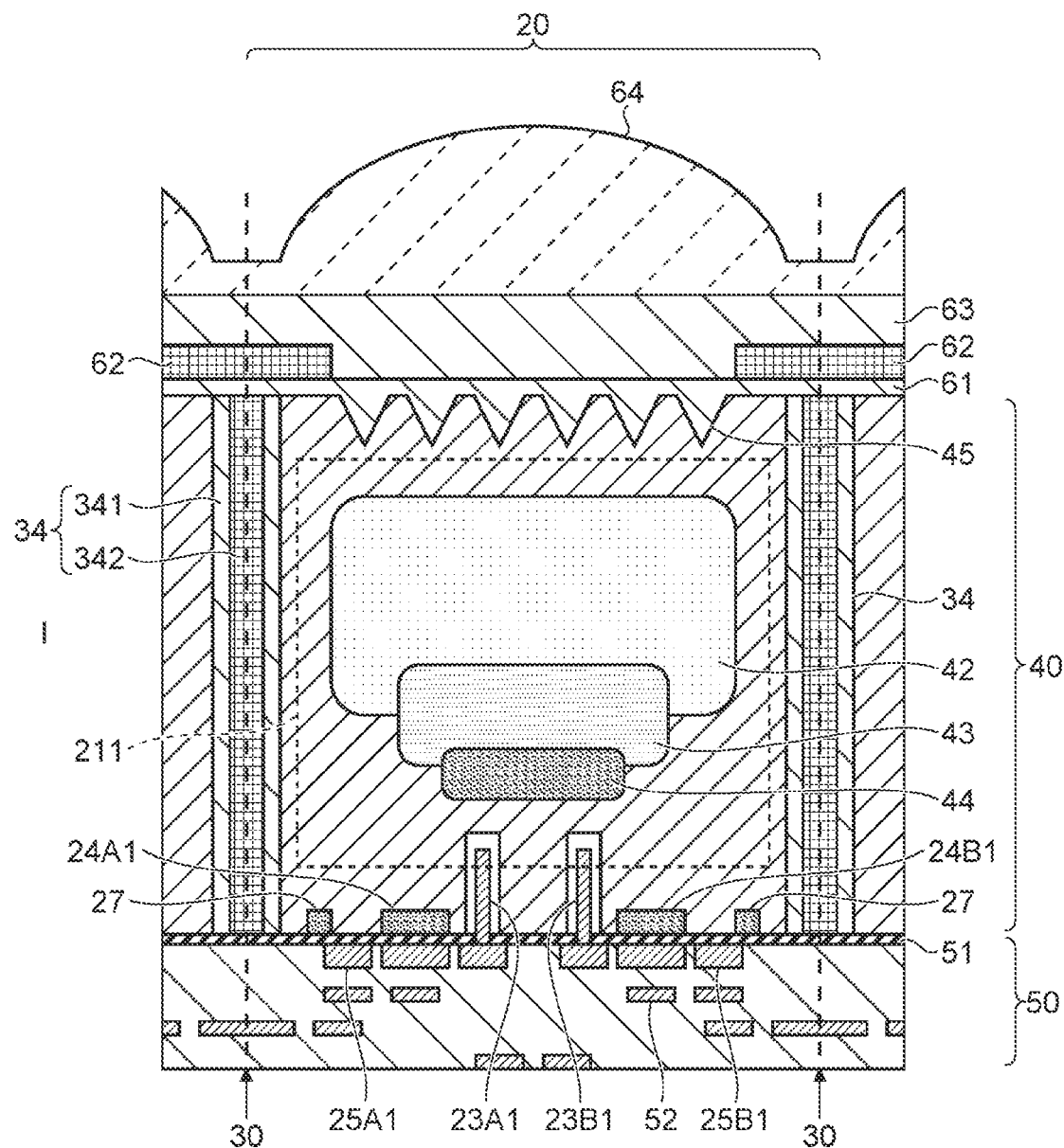
FIG. 24 is a cross-sectional view taken along line I-I illustrating a cross-sectional structure example of a unit pixel according to a third cross-sectional structure example of the first embodiment.
Figure 25:
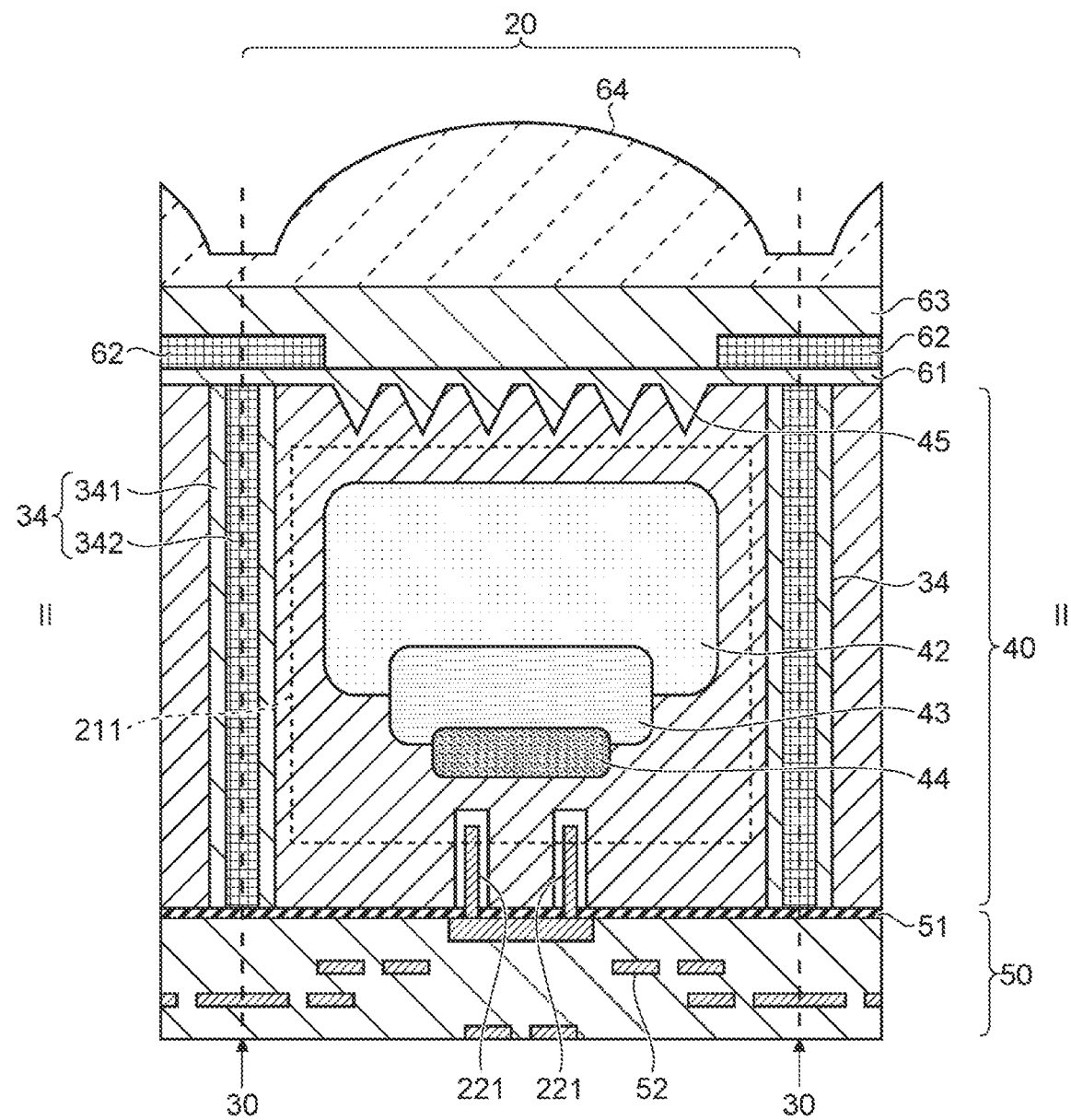
FIG. 25 is a cross-sectional view taken along line II-II illustrating the cross-sectional structure example of the unit pixel according to the third cross-sectional structure example of the first embodiment.

FIG. 24 is a cross-sectional view taken along line I-I illustrating a cross-sectional structure example of a unit pixel according to a third cross-sectional structure example of the first embodiment, and FIG. 25 is a cross-sectional view taken along line II-II illustrating the cross-sectional structure example of the unit pixel according to the third cross-sectional structure example of the first embodiment.

As can be seen by comparing FIGS. 20 and 21 with FIGS. 24 and 25, the unit pixel 20 according to the third cross-sectional structure example has a cross-sectional structure in which the FFTI type pixel separation portion 31 is replaced with an FFTI type pixel separation portion 34 in a cross-sectional structure similar to that of the unit pixel 20 according to the first cross-sectional structure example.

The pixel separation portion 34 includes, for example, an insulating film 341 that covers an inner surface of a trench penetrating the front and back surfaces of the semiconductor substrate 40, and a light shielding portion 342 embedded in the trench formed by the insulating film 341.

For example, an insulating material such as silicon oxide ($SiO_2$) can be used for the insulating film 341. Meanwhile, for example, tungsten (W), aluminum (Al), or the like can be used for the light shielding portion 342.

In this manner, by providing the light shielding portion 342 inside the pixel separation portion 34, it is possible to more optically separate the adjacent unit pixels 20, and thus, it is possible to generate a depth frame with higher accuracy.

Note that the configuration of the pixel separation portion 34 can also be applied to the element separation portion 32.

1.8.4 Fourth Cross-Sectional Structure Example

Figure 26:
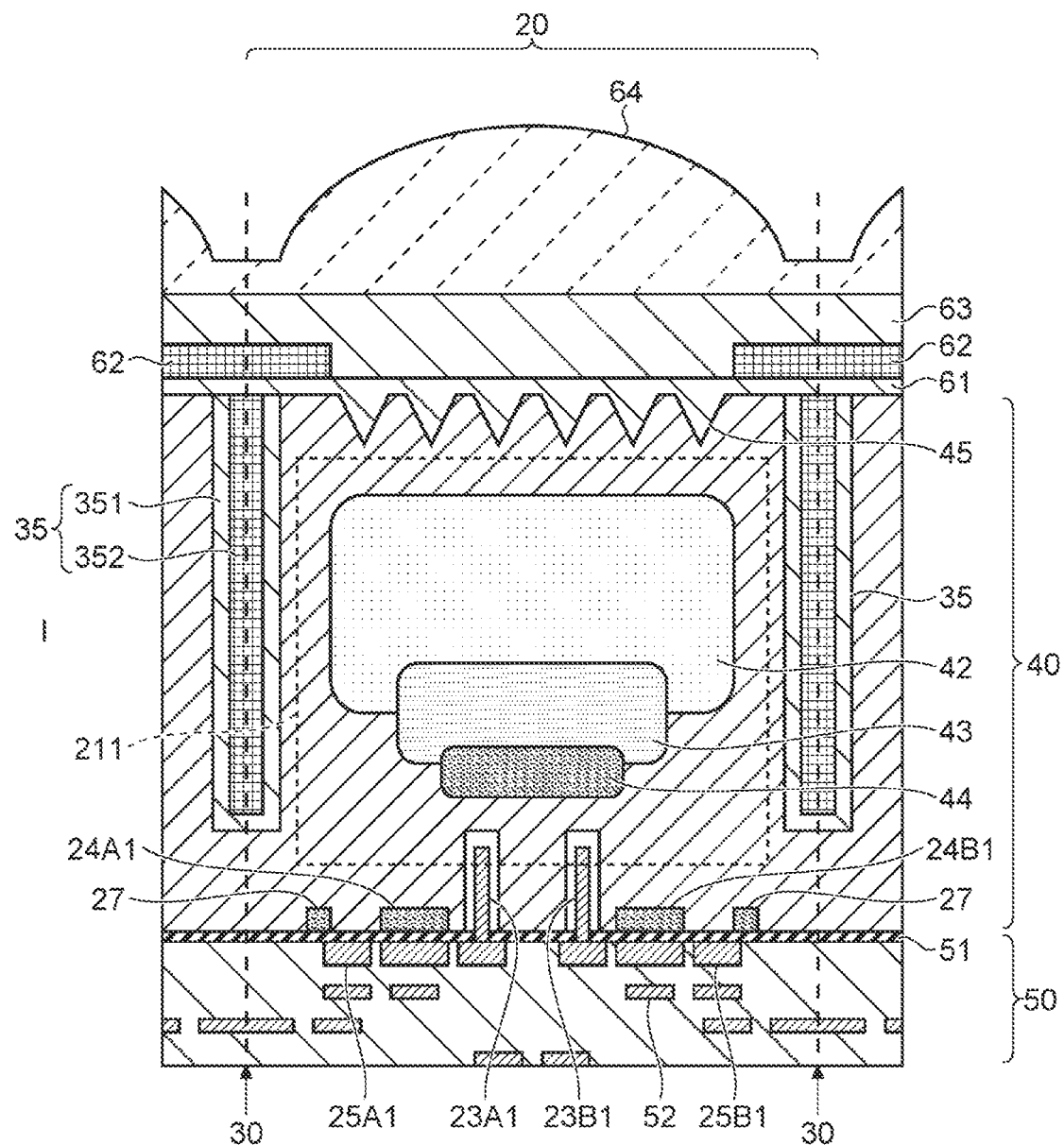
FIG. 26 is a cross-sectional view taken along line I-I illustrating a cross-sectional structure example of a unit pixel according to a fourth cross-sectional structure example of the first embodiment.
Figure 27:
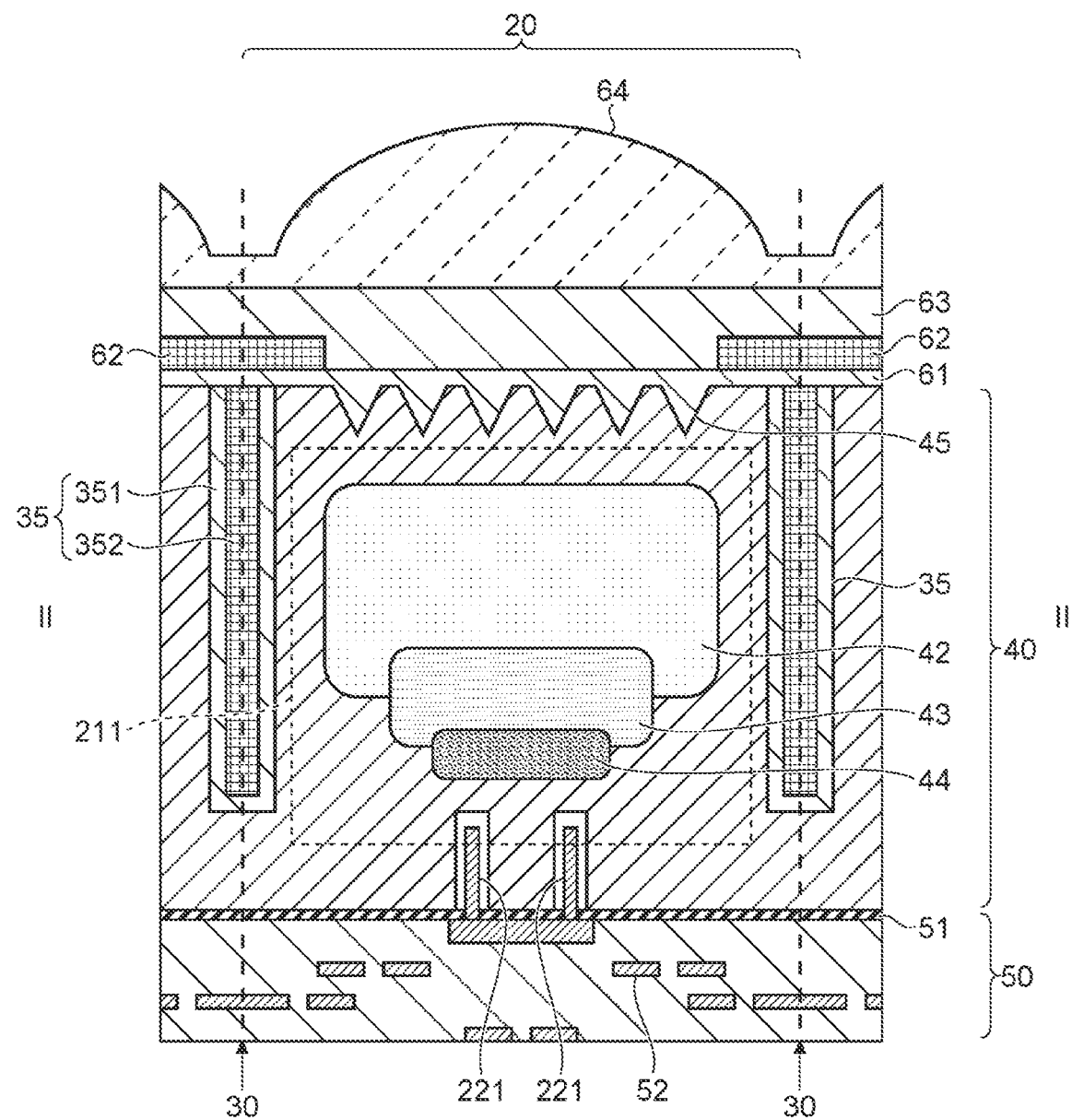
FIG. 27 is a cross-sectional view taken along line II-II illustrating the cross-sectional structure example of the unit pixel according to the fourth cross-sectional structure example of the first embodiment.

FIG. 26 is a cross-sectional view taken along line I-I illustrating a cross-sectional structure example of a unit pixel according to a fourth cross-sectional structure example of the first embodiment, and FIG. 27 is a cross-sectional view taken along line II-II illustrating the cross-sectional structure example of the unit pixel according to the fourth cross-sectional structure example of the first embodiment.

As can be seen by comparing FIGS. 24 and 25 with FIGS. 26 and 27, the unit pixel 20 according to the fourth cross-sectional structure example has a cross-sectional structure in which the FFTI type pixel separation portion 34 is replaced with a RDTI type pixel separation portion 35 in a cross-sectional structure similar to that of the unit pixel 20 according to the third cross-sectional structure example.

The RDTI type pixel separation portion 35 includes, for example, an insulating film 351 that covers an inner surface of a trench carved from an element formation surface of the semiconductor substrate 40 to such an extent that the trench does not penetrate the semiconductor substrate 40, and a light shielding portion 352 embedded in the trench formed by the insulating film 351.

For example, an insulating material such as silicon oxide ($SiO_2$) can be used for the insulating film 351. Meanwhile, for example, tungsten (W), aluminum (Al), or the like can be used for the light shielding portion 352.

Note that the configuration of the pixel separation portion 35 can also be applied to the element separation portion 32.

1.9 Layout for FD Sharing

Next, whether or not FD sharing (sharing of the floating diffusion region 27) is enabled for each variation of the arrangement of the readout circuits will be described. Note that, in the following description, an H direction indicates a row direction in a matrix array of the unit pixels 20, and a V direction indicates a column direction. In addition, in the drawings referred to in the following description, the readout circuits A and B or C and D that form a pair for acquiring one subframe are surrounded by a solid line and/or a broken line. Regions separated by a solid line indicate a case where FD sharing is impossible, and regions separated by a broken line indicate a case where FD sharing is possible.

Furthermore, in each of the first to 16 variations exemplified below, a pixel region 70 of each unit pixel 20 is divided into 4 regions (hereinafter, referred to as a divided region) 71 to 74 of 2×2. In each of the divided regions 71 to 74, in addition to the two paired readout circuits A and B or C and D, one photodiode 21 (not illustrated) and one OFG transistor 22 (not illustrated) are arranged.

1.9.1 First Variation

Figure 28:
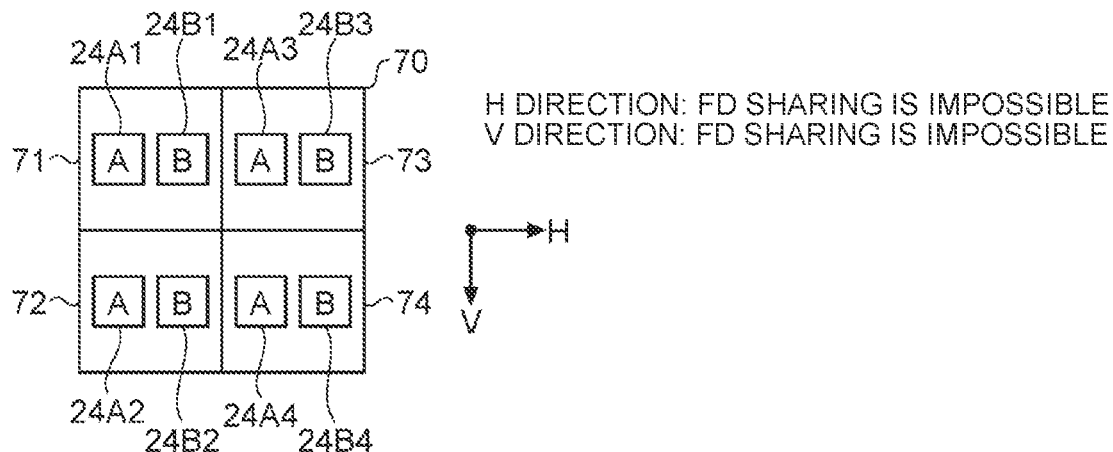
FIG. 28 is a schematic diagram illustrating a planar layout example of a memory according to a first variation of the first embodiment.

FIG. 28 is a schematic diagram illustrating a planar layout example of a memory according to a first variation of the first embodiment. As illustrated in FIG. 28, in the first variation, in each divided region 71 to 74, a readout circuit A for detecting a light amount $Q_0$ (or $Q_{90}$) of a component having a phase angle α of 0 degrees (or 90 degrees) is arranged on the left side, and a readout circuit B for detecting a light amount $Q_{180}$ (or $Q_{270}$) of a component having a phase angle α of 180 degrees (or 270 degrees) is arranged on the right side. That is, in the first variation, the unit pixels 920 of the basic configuration described above with reference to FIG. 3 are arranged in a matrix.

In such a layout, since the symmetry of the memories 24A and 24B is not ensured in each of the total of four readout circuits A and B arranged in the H direction, that is, the divided regions 71 and 73 and the total of four readout circuits A and B arranged in the divided regions 72 and 74, it is not possible to share one floating diffusion region 27.

In addition, similarly in the V direction, since the symmetry of the memories 24A and 24B is not secured in each of the total of four readout circuits A and B arranged in the divided regions 71 and 72 and the total of four readout circuits A and B arranged in the divided regions 73 and 74, it is not possible to share one floating diffusion region 27.

1.9.2 Second Variation

Figure 29:
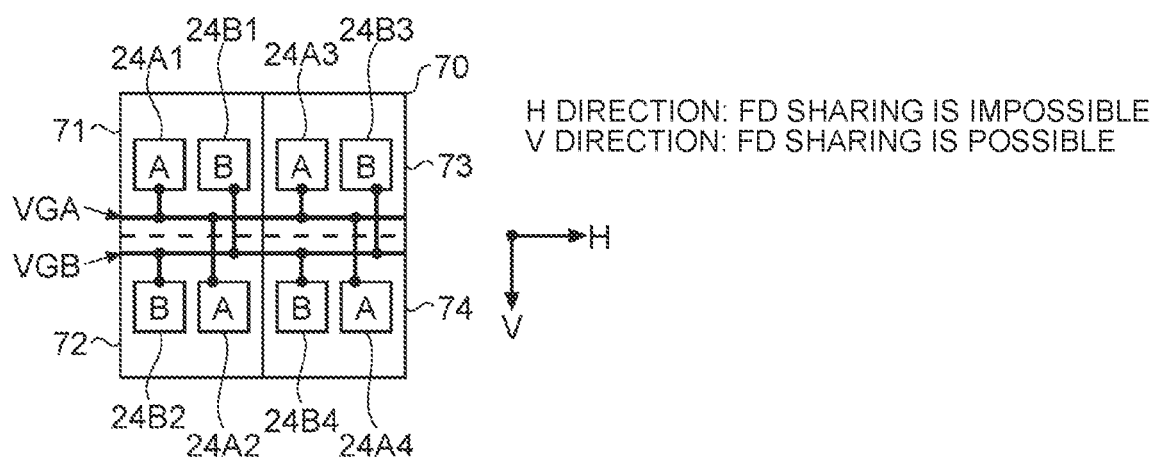
FIG. 29 is a schematic diagram illustrating a planar layout example of a memory according to a second variation of the first embodiment.

FIG. 29 is a schematic diagram illustrating a planar layout example of a memory according to a second variation of the first embodiment. As illustrated in FIG. 29, in the second variation, in the divided regions 71 and 73, the readout circuit A is arranged on the left side, and the readout circuit B is arranged on the right side. Meanwhile, in the divided regions 72 and 74, the readout circuit A is arranged on the right side, and the readout circuit B is arranged on the left side.

In such a layout, since the symmetry of the memory in the H direction is not secured, the total of four readout circuits A and B arranged in the divided regions 71 and 73 and the total of four readout circuits A and B arranged in the divided regions 72 and 74 cannot share one floating diffusion region 27.

Meanwhile, in the V direction, since the symmetry of the memory is secured, one floating diffusion region 27 can be shared by each of a total of four readout circuits A and B arranged in the divided regions 71 and 72 and a total of four readout circuits A and B arranged in the divided regions 73 and 74.

1.9.3 Third Variation

Figure 30:
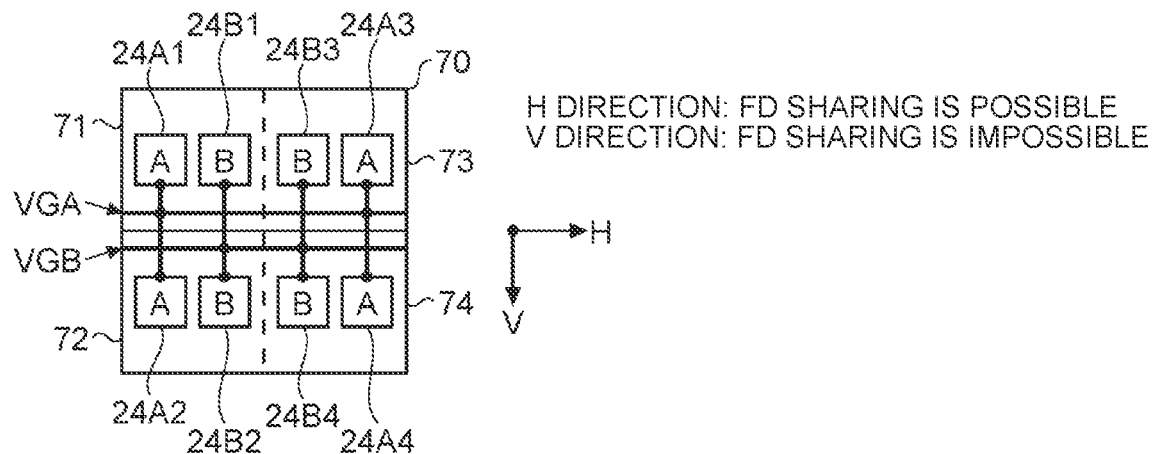
FIG. 30 is a schematic diagram illustrating a planar layout example of a memory according to a third variation of the first embodiment.

FIG. 30 is a schematic diagram illustrating a planar layout example of a memory according to a third variation of the first embodiment. As illustrated in FIG. 30, in the third variation, in the divided regions 71 and 72, the readout circuit A is arranged on the left side, and the readout circuit B is arranged on the right side. Meanwhile, in the divided regions 73 and 74, the readout circuit A is arranged on the right side, and the readout circuit B is arranged on the left side.

In such a layout, since the symmetry of the memory in the H direction is secured, one floating diffusion region 27 can be shared by each of a total of four readout circuits A and B arranged in the divided regions 71 and 73 and a total of four readout circuits A and B arranged in the divided regions 72 and 74.

Meanwhile, since the symmetry of the memory in the V direction is not secured, the total of four readout circuits A and B arranged in the divided regions 71 and 72 and the total of four readout circuits A and B arranged in the divided regions 73 and 74 cannot share one floating diffusion region 27.

1.9.4 Fourth Variation

Figure 31:
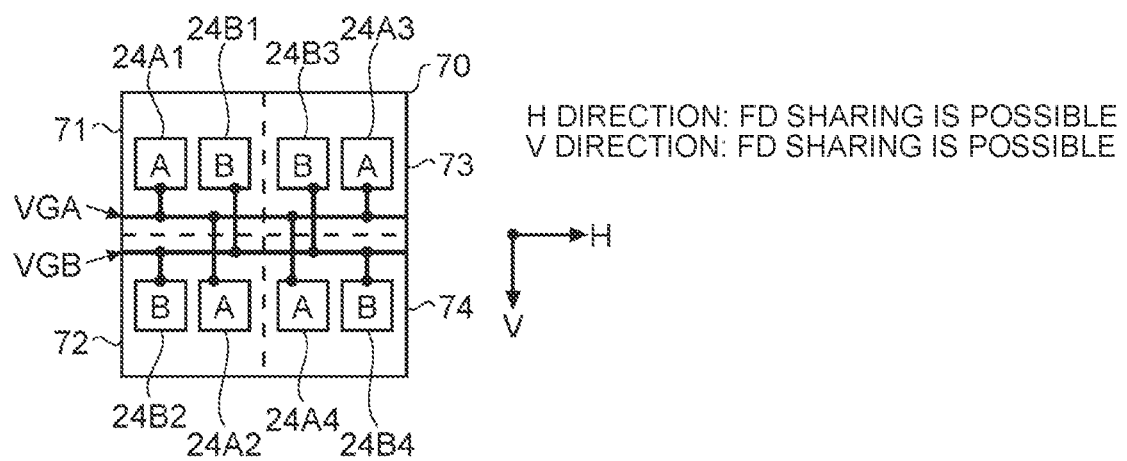
FIG. 31 is a schematic diagram illustrating a planar layout example of a memory according to a fourth variation of the first embodiment.

FIG. 31 is a schematic diagram illustrating a planar layout example of a memory according to a fourth variation of the first embodiment. As illustrated in FIG. 31, in the fourth variation, in the divided regions 71 and 74, the readout circuit A is arranged on the left side, and the readout circuit B is arranged on the right side. Meanwhile, in the divided regions 72 and 73, the readout circuit A is arranged on the right side, and the readout circuit B is arranged on the left side.

In such a layout, since the symmetry of the memory in the H direction is secured, one floating diffusion region 27 can be shared by each of a total of four readout circuits A and B arranged in the divided regions 71 and 73 and a total of four readout circuits A and B arranged in the divided regions 72 and 74.

Furthermore, similarly in the V direction, since the symmetry of the memory is secured, one floating diffusion region 27 can be shared by each of a total of four readout circuits A and B arranged in the divided regions 71 and 72 and a total of four readout circuits A and B arranged in the divided regions 73 and 74.

1.9.5 Fifth Variation

Figure 32:
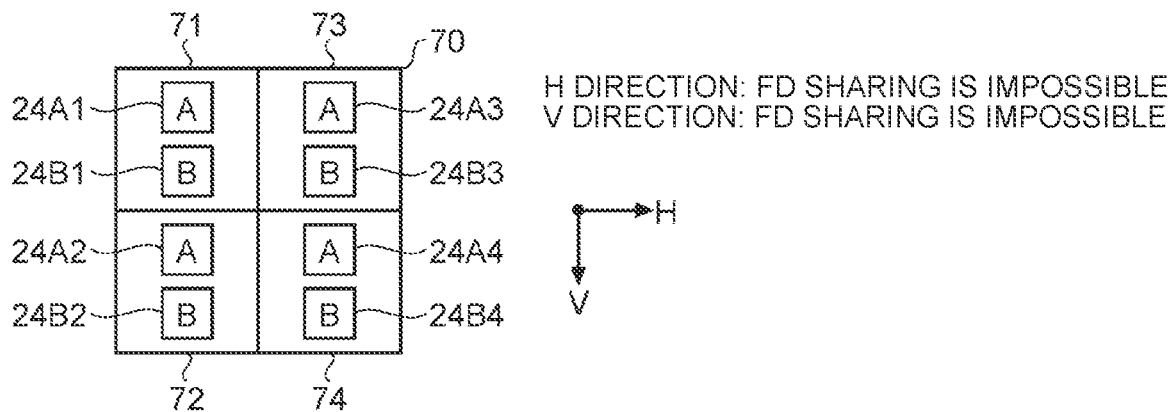
FIG. 32 is a schematic diagram illustrating a planar layout example of a memory according to a fifth variation of the first embodiment.

FIG. 32 is a schematic diagram illustrating a planar layout example of a memory according to a fifth variation of the first embodiment. As illustrated in FIG. 32, in the fifth variation, in each of the divided region 71 to 74, the readout circuit A is arranged on the upper side, and the readout circuit B is arranged on the lower side.

In such a layout, similarly to the first variation, since the symmetry of the memory is not secured in both the H direction and the V direction, the floating diffusion region 27 cannot be shared.

1.9.6 Sixth Variation

Figure 33:
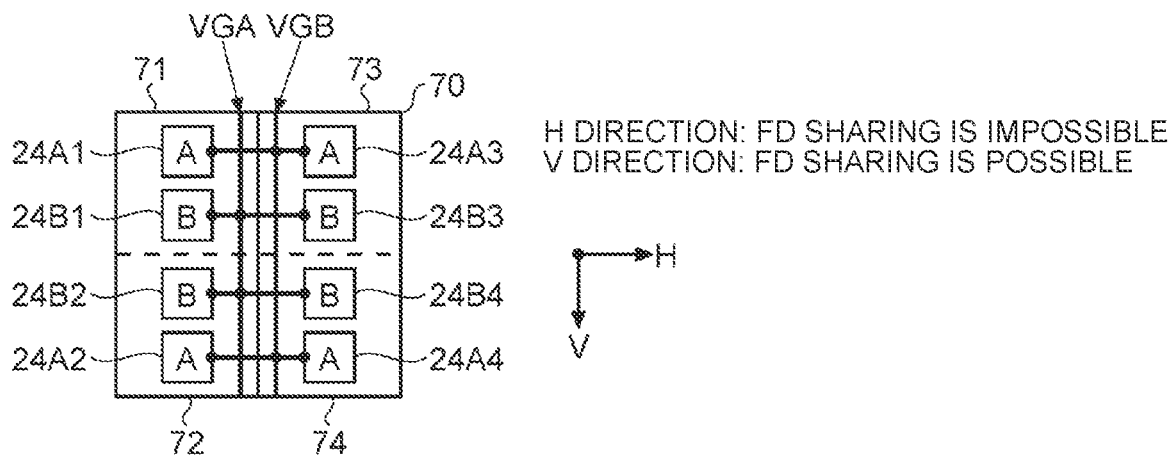
FIG. 33 is a schematic diagram illustrating a planar layout example of a memory according to a sixth variation of the first embodiment.

FIG. 33 is a schematic diagram illustrating a planar layout example of a memory according to a sixth variation of the first embodiment. As illustrated in FIG. 33, in the sixth variation, in the divided regions 71 and 73, the readout circuit A is arranged on the upper side, and the readout circuit B is arranged on the lower side. Meanwhile, in the divided regions 72 and 74, the readout circuit A is arranged on the lower side, and the readout circuit B is arranged on the upper side.

In such a layout, similarly to the second variation, since the symmetry of the memory is secured in the H direction, the floating diffusion region 27 can be shared. However, since the symmetry of the memory is not secured in the V direction, the floating diffusion region 27 cannot be shared.

1.9.7 Seventh Variation

Figure 34:
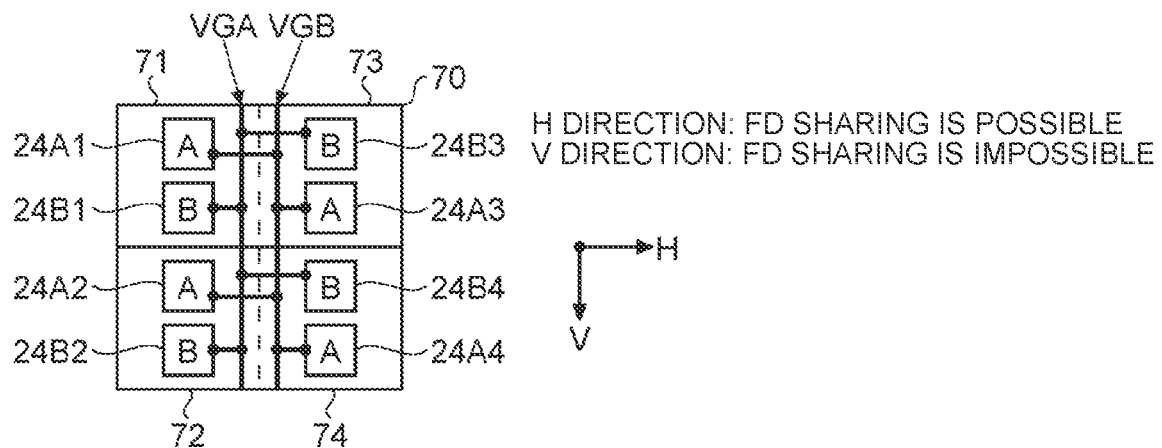
FIG. 34 is a schematic diagram illustrating a planar layout example of a memory according to a seventh variation of the first embodiment.

FIG. 34 is a schematic diagram illustrating a planar layout example of a memory according to a seventh variation of the first embodiment. As illustrated in FIG. 34, in the seventh variation, in the divided regions 71 and 72, the readout circuit A is arranged on the upper side, and the readout circuit B is arranged on the lower side. Meanwhile, in the divided regions 73 and 74, the readout circuit A is arranged on the lower side, and the readout circuit B is arranged on the upper side.

In such a layout, similarly to the third variation, since the symmetry of the memory is secured in the H direction, one floating diffusion region 27 can be shared, but since the symmetry of the memory is not secured in the V direction, the floating diffusion region 27 cannot be shared.

1.9.8 Eighth Variation

Figure 35:
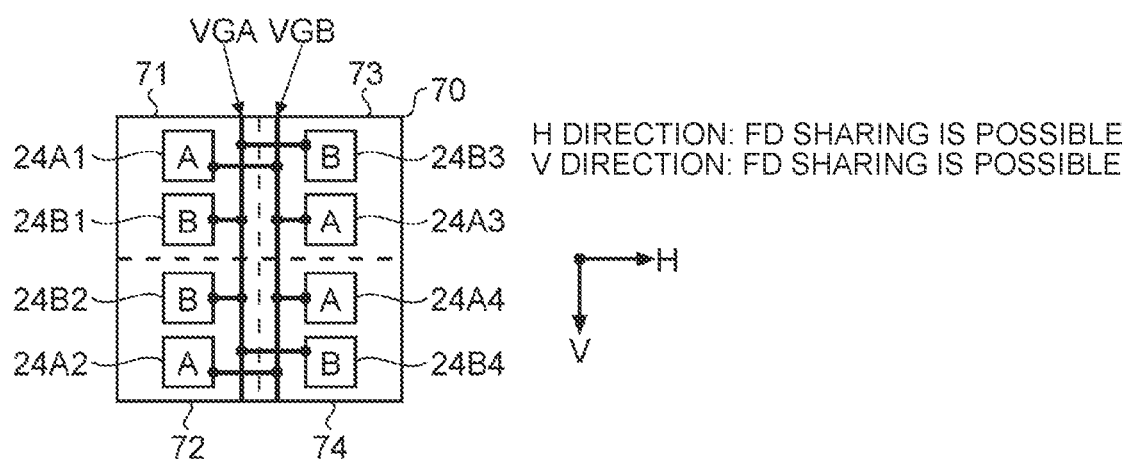
FIG. 35 is a schematic diagram illustrating a planar layout example of a memory according to an eighth variation of the first embodiment.

FIG. 35 is a schematic diagram illustrating a planar layout example of a memory according to an eighth variation of the first embodiment. As illustrated in FIG. 35, in the eighth variation, in the divided regions 71 and 74, the readout circuits 20A1 and 20A4 are arranged on the upper side, and the readout circuits 20B1 and 20B4 are arranged on the lower side. Meanwhile, in the divided regions 72 and 73, the readout circuits 20A2 and 20A3 are arranged on the lower side, and the readout circuits 20B2 and 20B3 are arranged on the upper side.

In such a layout, similarly to the fourth variation, since the symmetry of the memory is secured in each of the H direction and the V direction, the floating diffusion region 27 can be shared in each direction.

1.9.9 Ninth Variation

Figure 36:
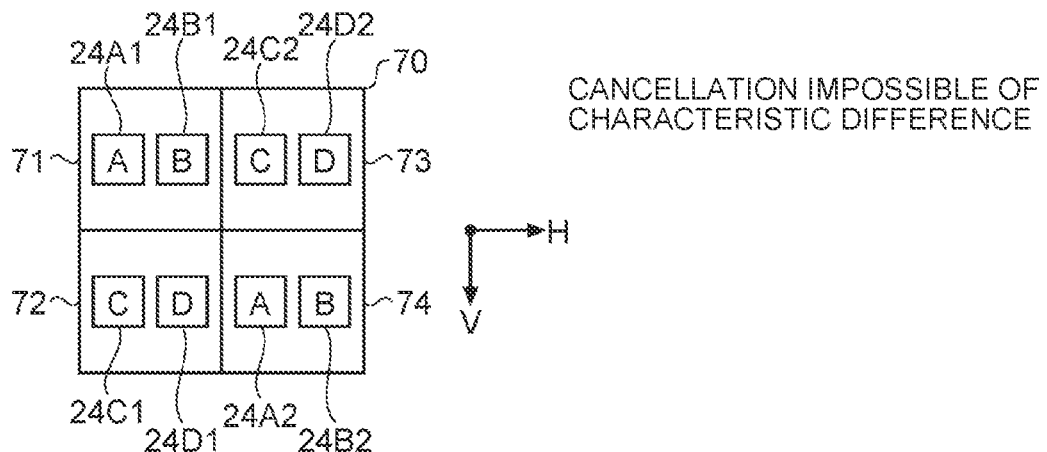
FIG. 36 is a schematic diagram illustrating a planar layout example of a memory according to a ninth variation of the first embodiment.

FIG. 36 is a schematic diagram illustrating a planar layout example of a memory according to a ninth variation of the first embodiment. As illustrated in FIG. 36, in the ninth variation, in each divided region 71 to 74, the readout circuits A and C for detecting the light amount $Q_0$ or $Q_{90}$ of the component having the phase angle $\alpha$ of 0 degrees or 90 degrees are arranged on the left side, and the readout circuits B and D for detecting the light amount $Q_{180}$ or $Q_{270}$ of the component having the phase angle $\alpha$ of 180 degrees or 270 degrees are arranged on the right side.

In such a layout, not only the symmetry of the memory in the H direction and the V direction is not secured, but also the symmetry of the memory with respect to the center of the pixel region 70 or a straight line passing through the center as an axis is not secured. Therefore, the characteristic difference of the memory cannot be canceled or the effect thereof is low.

1.9.10 Tenth Variation

Figure 37:
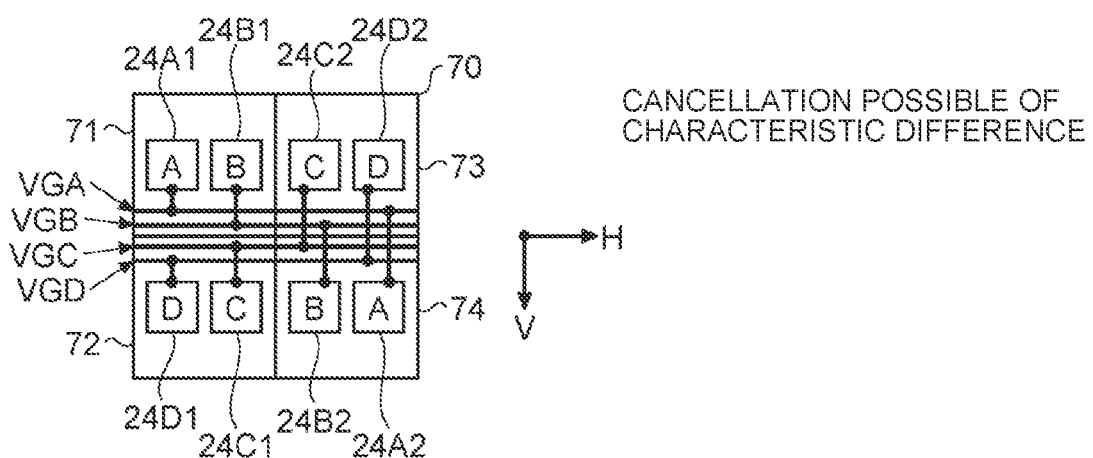
FIG. 37 is a schematic diagram illustrating a planar layout example of a memory according to a tenth variation of the first embodiment.

FIG. 37 is a schematic diagram illustrating a planar layout example of a memory according to a tenth variation of the first embodiment. As illustrated in FIG. 37, in the tenth variation, in the divided regions 71 and 73, the readout circuits A and C are arranged on the left side, and the readout circuits B and D are arranged on the right side. Meanwhile, in the divided regions 72 and 74, the readout circuits A and C are arranged on the right side, and the readout circuits B and D are arranged on the left side.

In such a layout, since the symmetry of the memory in the H direction and the V direction is not secured, the floating diffusion region 27 cannot be shared in each of the H direction and the V direction, but since the symmetry of the memory with respect to the center of the pixel region 70 or the straight line passing through the center as an axis is secured, it is possible to cancel the characteristic difference of the memory.

1.9.11 Eleventh Variation

Figure 38:
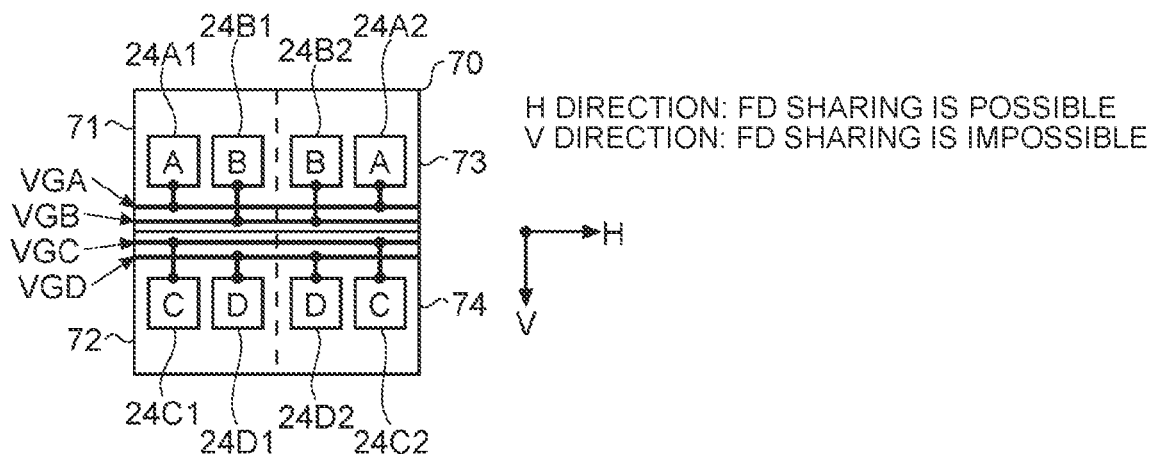
FIG. 38 is a schematic diagram illustrating a planar layout example of a memory according to an eleventh variation of the first embodiment.

FIG. 38 is a schematic diagram illustrating a planar layout example of a memory according to an eleventh variation of the first embodiment. As illustrated in FIG. 38, in the eleventh variation, in the divided regions 71 and 72, the readout circuits A and C are arranged on the left side, and the readout circuits B and D are arranged on the right side. Meanwhile, in the divided regions 73 and 74, the readout circuits A and C are arranged on the right side, and the readout circuits B and D are arranged on the left side.

In such a layout, since the symmetry of the memory in the H direction is secured, the floating diffusion region 27 can be shared, but since the symmetry of the memory is not secured in the V direction, the floating diffusion region 27 cannot be shared.

Note that since symmetry of the memory with respect to the straight line passing through the center of the pixel region 70 as an axis is secured, it is possible to cancel the characteristic difference of the memory.

1.9.12 Twelfth Variation

Figure 39:
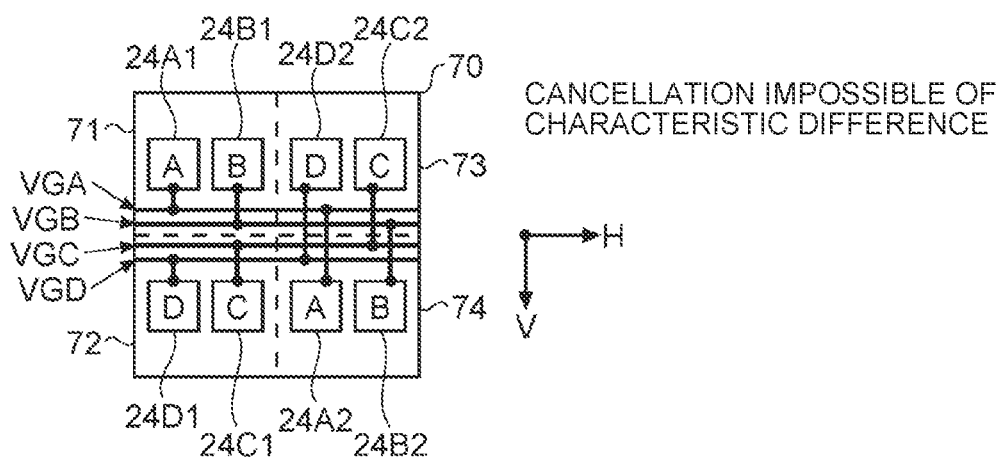
FIG. 39 is a schematic diagram illustrating a planar layout example of a memory according to a twelfth variation of the first embodiment.

FIG. 39 is a schematic diagram illustrating a planar layout example of a memory according to a twelfth variation of the first embodiment. As illustrated in FIG. 39, in the twelfth variation, in the divided regions 71 and 74, the readout circuit A is arranged on the left side, and the readout circuit B is arranged on the right side. Meanwhile, in the divided regions 72 and 73, the readout circuit C is arranged on the right side, and the readout circuit D is arranged on the left side.

In such a layout, not only the symmetry of the memory in the H direction and the V direction is not secured, but also the symmetry of the memory with respect to the center of the pixel region 70 or a straight line passing through the center as an axis is not secured. Therefore, the characteristic difference of the memory cannot be canceled or the effect thereof is low.

1.9.13 Thirteenth Variation

Figure 40:
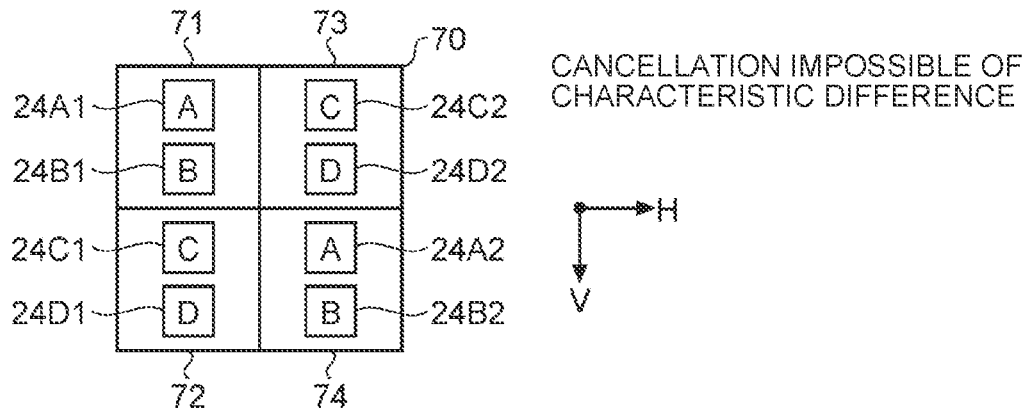
FIG. 40 is a schematic diagram illustrating a planar layout example of a memory according to a thirteenth variation of the first embodiment.

FIG. 40 is a schematic diagram illustrating a planar layout example of a memory according to a thirteenth variation of the first embodiment. As illustrated in FIG. 40, in the thirteenth variation, in each divided region 71 to 74, the readout circuits A and C are arranged on the upper side, and the readout circuits B and D are arranged on the lower side.

In such a layout, similarly to the ninth variation, not only the symmetry of the memory in the H direction and the V direction is not secured, but also the symmetry of the memory with respect to the center of the pixel region 70 or the straight line passing through the center as an axis is not secured. Therefore, the characteristic difference of the memory cannot be canceled or the effect thereof is low.

1.9.14 Fourteenth Variation

Figure 41:
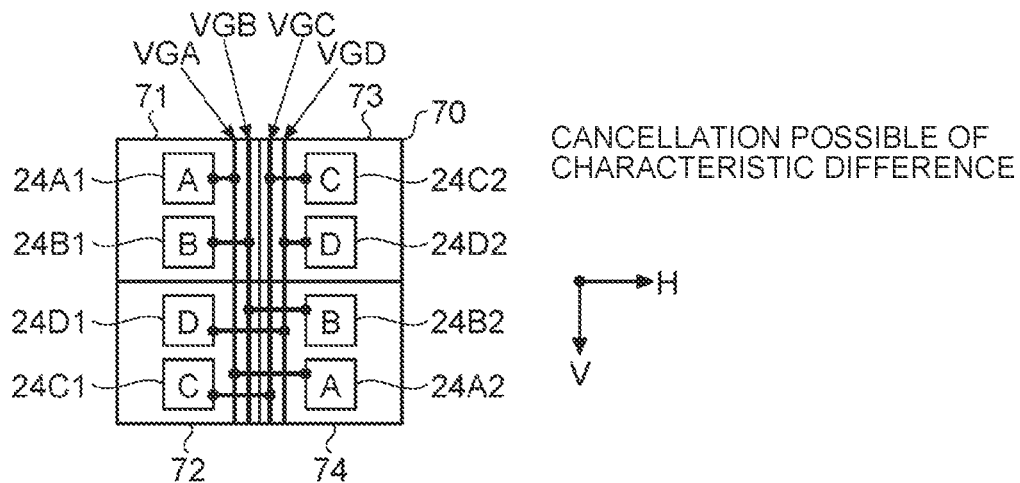
FIG. 41 is a schematic diagram illustrating a planar layout example of a memory according to a fourteenth variation of the first embodiment.

FIG. 41 is a schematic diagram illustrating a planar layout example of a memory according to a fourteenth variation of the first embodiment. As illustrated in FIG. 41, in the fourteenth variation, in the divided regions 71 and 73, the readout circuits A and C are arranged on the upper side, and the readout circuits B and D are arranged on the lower side. Meanwhile, in the divided regions 72 and 74, the readout circuits A and C are arranged on the lower side, and the readout circuits B and D are arranged on the upper side.

In such a layout, similarly to the tenth variation, since the symmetry of the memory in the H direction and the V direction is not secured, the floating diffusion region 27 cannot be shared in each of the H direction and the V direction, but since the symmetry of the memory with respect to the center of the pixel region 70 or the straight line passing through the center as an axis is secured, it is possible to cancel the characteristic difference of the memory.

1.9.15 Fifteenth Variation

Figure 42:
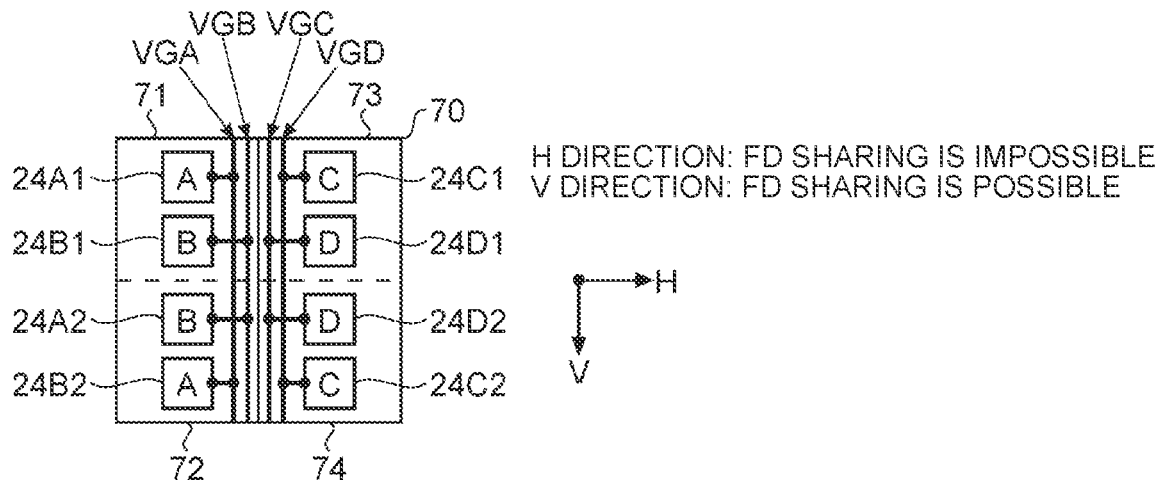
FIG. 42 is a schematic diagram illustrating a planar layout example of a memory according to a fifteenth variation of the first embodiment.

FIG. 42 is a schematic diagram illustrating a planar layout example of a memory according to a fifteenth variation of the first embodiment. As illustrated in FIG. 42, in the fifteenth variation, in the divided regions 71 and 73, the readout circuits A and C are arranged on the upper side, and the readout circuits B and D are arranged on the lower side. Meanwhile, in the divided regions 72 and 74, the readout circuits A and C are arranged on the lower side, and the readout circuits B and D are arranged on the upper side.

In such a layout, contrary to the eleventh variation, since the symmetry of the memory in the H direction is not secured, the floating diffusion region 27 cannot be shared, but since the symmetry of the memory is secured in the V direction, the floating diffusion region 27 can be shared.

Note that since symmetry of the memory with respect to the straight line passing through the center of the pixel region 70 as an axis is secured, it is possible to cancel the characteristic difference of the memory.

1.9.16 Sixteenth Variation

Figure 43:
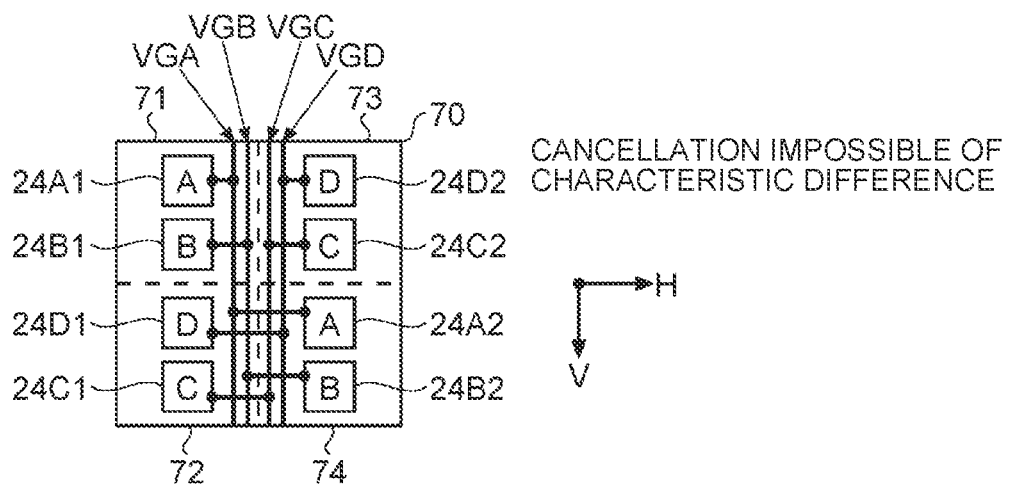
FIG. 43 is a schematic diagram illustrating a planar layout example of a memory according to a sixteenth variation of the first embodiment.

FIG. 43 is a schematic diagram illustrating a planar layout example of a memory according to a sixteenth variation of the first embodiment. As illustrated in FIG. 43, in the sixteenth variation, in the divided regions 71 and 74, the readout circuit A is arranged on the upper side, and the readout circuit B is arranged on the lower side. Meanwhile, in the divided regions 72 and 73, the readout circuit C is arranged on the lower side, and the readout circuit D is arranged on the upper side.

In such a layout, similarly to the twelfth variation, not only the symmetry of the memory in the H direction and the V direction is not secured, but also the symmetry of the memory with respect to the center of the pixel region 70 or the straight line passing through the center as an axis is not secured. Therefore, the characteristic difference of the memory cannot be canceled or the effect thereof is low.

1.10 Cancellation of Characteristic Difference

Next, cancellation of the characteristic difference according to the present embodiment will be described with an example.

Note that, in the present description, the first variation illustrated in FIG. 28 or the fifth variation illustrated in FIG. 32 (FD sharing in the H direction and the V direction is impossible) is cited as a comparative example, and the fourth variation illustrated in FIG. 31 or the eighth variation illustrated in FIG. 35 (FD sharing in the H direction and the V direction is possible) is cited as an example for describing the effect of the characteristic difference cancellation according to the present embodiment.

Furthermore, in the present description, the comparative example will be described by applying the unit pixel 920 described with reference to FIGS. 3 and 4, and the present embodiment will be described by applying the unit pixel 20-1 according to the first configuration example described with reference to FIGS. 7 and 8.

Figure 44:
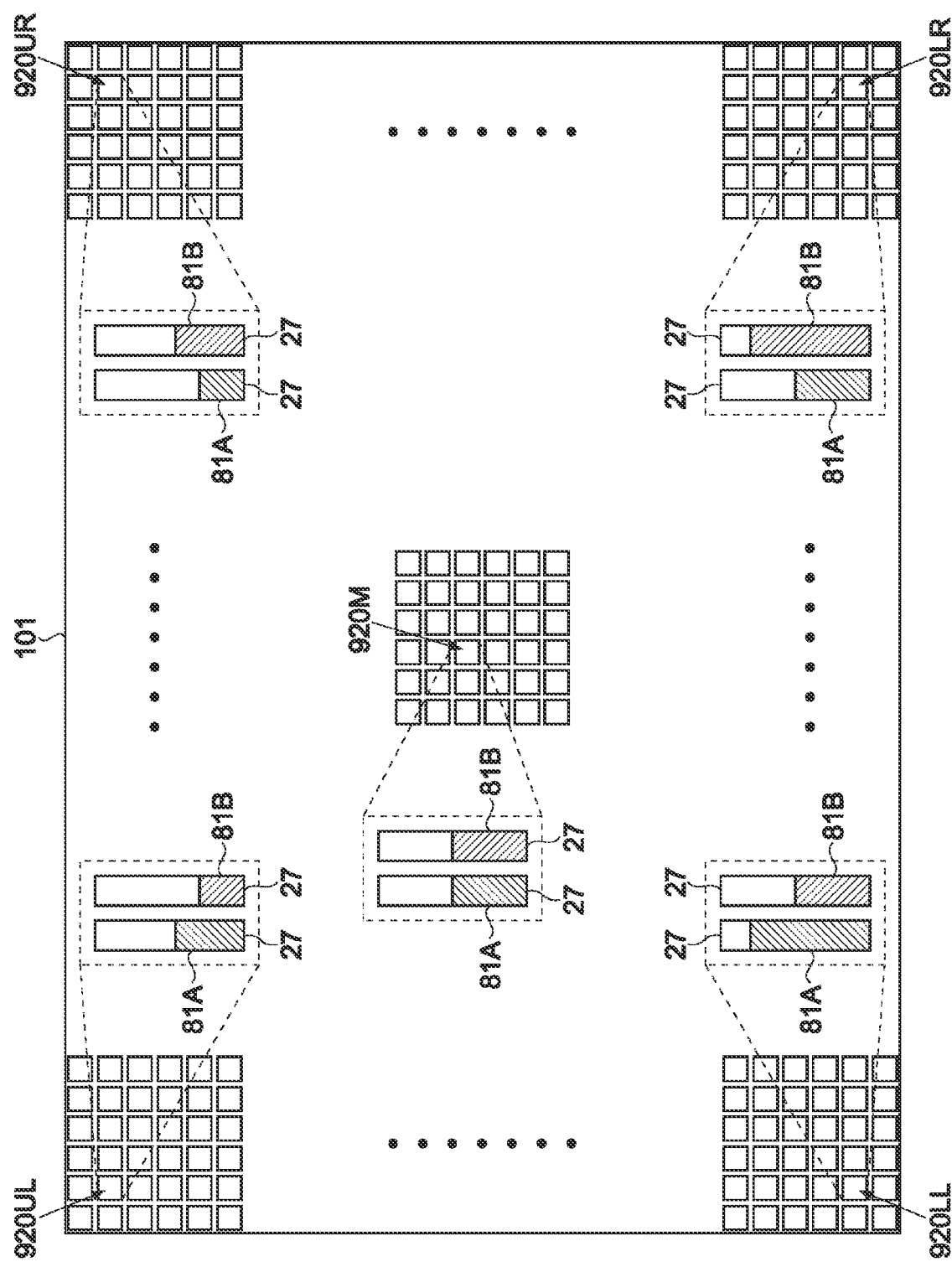
FIG. 44 is a diagram for describing a difference in amounts of accumulated charge between memories generated in a comparative example.
Figure 45:
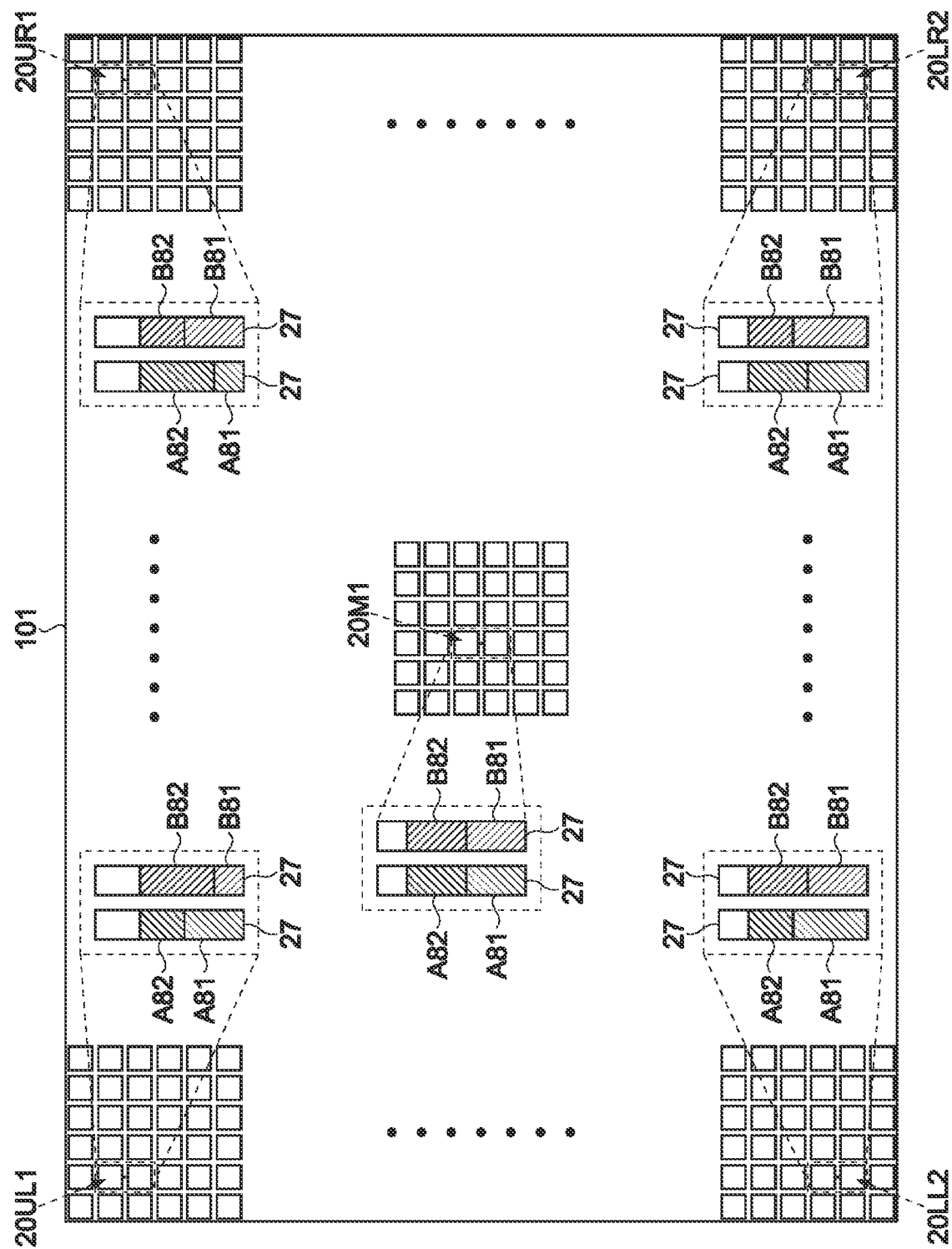
FIG. 45 is a diagram for describing an effect of canceling a characteristic difference for each memory according to the first embodiment.

FIG. 44 is a diagram for describing the difference in the amounts of accumulated charges for each memory generated in the comparative example. FIG. 45 is a diagram for describing an effect of canceling the characteristic difference for each memory according to the first embodiment.

As illustrated in FIG. 44, in the comparative example, the floating diffusion region 27 cannot be shared in each of the H direction and the V direction (see FIG. 28 or FIG. 32). Therefore, the charges 81A accumulated in each floating diffusion region 27A and the charges 81B accumulated in the floating diffusion region 27B become the charges transferred from one memory 24A or 24B, respectively, and the effect of canceling the characteristic difference by accumulating the charges read from the plurality of memories in which the symmetry is ensured in the common floating diffusion region 27 cannot be obtained.

This does not appear as a large characteristic difference since the two memories 24A and 24B are arranged symmetrically with respect to the optical center of the on-chip lens 64 in a unit pixel 920M belonging to a region having a low image height, that is, a region near the center of the pixel array part 101.

Meanwhile, in a region where the optical axis of the incident light is greatly inclined and the image height is high, that is, in the unit pixels 920UL, 920UR, 920LL, and 920LR belonging to the peripheral region of the pixel array part 101, the two memories 24A and 24B are arranged greatly eccentrically with respect to the optical center of the on-chip lens 64 by pupil correction, and thus, a large characteristic difference appears.

Therefore, as illustrated in FIG. 45, by adopting a configuration in which charges are transferred from two memories (corresponding to the memories 24A1 and 24A2 or the memories 24B1 and 24B2) in which symmetry is ensured to the shared floating diffusion region 27, it is possible to reduce a difference in the amount of accumulated charges due to the characteristic difference accumulated in the floating diffusion region 27.

For example, in the unit pixel 20UL (two blocks surrounded by a broken line) sharing one floating diffusion region 27 in the upper left region of the pixel array part 101, when the light amount $Q_0$ (or $Q_{90}$) of the component having the phase angle α of 0 degrees (or 90 degrees) is detected, the charges A81 and A82 accumulated in the two memories 24A1 and 24A2 for which the symmetry is secured are transferred to the shared floating diffusion region 27, and when the light amount $Q_{180}$ (or $Q_{270}$) of the component having the phase angle α of 180 degrees (or 270 degrees) is detected, the charges B81 and B82 accumulated in the two memories 24B1 and 24B2 for which the symmetry is secured are transferred to the shared floating diffusion region 27.

Similarly, in the unit pixel 20LL sharing one floating diffusion region 27 in the lower left region of the pixel array part 101, the unit pixel 20UR sharing one floating diffusion region 27 in the upper right region of the pixel array part 101, the unit pixel 20LR sharing one floating diffusion region 27 in the lower right region of the pixel array part 101, and the unit pixel 20M sharing one floating diffusion region 27 in the central region of the pixel array part 101, the charges A81 and A82 or the charges B81 and B82 accumulated in the two memories 24A1 and 24A2 or 24B1 and 24B2 for which the symmetry is secured are transferred to the shared floating diffusion region 27.

As a result, the difference in the charge accumulation amount due to the characteristic difference of the memory is canceled in the floating diffusion region 27, and thus, it is possible to generate a subframe with higher accuracy. As a result, it is possible to acquire a depth frame with higher accuracy.

1.11 Example of Reading Operation of Distance Measurement Image (Depth Frame)

Next, a readout operation of the distance measurement image (depth frame) according to the present embodiment will be described with an example.

Figure 46:
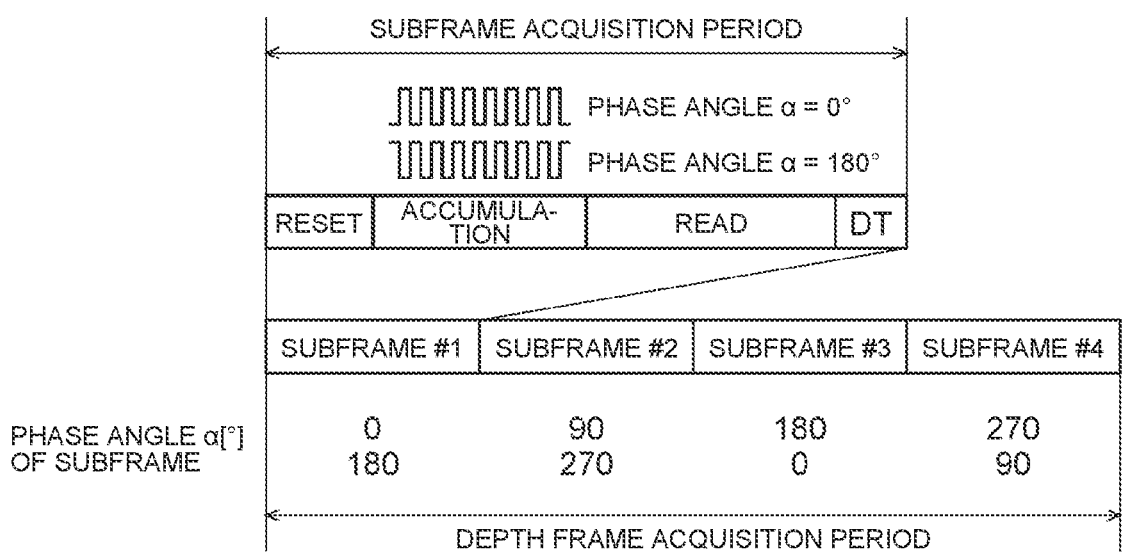
FIG. 46 is a timing chart illustrating the read operation of the depth frame in a case of using the unit pixel not including an FD sharing structure according to the first embodiment.

FIG. 46 is a timing chart illustrating the read operation of the depth frame in a case of using the unit pixel not including the FD sharing structure according to the first embodiment. Note that the unit pixel not including the FD sharing structure according to the first embodiment may be, for example, the unit pixel 920 described above with reference to FIG. 3.

Figure 47:
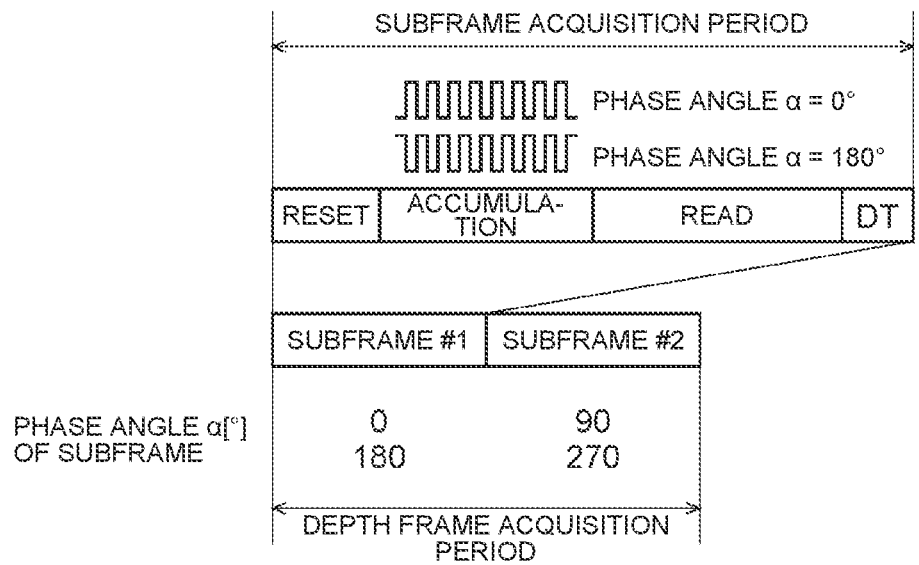
FIG. 47 is a timing chart illustrating a depth frame reading operation in the case of using a unit pixel having the FD sharing structure according to the first embodiment, for example, the unit pixels according to the first to third configuration examples described above.

Meanwhile, FIG. 47 is a timing chart illustrating a read operation of the depth frame in a case of using the unit pixel having the FD sharing structure according to the first embodiment, for example, the unit pixels according to the first to third configuration examples described above. Furthermore, FIG. 48 is a timing chart illustrating a reading operation of the depth frame in a case of using the unit pixel having the FD sharing structure according to the first embodiment, for example, the unit pixel according to the fourth configuration example described above.

Figure 48:
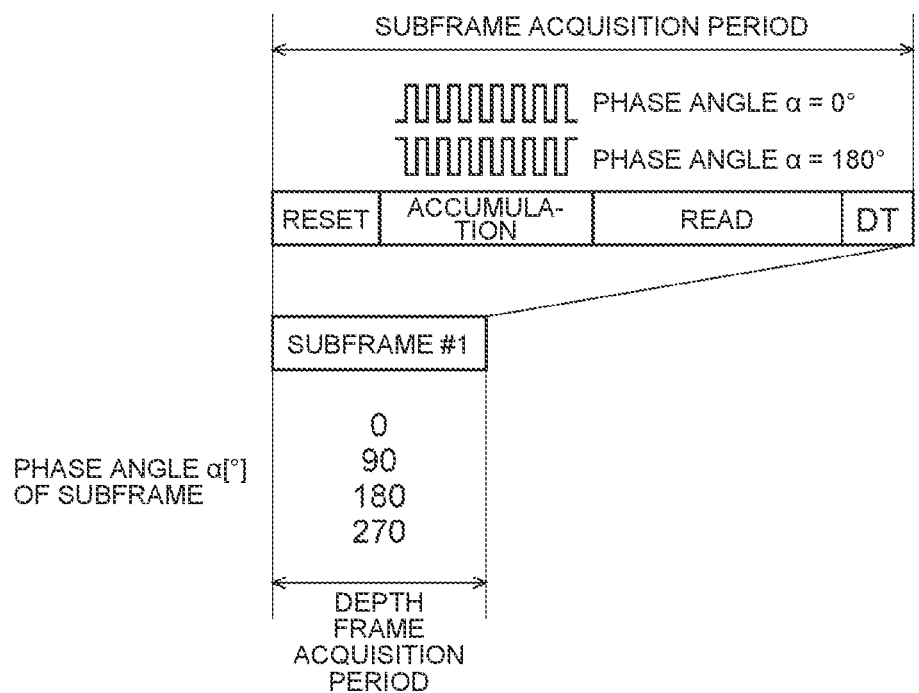
FIG. 48 is a timing chart illustrating the depth frame reading operation in a case of using a unit pixel having an FD sharing structure according to the first embodiment, for example, the unit pixel according to the above-described fourth configuration example.

As illustrated in FIGS. 46 to 48, the read operation of reading one subframe includes resetting of each unit pixel 20, accumulation of charges generated by photoelectric conversion in each unit pixel 20 in the memories 24A and 24B, reading of the charges accumulated in the memories 24A and 24B, and a dead period (dead time) when the phase is switched. Note that the phase may be a phase of a period of a pulse that distributes the charge generated in the photodiode 21 to the memory 24A and the memory 24B based on the pulse period of the irradiation light L1, and the phase switching may be an operation of switching the phase (corresponding to the phase angle α).

Furthermore, as illustrated in FIG. 46, in a case where the unit pixel 20 does not have the FD sharing structure, as described above, for the purpose of canceling the characteristic difference, it is necessary to acquire four subframes of a subframe #1 at 0 degrees/180 degrees, a subframe #2 at 90 degrees/270 degrees, a subframe #3 at 180 degrees/0 degrees, and a subframe #4 at 270 degrees/90 degrees. Therefore, the time required to acquire one depth frame is about four times the time required to acquire four subframes.

Meanwhile, as illustrated in FIG. 47, in the first to third structure examples in which the unit pixel 20 has the FD sharing structure, since the difference in the amounts of accumulated charges based on the characteristic difference is reduced in the floating diffusion region 27, it is not necessary to acquire the anti-phase subframes #3 and #4 as illustrated in FIG. 47. Therefore, the time required to acquire one depth frame is twice the time required to acquire two subframes, that is, half the time illustrated in FIG. 46.

Furthermore, as illustrated in FIG. 48, in the fourth structure example, the unit pixel 20 has the FD sharing structure, and it is possible to read the light amount $Q_0$ of the component having the phase angle α of 0 degrees, the light amount $Q_{90}$ of the component having the phase angle α of 90 degrees, the light amount $Q_{180}$ of the component having the phase angle α of 180 degrees, and the light amount $Q_{270}$ of the component having the phase angle α of 270 degrees in one read operation. Therefore, the time required to acquire one depth frame is equivalent to the time required to acquire one subframe, that is, ¼ of the time exemplified in FIG. 46.

As described above, according to the present embodiment, it is possible to acquire one high-quality distance measurement image (depth frame) in a short time.

1.12 Drive Pulse Example

Next, a drive pulse when the charge generated in the photodiode 21 is distributed to each memory will be described with some examples. In the following description, it is assumed that the distance from the light emitting unit 13 and the light receiving unit 14 to the object 90 is 1 meter (m), and the distance (2 m) from the light emitting unit 13 to the light receiving unit 14 via the object 90 corresponds to one pulse period of the irradiation light L1 emitted from the light emitting unit 13. Furthermore, in the drawings used in the following description, hatched regions superimposed on drive pulses VGA to VGD indicate examples of the amount of charge accumulated in the memory to which the drive pulses are applied.

1.12.1 First Drive Pulse Example

Figure 49:
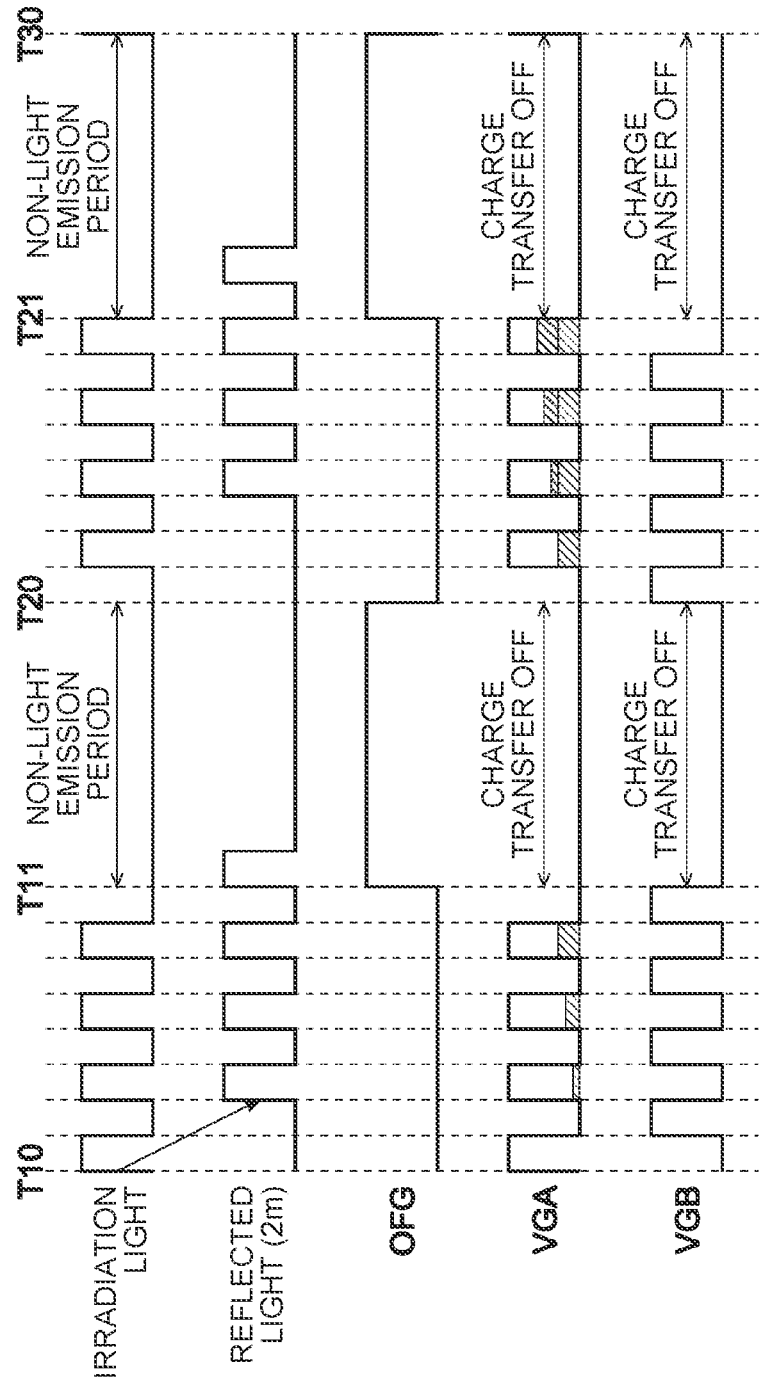
FIG. 49 is a waveform diagram for describing a first drive pulse example of the first embodiment.
Figure 50:
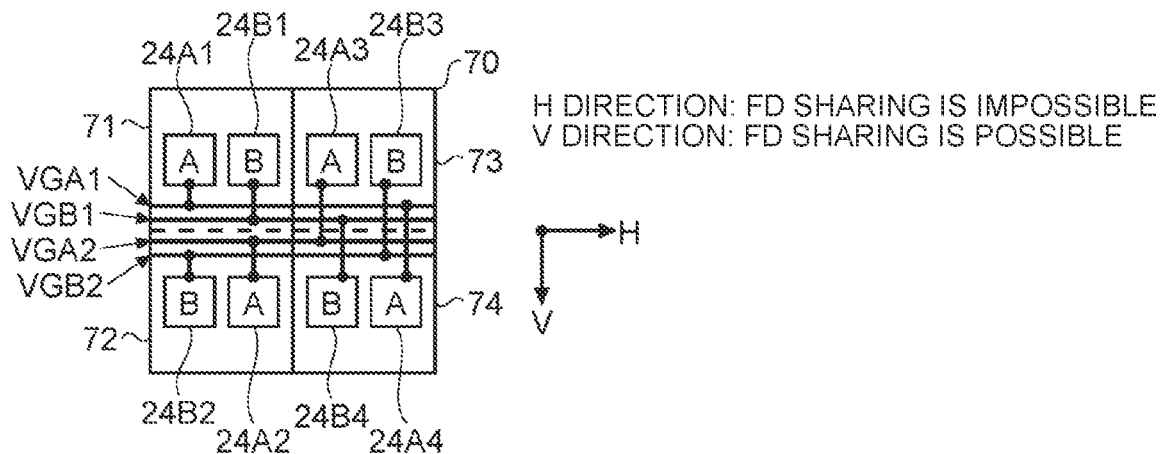
FIG. 50 is a schematic diagram illustrating an example of a connection relationship according to a modification example of the first embodiment.
Figure 51:
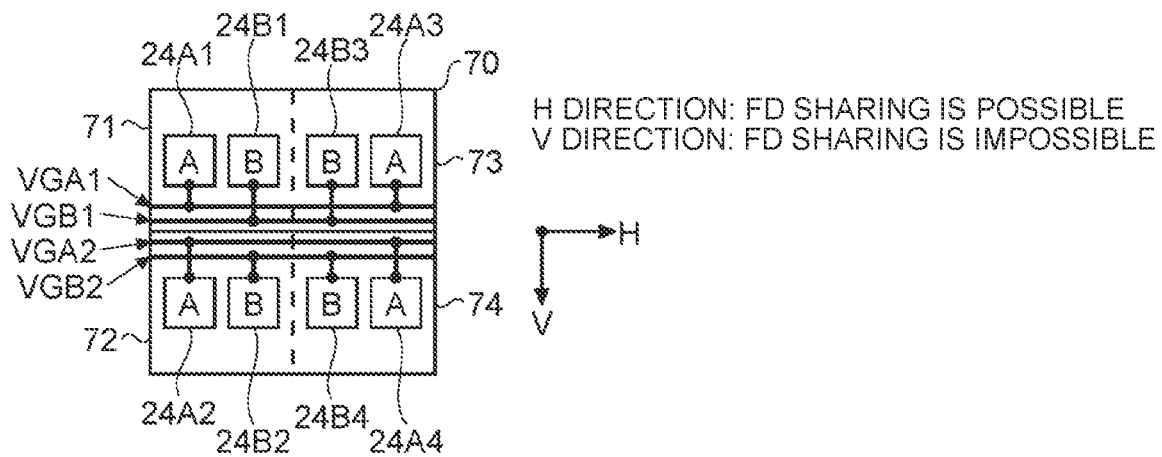
FIG. 51 is a schematic diagram illustrating another example of the connection relationship according to the modification example of the first embodiment.
Figure 52:
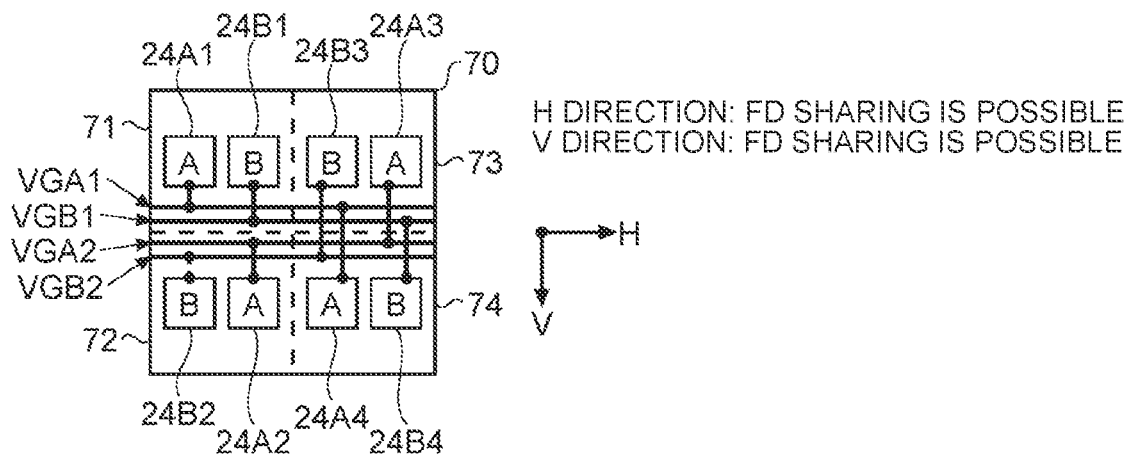
FIG. 52 is a schematic diagram illustrating still another example of the connection relationship according to the modification example of the first embodiment.
Figure 53:
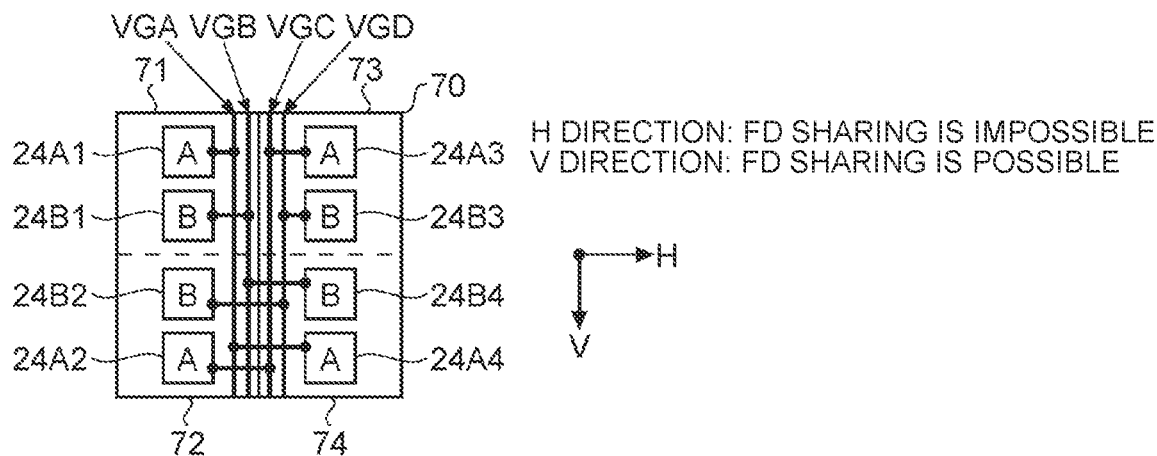
FIG. 53 is a schematic diagram illustrating still another example of the connection relationship according to the modification example of the first embodiment.
Figure 54:
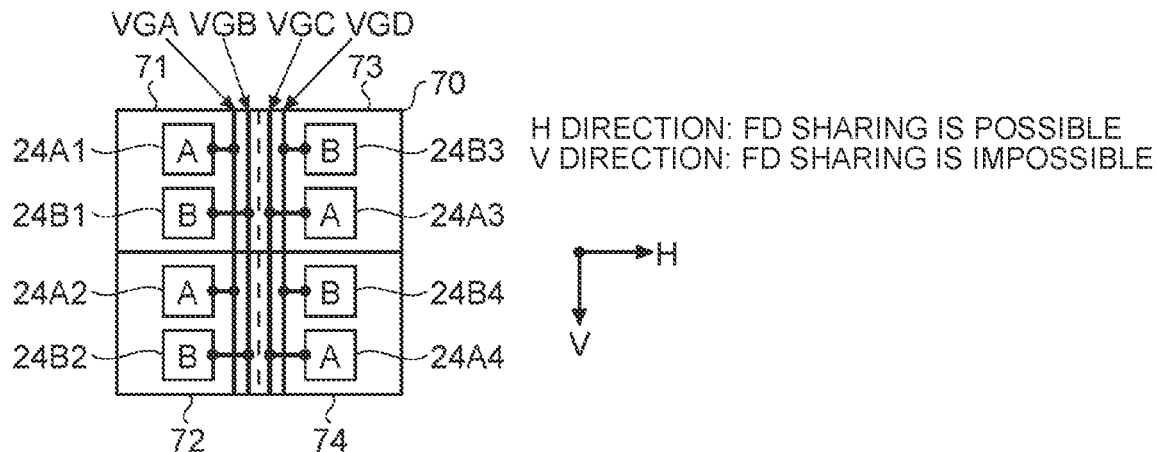
FIG. 54 is a schematic diagram illustrating still another example of the connection relationship according to the modification example of the first embodiment.
Figure 55:
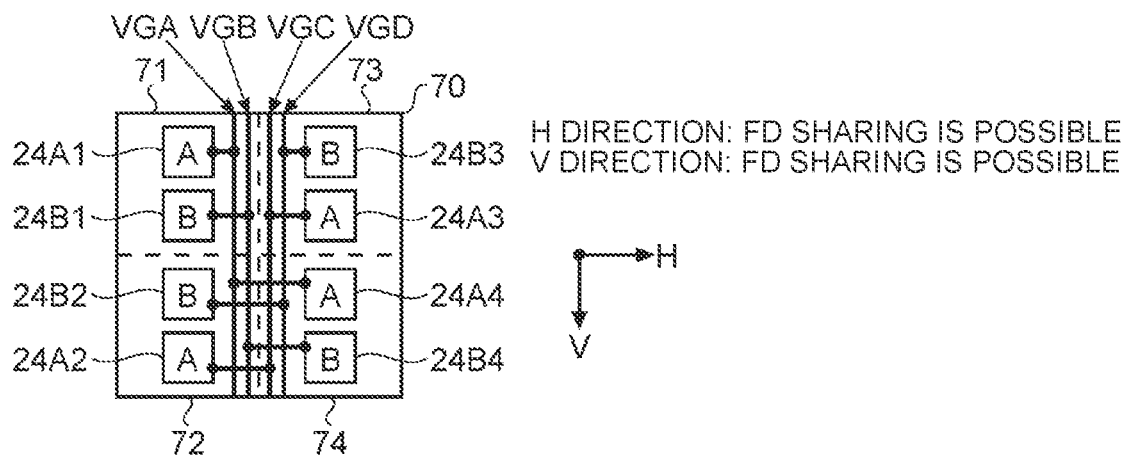
FIG. 55 is a schematic diagram illustrating still another example of the connection relationship according to the modification example of the first embodiment.

First, a drive pulse example of the unit pixel 20 exemplified as the second to fourth and sixth to eighth variations will be described as a first drive pulse example. FIG. 49 is a waveform diagram for describing the first drive pulse example of the first embodiment.

In the second to fourth and sixth to eighth variations illustrated in FIGS. 29 to 31 and 33 to 35, the memories 24A1 to 24A4 in the readout circuits 20A1 to 20A4 are connected to a common drive line (a reference sign of this drive line is also VGA) to which the drive pulse VGA is applied, and the memories 24B1 to 24B4 in the readout circuits 20B1 to 20B4 are connected to a common drive line (a reference sign of this drive line is also VGB) to which the drive pulse VGB is applied.

As illustrated in FIG. 49, the drive pulse VGA for acquiring the light amount $Q_0$ of the component having the phase angle α of 0 degrees with respect to the irradiation light L1 may be a pulse having the same frequency and the same phase as the irradiation light L1 emitted from the light emitting unit 13, that is, the drive pulse for driving the light emitting unit 13.

Meanwhile, the drive pulse VGB for acquiring the light amount $Q_{180}$ of the component having the phase angle α of 180 degrees with respect to the irradiation light L1 may be the irradiation light L1 emitted from the light emitting unit 13, that is, a pulse having the same frequency as the drive pulse for driving the light emitting unit 13 and having a phase shifted by 180 degrees.

As illustrated in FIG. 49, in the present embodiment, when one subframe is acquired, an operation (for example, timings T10 to T11 and timings T20 to T21) of distributing the charge generated in the photodiode 21 to the memories 24A1 to 24A4 and the memories 24B1 to 24B4 a plurality of times (four times in FIG. 49) is executed a plurality of times (two times in FIG. 49). In the present description, a period (for example, timings T10 to T11 and timings T20 to T20) in which the charge generated in the photodiode 21 is distributed to the memories 24A1 to 24A4 and the memories 24B1 to 24B4 a plurality of times (four times in FIG. 49) is referred to as a charge transfer period.

In the example illustrated in FIG. 49, first, after the charge transfer period (T10 to T11) in which the charge generated in the photodiode 21 is distributed to the memories 24A1 to 24A4 and the memories 24B1 to 24B4, a non-light emission period (timings T11 to T20) of the irradiation light L1 is passed. Then, next, after the charge transfer period (timings T20 to T21) in which the charge generated in the photodiode 21 is distributed to the memories 24A1 to 24A4 and the memories 24B1 to 24B4 in a state where the phases of the irradiation light L1 and the drive pulses VGA and VGB are inverted, a non-light emission period (timings T21 to T30) of the irradiation light L1 is passed.

By executing the charge transfer to each memory in such a flow, the charge for each component of the phase angle α (=0 degrees and 180 degrees, or 90 degrees and 270 degrees) with respect to the irradiation light L1 can be accumulated in each memory. Note that a point that the phases of the irradiation light L1 and the drive pulses VGA and VGB are inverted in different charge transfer periods will be described in "encoding of accumulation period" described later.

Furthermore, as described above, in the present embodiment, an unissued period (timings T11 to T20 and timings T21 to T30) in which no subframe is acquired is provided between the periods (for example, the period between timings T10 to T11 and T20 to T21) in which subframes are acquired.

In the unissued period (timings T11 to T20 and timings T21 to T30), the drive pulse OFG applied to the gate of the OFG transistor 22 (221 to 222 or 221 to 224) is set to the high level. As a result, the charge generated in the photodiode 21 in the unissued period is discharged via the OFG transistor 22.

1.12.1.1 Modification Example

Note that the drive pulse according to the first drive pulse example illustrated in FIG. 49 is not limited to the connection relationships illustrated in FIGS. 29 to 31 and 33 to 35 as the second to fourth and sixth to eighth variations, and can be applied to other connection relationships as illustrated in FIGS. 50 to 55.

In the examples illustrated in FIGS. 50 to 55, two drive lines VGA1 and VGA2 are provided as drive lines to which the drive pulse VGA is applied, and two drive lines VGB1 and VGB2 are provided as drive lines to which the drive pulse VGB is applied.

Each of the memories 24A1 to 24A4 and 24B1 to 24B4 is connected to one of the drive lines VGA1, VGA2, VGB1, and VGB2 such that the memories sharing the floating diffusion region 27 are connected to different drive lines. However, in the fourth and eighth variations (see FIGS. 49 and 55) in which one floating diffusion region 27 is shared by all the eight memories 24A1 to 24A4 and 24B1 to 24B4, two memories are connected to each drive line without being bound by this condition.

Even in such a connection relationship, it is possible to acquire the subframe by applying the first drive pulse example as described with reference to FIG. 49.

1.12.2 Second Drive Pulse Example

Figure 56:
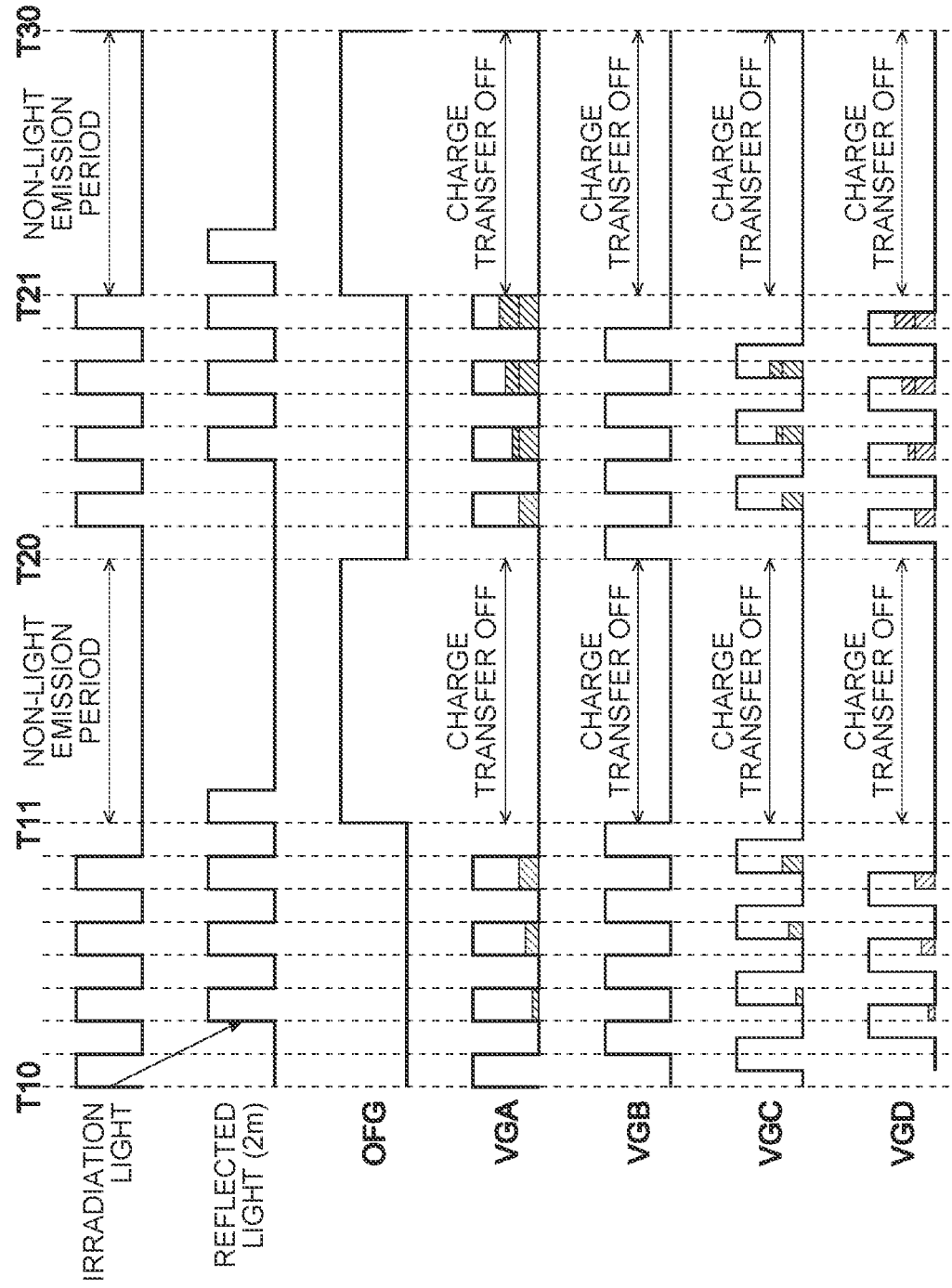
FIG. 56 is a waveform diagram for describing a second drive pulse example of the first embodiment.

Next, a drive pulse example of the unit pixel 20 exemplified as the tenth to twelfth and fourteenth to sixteenth variations will be described as a second drive pulse example. FIG. 56 is a waveform diagram for describing the second drive pulse example of the first embodiment.

In the tenth to twelfth and fourteenth to sixteenth variations illustrated in FIGS. 37 to 39 and 41 to 43, the memories 24A1 and 24A2 are connected to the common drive line VGA to which the drive pulse VGA is applied, the memories 24B1 and 24B2 are connected to the common drive line VGB to which the drive pulse VGB is applied, the memories 24C1 and 24C2 are connected to the common drive line VGC to which the drive pulse VGC is applied, and the memories 24D1 and 24D2 are connected to the common drive line VGD to which the drive pulse VGD is applied.

As illustrated in FIG. 56, the drive pulses VGA and VGB may be similar to the drive pulses VGA and VGB in the first drive pulse example.

The drive pulse VGC for acquiring the light amount $Q_{90}$ of the component having the phase angle α of 90 degrees with respect to the irradiation light L1 may be a pulse having the same frequency as the irradiation light L1 emitted from the light emitting unit 13, that is, the drive pulse for driving the light emitting unit 13 and having a phase shifted by 90 degrees.

In addition, the drive pulse VGD for acquiring the light amount $Q_{270}$ of the component having the phase angle α of 270 degrees with respect to the irradiation light L1 may be the irradiation light L1 emitted from the light emitting unit 13, that is, a pulse having the same frequency as the drive pulse for driving the light emitting unit 13 and having a phase shifted by 270 degrees.

As illustrated in FIG. 56, the charge transfer to each memory using each of the drive pulses VGA to VGD may be an operation of alternately repeating the charge distribution (timings T10 to T11 and T20 to T21) divided a plurality of times and the charge discharge (timings T11 to T20 and T21 to T30), similarly to the charge transfer described with reference to FIG. 49 in the first drive pulse example.

By executing the charge transfer to each memory in such a flow, the charge for each component of the phase angle α (=0 degrees, 90 degrees, 180 degrees, 270 degrees) with respect to the irradiation light L1 can be accumulated in each memory.

1.13 Encoding of Accumulation Period

Next, encoding of the accumulation period will be described in detail with reference to the drawings.

The ToF method is a method of measuring a distance to an object by receiving reflected light of irradiation light emitted from the light emitting unit included in the ToF method. Therefore, when light (hereinafter, referred to as interference light) other than the reflected light is incident on the light receiving unit, the light appears as noise, which hinders accurate distance measurement.

1.13.1 Noise Due to Interference

Here, noise generated by interference light will be described with some examples. In the following description, similarly to the description of the "drive pulse example", it is assumed that the distance from the light emitting unit 13 and the light receiving unit 14 to the object 90 is 1 meter (m), and the distance (2 m) from the light emitting unit 13 to the light receiving unit 14 via the object 90 corresponds to one pulse period of the irradiation light L1 emitted from the light emitting unit 13. Furthermore, in the drawings used in the following description, hatched regions superimposed on the drive pulses VGA and VGB indicate examples of the amount of charge accumulated in the memory to which the drive pulses are applied. Furthermore, in the present description, noise generated by interference will be described using the unit pixel 20 exemplified as the second to fourth and sixth to eighth variations as an example.

1.13.1.1 Interference Due to Background Light

As one of the interferences received by the ToF sensor 1, there is interference caused by background light (also referred to as disturbance light) such as sunlight or illumination light being incident on the light receiving unit 14.

Figure 57:
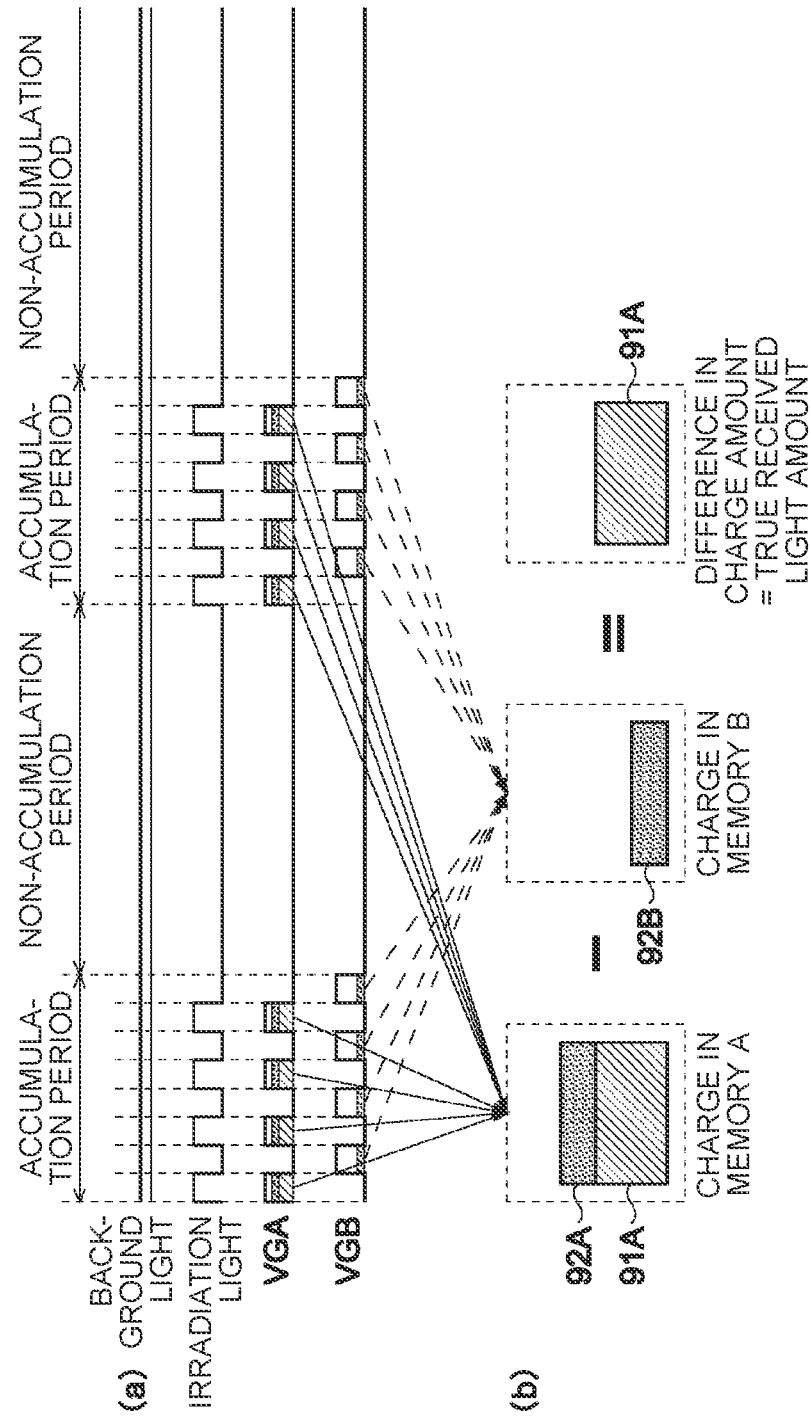
FIG. 57 is a diagram for describing noise generated by background light that is interference light.

FIG. 57 is a diagram for describing noise generated by background light that is interference light.

As illustrated in (a) of FIG. 57, when considered in a span in which one depth frame is acquired, the background light can be usually regarded as light (That is, DC component light) having a constant intensity. In this case, as illustrated in (b) of FIG. 57, the charges accumulated in the memories 24A1 to 24A4 include the charge (hereinafter, referred to as the charge of the background light) 92A generated by photoelectrically converting the background light in addition to the charge (hereinafter, referred to as the charge of the reflected light L2) 91A generated by photoelectrically converting the reflected light L2. Meanwhile, only the charge 92B of the background light is accumulated in the memories 24B1 to 24B4 in which the component of the reflected light L2 is not accumulated.

Here, as described above, since the background light is light of a DC component, the charge 92A in the memories 24A1 to 24A4 and the charge 92B in the memories 24B1 to 24B4 have the same amount of charge. Therefore, as illustrated in (b) of FIG. 57, by subtracting the amount of charge of the charge 92B in the memories 24B1 to 24B4 from the total amount of charge (the total amount of the charge 91A and the charge 92A) in the memories 24A1 to 24A4, it is possible to acquire the charge amount of the charge 91A of only the reflected light L2, that is, to cancel the noise due to the interference light (background light).

1.13.1.2 Interference from Another ToF Sensor

Another example of the interference received by the ToF sensor 1 is interference (this is referred to as "interference from another Tof sensor") caused by the reflected light of the irradiation light emitted from the light emitting unit of another ToF sensor different from the ToF sensor 1 being incident on the light receiving unit 14 of the ToF sensor 1.

In a case where interference from another ToF sensor is received, whether or not the interference appears as noise depends on whether or not reflected light (interference light) from another ToF sensor is incident on the light receiving unit 14 within a period (hereinafter, referred to as an accumulation period) in which charge transfer to the memory 24A1 to 24A4 or 24B1 to 24B4 is executed. Note that, in the following description, a period during which transfer of charge to the memories 24A1 to 24A4 or 24B1 to 24B4 is not executed is referred to as a non-accumulation period.

Figure 58:
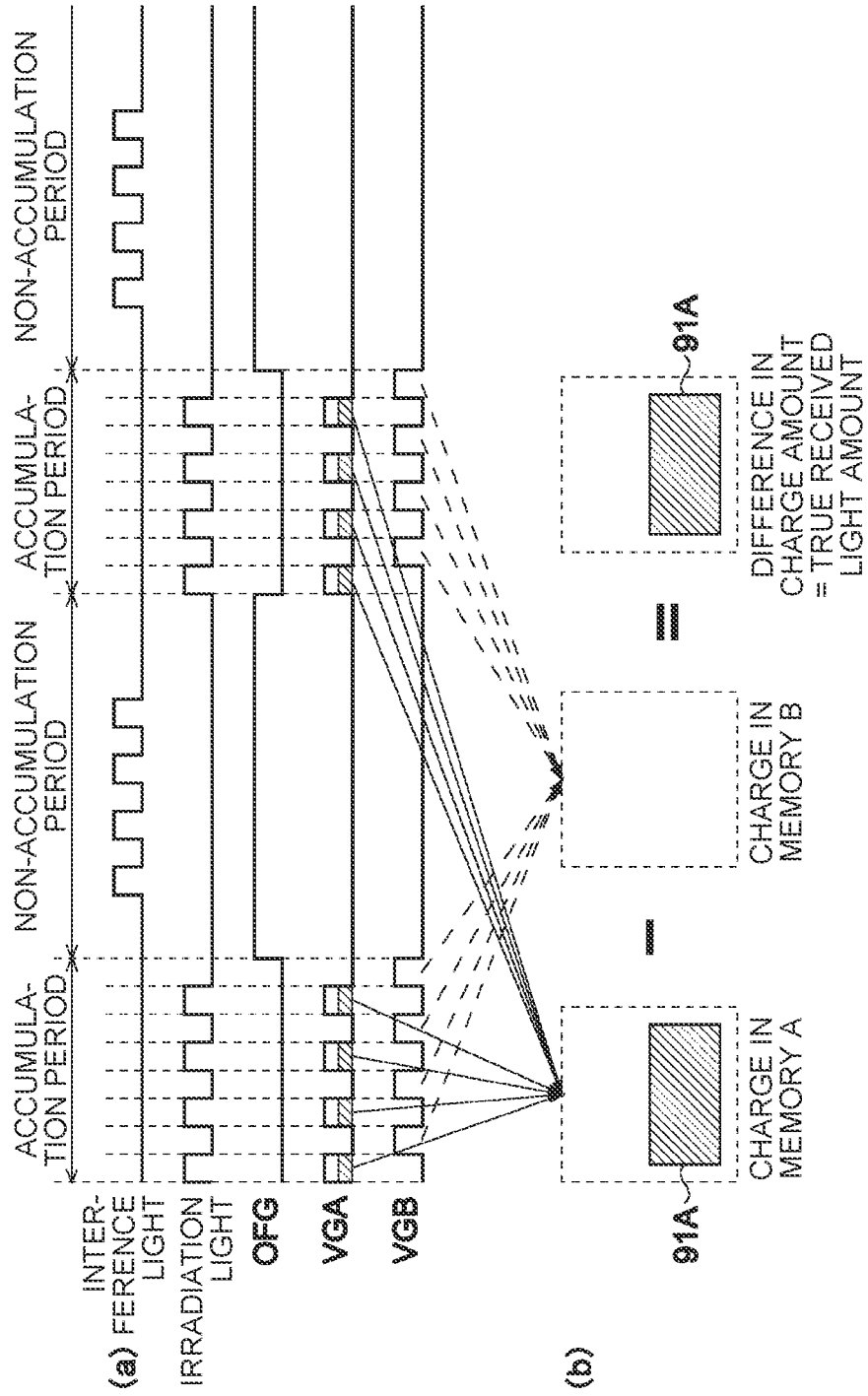
FIG. 58 is a diagram for describing a case where reflected light (interference light) from another ToF sensor is incident during a non-accumulation period.

1.13.1.2.1 When Reflected Light from Another ToF Sensor is Incident During Non-Accumulation Period FIG. 58 is a diagram for describing a case where reflected light (interference light) from another ToF sensor is incident during the non-accumulation period.

As illustrated in (a) of FIG. 58, in a case where the interference light is incident on the light receiving unit 14 during the non-accumulation period, the charge generated in the photodiode 21 by photoelectrically converting the interference light is not transferred to the memories 24A1 to 24A4 and 24B1 to 24B4 and is discharged via the OFG transistors 221 and 222 or 221 to 224.

Therefore, as illustrated in (b) of FIG. 58, only the charge 91A of the reflected light L2 is accumulated in the memories 24A1 to 24A4, and no charge is accumulated in the memories 24B1 to 24B4 in which the component of the reflected light L2 is not accumulated.

Therefore, as illustrated in (b) of FIG. 58, in a case where the charge amount of the charges in the memories 24B1 to 24B4 is subtracted from the charge amount of the charges (charges 91A and 92A) in the memories 24A1 to 24A4, the charge amount is the charge amount of the charge 91A of the reflected light L2. This means that noise is not generated by the interference light.

Figure 59:
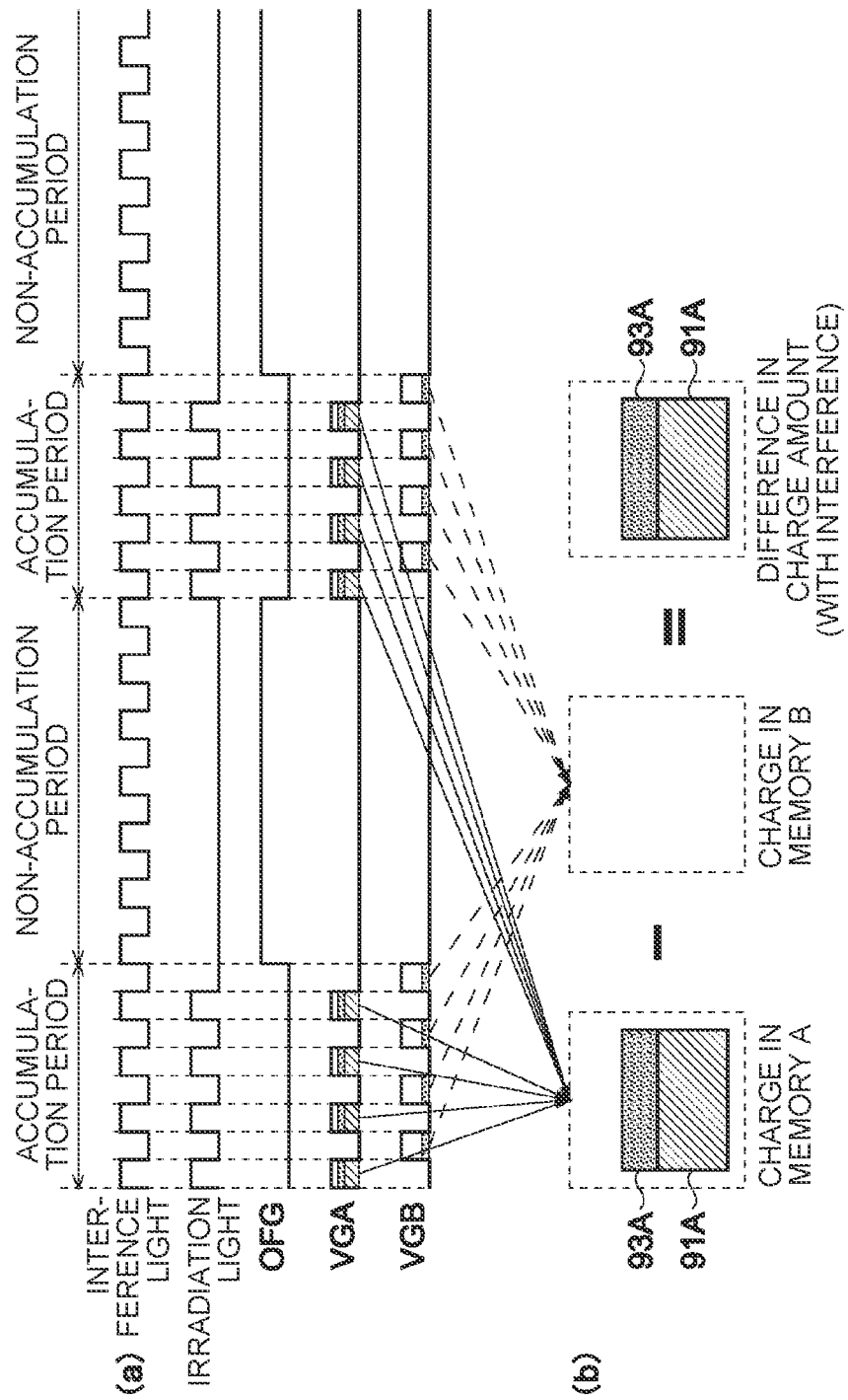
FIG. 59 is a diagram for describing a case where reflected light (interference light) from another ToF sensor is incident during an accumulation period.

1.13.1.2.2 When Reflected Light from Another ToF Sensor is Incident During Accumulation Period FIG. 59 is a diagram for describing a case where reflected light (interference light) from another ToF sensor is incident during the accumulation period. FIG. 59 exemplifies a case where the pulse period of the irradiation light L1 coincides with the pulse period of the interference light, and the phase of the irradiation light L1 coincides with the phase of the interference light.

As illustrated in (a) of FIG. 59, in a case where the interference light is incident on the light receiving unit 14 during the accumulation period, the charge generated in the photodiode 21 by photoelectrically converting both the reflected light L2 and the interference light is transferred to the memories 24A1 to 24A4 and 24B1 to 24B4.

In this case, as illustrated in (b) of FIG. 59, the charge accumulated in the memories 24A1 to 24A4 includes the charge (hereinafter, referred to as charge of interference light) 93A generated by photoelectrically converting the interference light in addition to the charge (hereinafter, referred to as charge of reflected light L2) 91A generated by photoelectrically converting the reflected light L2. Meanwhile, no charge is accumulated in the memories 24B1 to 24B4 in which the component of the reflected light L2 is not accumulated.

Therefore, as illustrated in (b) of FIG. 59, in a case where the charge amount of the charges in the memories 24B1 to 24B4 is subtracted from the charge amount of the charges (charges 91A and 93A) in the memories 24A1 to 24A4, the charge amount is the total charge amount of the charge 91A of the reflected light L2 and the charge 93A of the interference light. This means that when the reflected light from another ToF sensor is incident during the accumulation period, the noise due to the interference light cannot be canceled unless the charge amount of the interference light accumulated in the memories 24A1 to 24A4 matches the charge amount of the interference light accumulated in the memories 24B1 to 24B4.

1.13.2 Noise Cancellation by Interference

As described above, in the distance measurement sensor of the indirect ToF method, there is a possibility that noise is generated by the incidence of the interference light, and accordingly, the distance measurement accuracy is deteriorated.

Therefore, in the present embodiment, during the period of acquiring one subframe, the phase of the irradiation light L1 (and drive pulses VGA and VGB) in another accumulation period is reversed with respect to the phase of the irradiation light L1 (and drive pulses VGA and VGB) in a certain accumulation period. In the present description, this is referred to as encoding of the accumulation period.

The encoding of the accumulation period can be managed, for example, by associating one accumulation period with one bit. In this case, for example, the phase of the irradiation light L1 (and drive pulses VGA and VGB) may not be inverted in the accumulation period associated with the bit (hereinafter, referred to as code 0) of '0', and the phase of the irradiation light L1 (and drive pulses VGA and VGB) may be inverted in the accumulation period associated with the bit (hereinafter, referred to as code 1) of '1'.

Specifically, in a case where eight accumulation periods are executed to acquire one subframe, 8-bit codes such as '01010101' and '00101011' can be used as codes for encoding the accumulation periods. The code encoding the accumulation period is preferably a code in which the duty ratio between code 0 and code 1 is 50:50.

Note that, as a code string for encoding the accumulation period, for example, a pseudo random number generated using a pseudo random number generator or the like, a code string prepared in advance, or the like can be used.

1.13.2.1 Example of Noise Cancellation by Encoding of Accumulation Period

Here, noise cancellation by encoding of the accumulation period will be described with some examples. In the following description, similarly to the description of the "drive pulse example", it is assumed that the distance from the light emitting unit 13 and the light receiving unit 14 to the object 90 is 1 meter (m), and the distance (2 m) from the light emitting unit 13 to the light receiving unit 14 via the object 90 corresponds to one pulse period of the irradiation light L1 emitted from the light emitting unit 13. Furthermore, in the drawings used in the following description, hatched regions superimposed on the drive pulses VGA and VGB indicate examples of the amount of charge accumulated in the memory to which the drive pulses are applied. Furthermore, in the present description, noise generated by interference will be described using the unit pixel 20 exemplified as the second to fourth and sixth to eighth variations as an example. However, here, it is assumed that a non-accumulation period is not provided.

Figure 60:
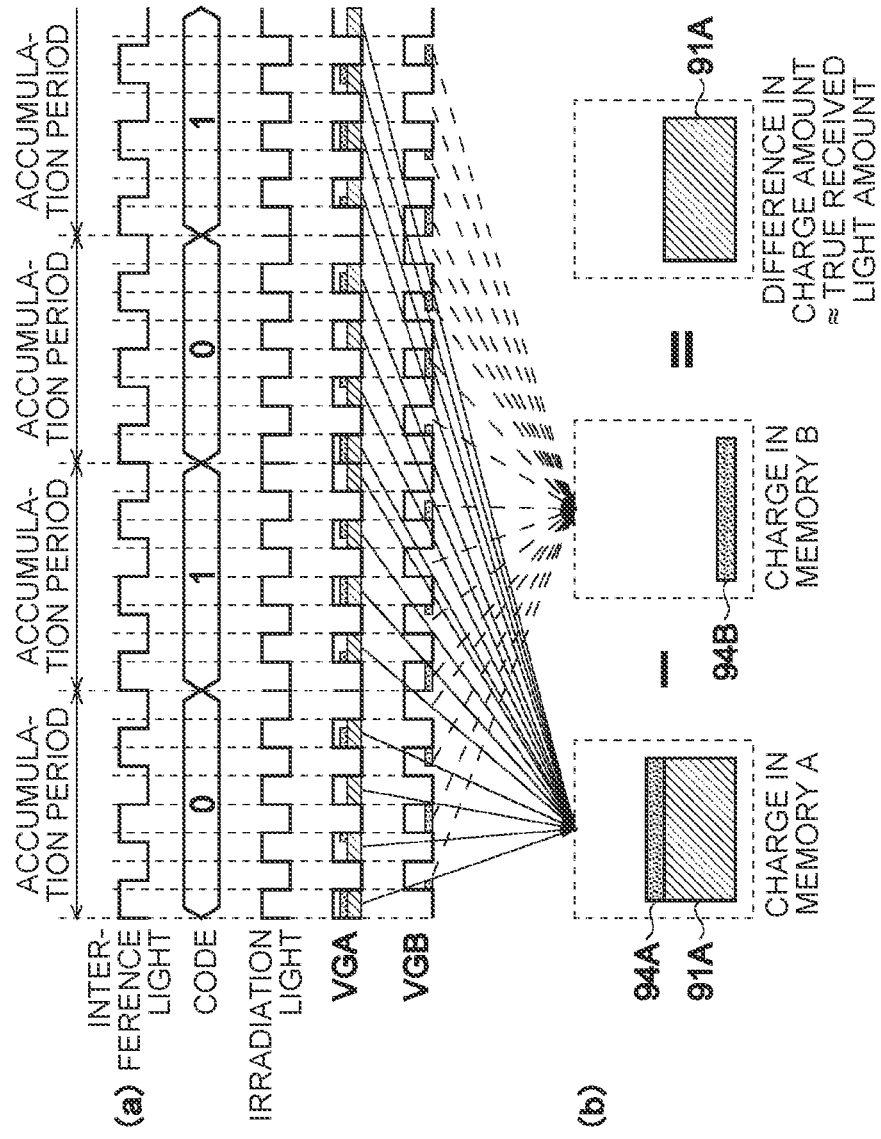
FIG. 60 is a diagram for describing noise cancellation according to the first embodiment in a case where a modulation frequency of interference light from another ToF sensor is different from a modulation frequency of its own irradiation light.

1.13.2.1.1 Case where Modulation Frequency of Interference Light from Another ToF Sensor is Different from Modulation Frequency of its Own Irradiation Light FIG. 60 is a diagram for describing noise cancellation according to the first embodiment in a case where a modulation frequency of the interference light from another ToF sensor is different from a modulation frequency of its own irradiation light. Note that FIG. 60 illustrates a case where four accumulation periods are repeated when one subframe is acquired. Furthermore, in FIG. 60, the code for encoding the four accumulation periods is set to '0101'.

As illustrated in (a) of FIG. 60, in a case where the modulation frequency of the reflected light from another ToF sensor is different from the modulation frequency of its own irradiation light L1, the charge generated by photoelectrically converting the interference light (reflected light) from another ToF sensor can be substantially evenly distributed to the memories 24A1 to 24A4 and the memories 24B1 to 24B4 by encoding the four accumulation periods using the code having the same duty ratio.

As a result, as illustrated in (b) of FIG. 60, the charge amount of the charge 94A of the interference light included in the charge accumulated in the memories 24A1 to 24A4 and the charge amount of the charge 94B of the interference light included in the charge accumulated in the memories 24B1 to 24B4 become substantially equal to each other.

Therefore, as illustrated in (b) of FIG. 60, in a case where the charge amount of the charge 94B in the memories 24B1 to 24B4 is subtracted from the charge amount of the charges (charges 91A and 94A) in the memories 24A1 to 24A4, the charge amount is substantially equal to the charge amount of the charge 91A of the reflected light L2. This means that the noise generated by the interference light has been canceled to a negligible extent.

Figure 61:
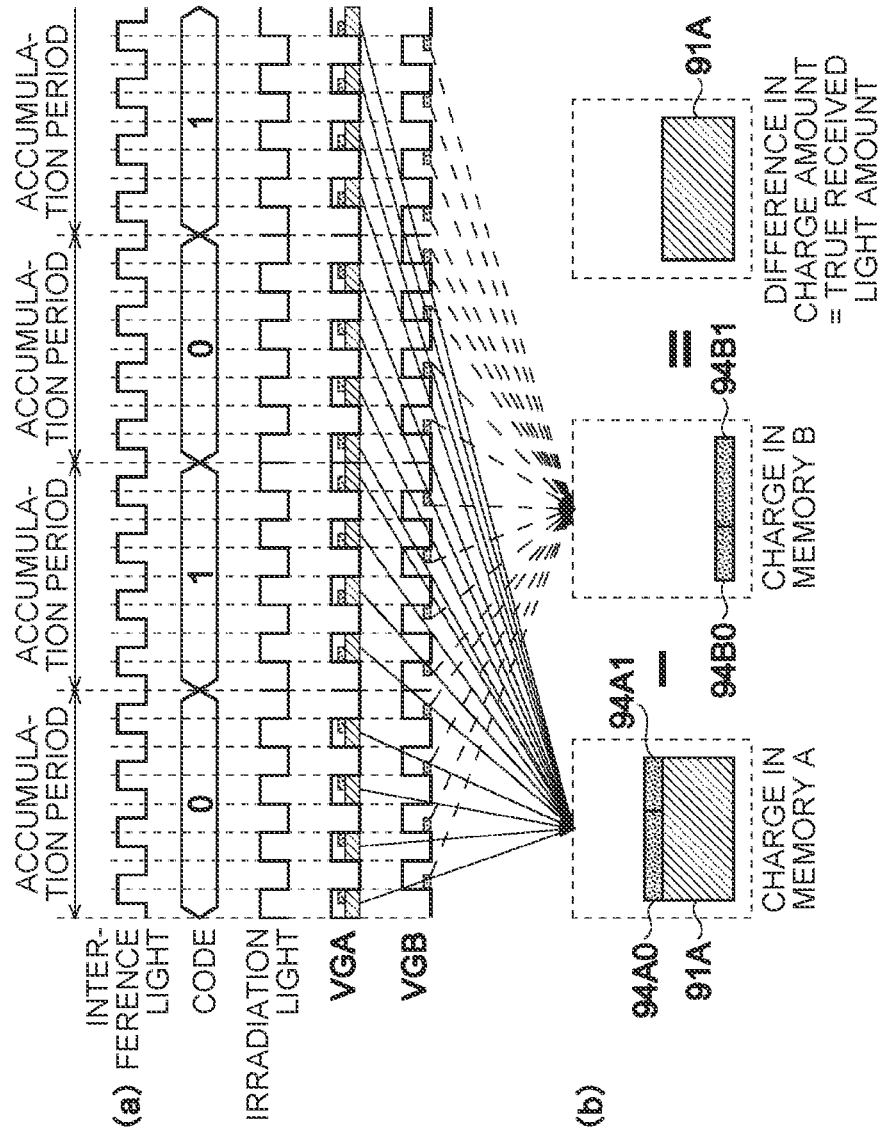
FIG. 61 is a diagram for describing the noise cancellation according to the first embodiment in a case where the modulation frequency of interference light from another ToF sensor is the same as the modulation frequency of its own irradiation light.

1.13.2.1.2 Case where Modulation Frequency of Interference Light from Another ToF Sensor is the Same as Modulation Frequency of its Own Irradiation Light FIG. 61 is a diagram for describing noise cancellation according to the first embodiment in a case where a modulation frequency of interference light from another ToF sensor is the same as a modulation frequency of its own irradiation light. Note that, similarly to FIG. 60, FIG. 61 illustrates a case where four accumulation periods are repeated when one subframe is acquired, and a code (code) for encoding the four accumulation periods is '0101'.

As illustrated in (a) of FIG. 61, in a case where the modulation frequency of the reflected light from another ToF sensor is the same as the modulation frequency of its own irradiation light L1, the total charge amount of the charge 94A0 transferred to the memories 24A1 to 24A4 during the accumulation period of the code 0 and the charge 94A1 transferred to the memories 24A1 to 24A4 during the accumulation period of the code 1 among the charges generated by performing the photoelectric conversion of the interference light (reflected light) from another ToF sensor by encoding the four accumulation periods using the code having the same duty ratio is equal to the total charge amount of the charge 94B0 transferred to the memories 24B1 to 24B4 during the accumulation period of the code 0 and the charge 94B1 transferred to the memories 24B1 to 24B4 during the accumulation period of the code 1.

Therefore, as illustrated in (b) of FIG. 61, in a case where the charge amount of the charges (charges 94B0 and 94B1) in the memories 24B1 to 24B4 is subtracted from the charge amount of the charges (charge 91A, 94A0, and 94A1) in the memories 24A1 to 24A4, the charge amount is the charge amount of the charge 91A of the reflected light L2. This means that the noise generated by the interference light is canceled.

Figure 62:
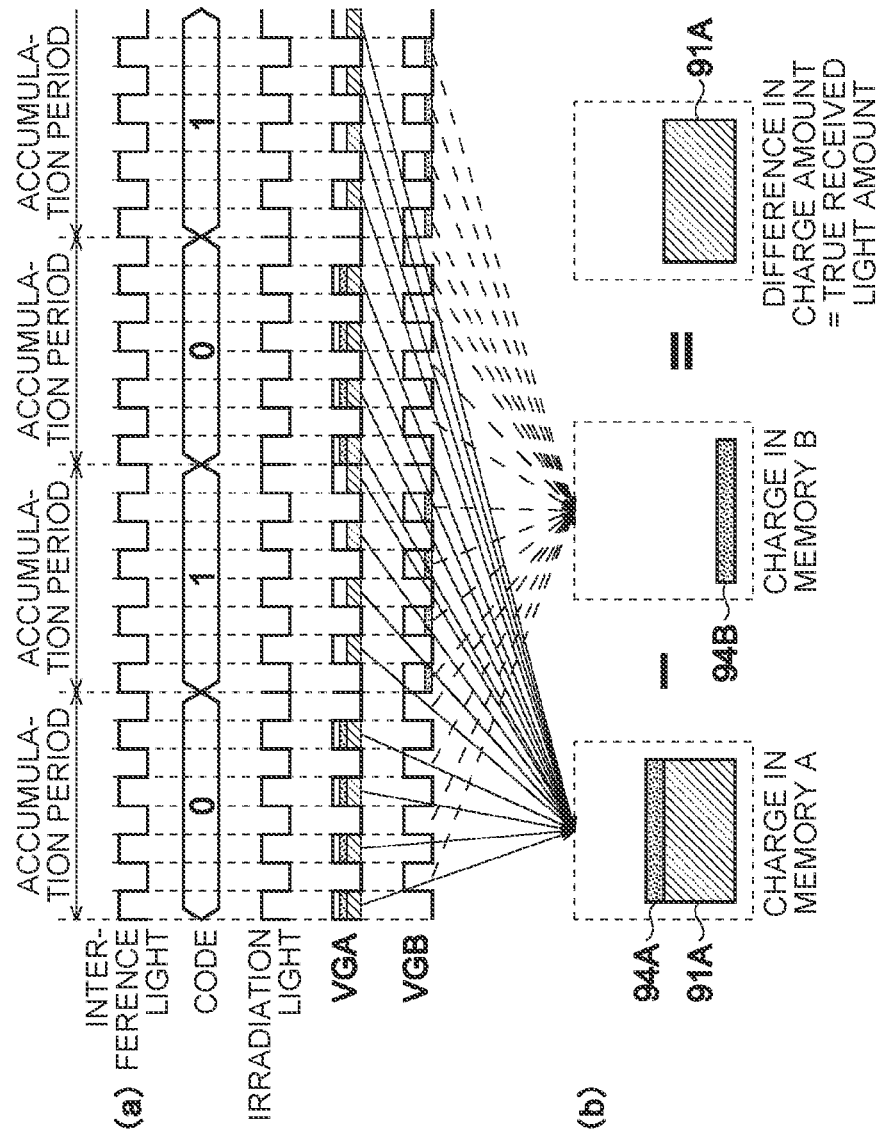
FIG. 62 is a diagram for describing the noise cancellation according to the first embodiment in a case where the modulation frequency and a phase of interference light from another ToF sensor are the same as the modulation frequency and a phase of its own irradiation light.

1.13.2.1.3 Case where Modulation Frequency and Phase of Interference Light from Another ToF Sensor are the Same as Modulation Frequency and Phase of its Own Irradiation Light FIG. 62 is a diagram for describing the noise cancellation according to the first embodiment in a case where the modulation frequency and the phase of interference light from another ToF sensor are the same as the modulation frequency and the phase of its own irradiation light. Note that, as in FIG. 60 or 61, FIG. 62 illustrates a case where four accumulation periods are repeated when one subframe is acquired, and a code (code) for encoding the four accumulation periods is '0101'.

As illustrated in (a) of FIG. 62, in a case where the modulation frequency and the phase of the reflected light from another ToF sensor are the same as the modulation frequency and the phase of its own irradiation light L1, the charge generated by photoelectrically converting the interference light (reflected light) from another ToF sensor is transferred to the memories 24A1 to 24A4 during the accumulation period of the code 0, and the charge generated by photoelectrically converting the interference light (reflected light) from another ToF sensor is transferred to the memories 24B1 to 24B4 during the accumulation period of the code 1.

Therefore, by encoding the four accumulation periods using the code having the same duty ratio, the charge generated by photoelectrically converting the interference light (reflected light) from another ToF sensor can be equally distributed to the memories 24A1 to 24A4 and the memories 24B1 to 24B4.

As a result, as illustrated in (b) of FIG. 62, the charge amount of the charge 94A of the interference light included in the charge accumulated in the memories 24A1 to 24A4 and the charge amount of the charge 94B of the interference light included in the charge accumulated in the memories 24B1 to 24B4 become equal to each other.

Therefore, as illustrated in (b) of FIG. 62, in a case where the charge amount of the charge 94B in the memories 24B1 to 24B4 is subtracted from the charge amount of the charges (charges 91A and 94A) in the memories 24A1 to 24A4, the charge amount is the charge amount of the charge 91A of the reflected light L2. This means that the noise generated by the interference light is canceled.

1.13.3 Noise Generated at the Time of Phase Switching

However, in the encoding of the accumulation period as described above, when the non-accumulation period is not provided during the accumulation period, a phenomenon occurs in which a portion of the reflected light L2 of the irradiation light L1 emitted before the phase switching is incident on the light receiving unit 14 after the phase switching by the encoding of the accumulation period. As a result, a portion of the charges originally to be transferred to the memories 24A1 to 24A4 or 24B1 to 24B4 is transferred to the memories 24B1 to 24B4 or 24A1 to 24A1, and as a result, there is a possibility that the distance measurement accuracy is reduced.

Figure 63:
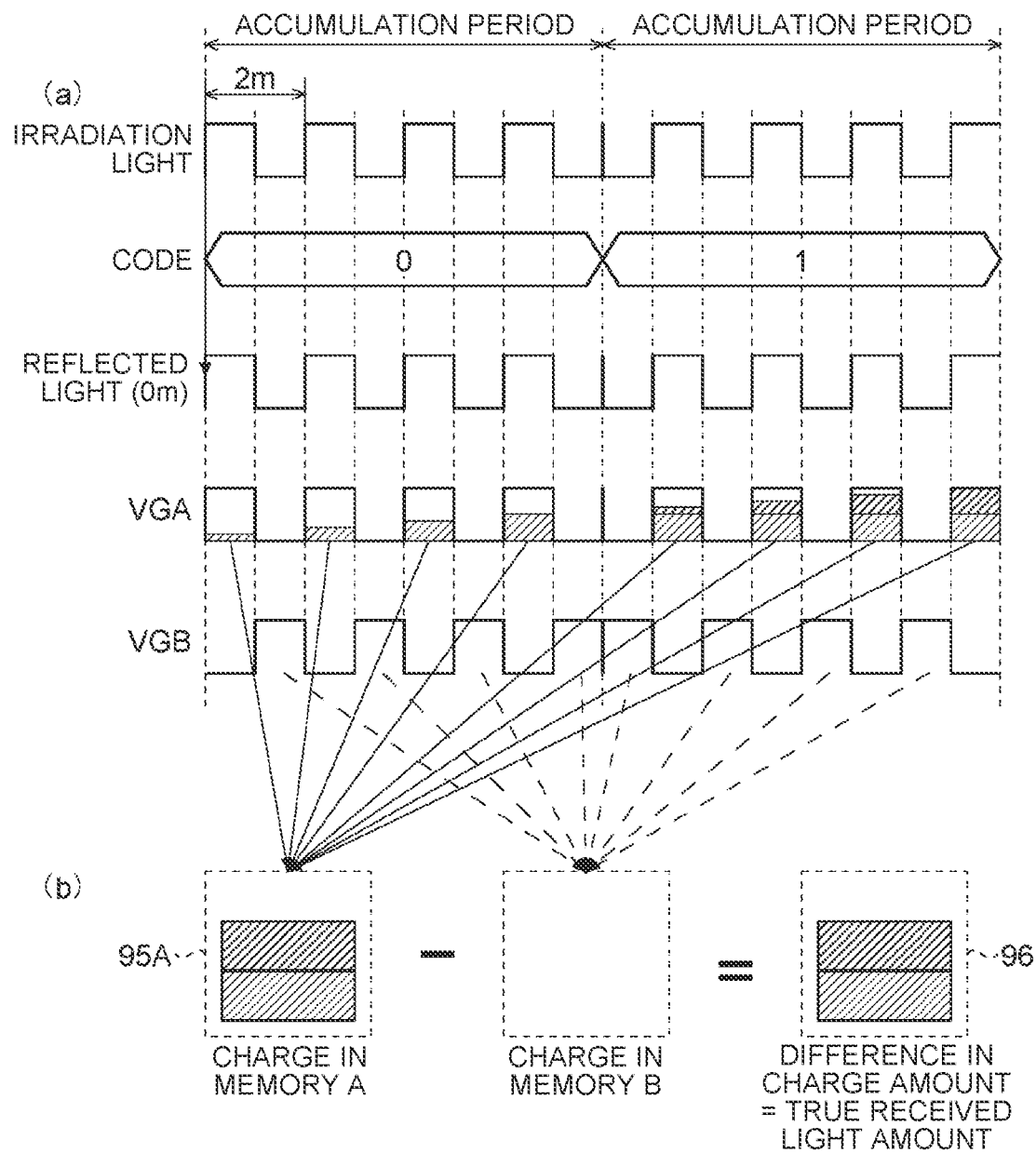
FIG. 63 is a waveform diagram illustrating a case where a ToF sensor and an object are in contact with each other.
Figure 64:
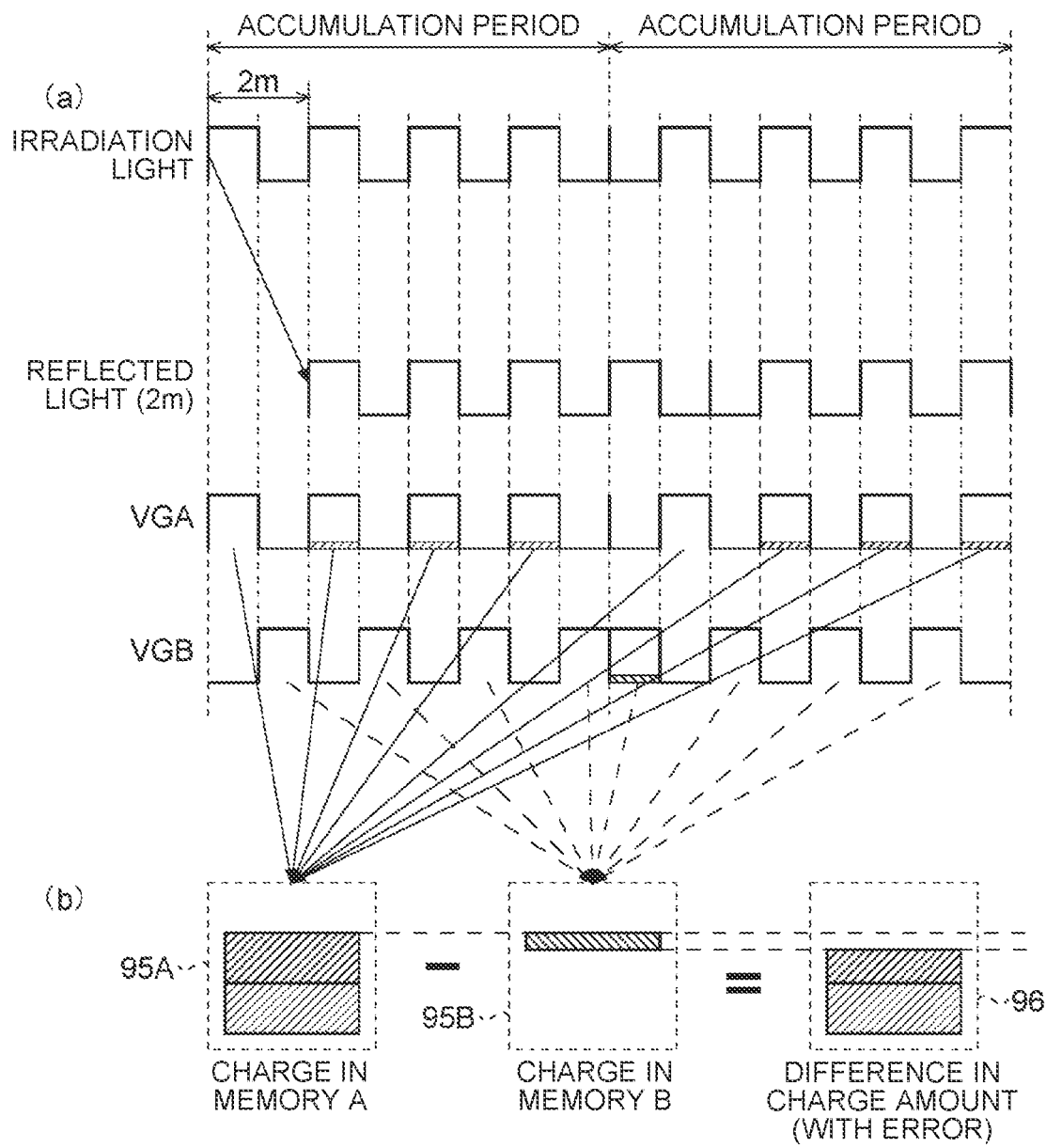
FIG. 64 is a waveform diagram illustrating a case where the ToF sensor and the object are separated from each other.

FIG. 63 is a waveform diagram illustrating a case where the ToF sensor and the object are in contact with each other, that is, the distance from the ToF sensor to the object is 0, and FIG. 64 is a waveform diagram illustrating a case where the ToF sensor and the object are separated from each other (as an example, a case where the distance from the ToF sensor to the object is a distance corresponding to one pulse period of the irradiation light). Note that FIGS. 63 and 64 illustrate a case where the non-accumulation period is not provided during the accumulation period.

As illustrated in (a) of FIG. 63, in a case where the ToF sensor 1 is in contact with the object 90, before the phase of the light receiving unit 14 is switched, that is, before the phases of the drive pulses VGA and VGB are switched according to the encoding of the accumulation period, the entire reflected light L2 of the irradiation light L1 emitted before the phase switching is incident on the light receiving unit 14. Therefore, a portion of the charges originally to be transferred to the memories 24A1 to 24A4 or 24B1 to 24B4 is not transferred to the memory 24B1 to 24B4 or 24A1 to 24A1. As illustrated in (b) of FIG. 63, the charge amount of the charges 96 obtained by subtracting the charges accumulated in the memories 24B1 to 24B4 from the charges 95A accumulated in the memories 24A1 to 24A4 is a true charge amount corresponding to the amount of the reflected light L2.

Meanwhile, as illustrated in (a) of FIG. 64, in a case where the ToF sensor 1 and the object 90 are separated from each other, for example, in a case where the distance from the ToF sensor 1 to the object 90 is a distance (for example, 2 m) corresponding to one pulse period of the irradiation light L1, the last one pulse of the reflected light L2 is incident on the light receiving unit 14 after switching the phases of the drive pulses VGA and VGB on the basis of the encoding of the accumulation period. Therefore, a portion of the charge to be originally transferred to the memories 24A1 to 24A4 or 24B1 to 24B4 is transferred to the memories 24B1 to 24B4 or 24A1 to 24A1, and as illustrated in (b) of FIG. 64, the charge amount of the charge 96 obtained by subtracting the charge 95B accumulated in the memories 24B1 to 24B4 from the charge 95A accumulated in the memories 24A1 to 24A4 is a charge amount including an error with respect to the true charge amount according to the amount of the reflected light L2.

1.13.3.1 Example of Noise Cancellation Operation at the Time of Phase Switching (in Case of 2-Tap Type)

Figure 65:
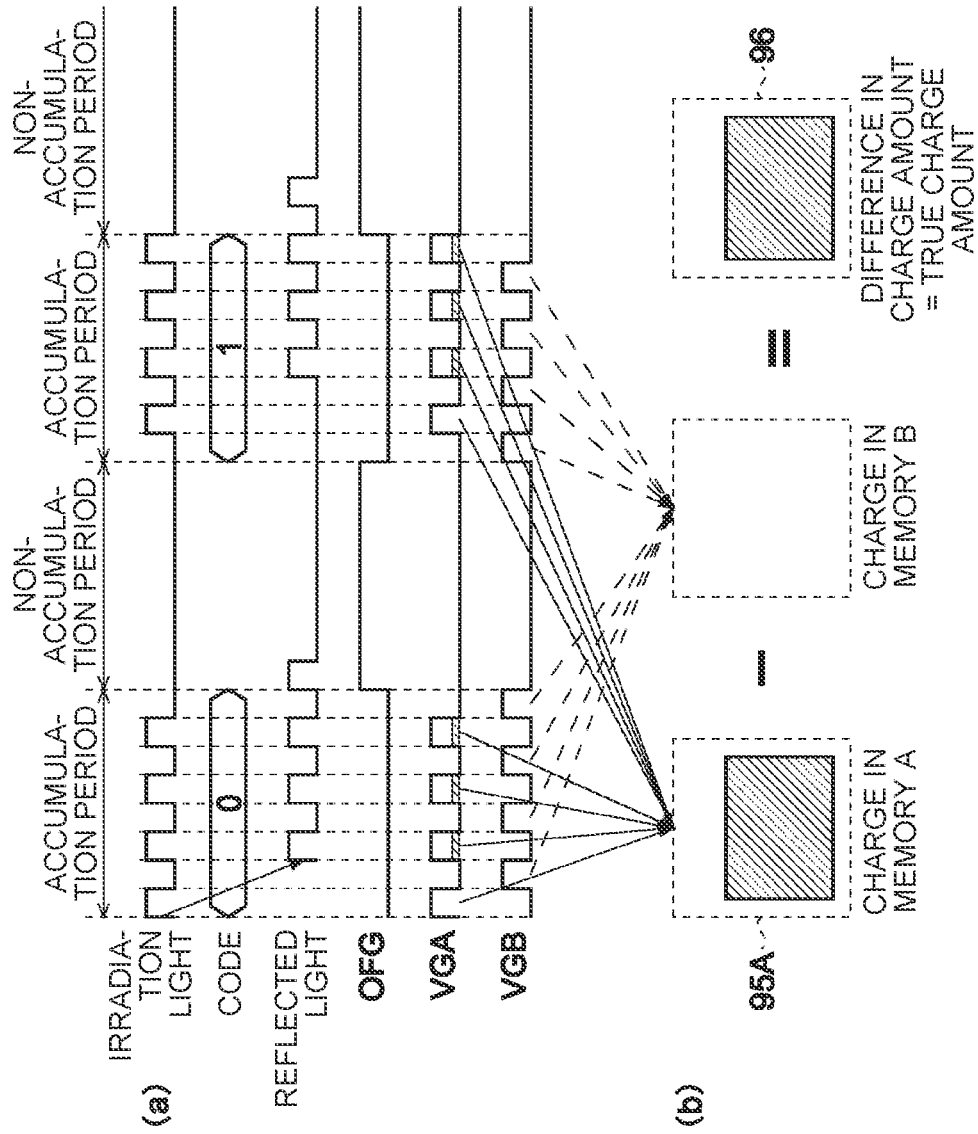
FIG. 65 is a waveform diagram for describing an example of a noise cancellation operation at the time of phase switching according to the first embodiment (2-tap type).

Therefore, in the present embodiment, as illustrated in (a) of FIG. 65, the non-accumulation period is provided between the accumulation periods. In this non-accumulation period, a high-level drive pulse OFG is applied to the gates of the OFG transistors 221 to 224. As a result, the charge generated by a portion of the reflected light L2 of the irradiation light L1 emitted before the phase switching being incident on the light receiving unit 14 after the phase switching by the encoding of the accumulation period is discharged via the OFG transistors 221 to 224, and thus, it is possible to avoid a phenomenon in which a portion of the charge to be originally transferred to the memories 24A1 to 24A4 or 24B1 to 24B4 is transferred to the memories 24B1 to 24B4 or 24A1 to 24A1. As a result, as illustrated in (b) of FIG. 65, the charge amount of the charge 96 obtained by subtracting the charge accumulated in the memory 24B1 to 24B4 from the charge 95A accumulated in the memories 24A1 to 24A4 becomes a true charge amount according to the light amount of the reflected light L2.

1.13.3.2 Modification Example of Noise Cancellation Operation at the Time of Phase Switching FIG. 65 illustrates a case where the two OFG transistors 221 and 222 are constantly turned on during the non-accumulation period, but the present disclosure is not limited to such an operation. For example, as illustrated in FIG. 66(a), the drive pulse OFG1 supplied to the gate of the OFG transistor 221 and the drive pulse OFG2 supplied to the gate of the OFG transistor 222 during the non-accumulation period may be pulses having the same cycle as the drive pulses VGA and VGB.

As a result, the vertical drive circuit 103 that supplies the drive pulses VGA, VGB, OFG1, and OFG2 can continue the same operation in the accumulation period and the non-accumulation period, and thus, the state of the voltage drop (IR drop) in each of the readout circuits A and B can be maintained uniform. As a result, noise generated at the time of phase switching is reduced, and thus, a depth frame with higher accuracy can be acquired.

1.13.3.3 Modification Example of Noise Cancellation Operation at the Time of Phase Switching (in Case of Multi-Tap Type of Three Taps or More)

Furthermore, in a case where the readout circuit connected to one photodiode 21 is a multi-tap type of 3 taps or more in which there are 3 or more readout circuits, readout circuits other than 2 of the 3 taps or more may be used for resetting (discharging charges) the photodiode 21. For example, the readout circuit 20C in FIG. 15 or the readout circuits 20C and 20D in FIG. 16 may be used for resetting (discharging charges) the photodiode 21.

Figure 67:
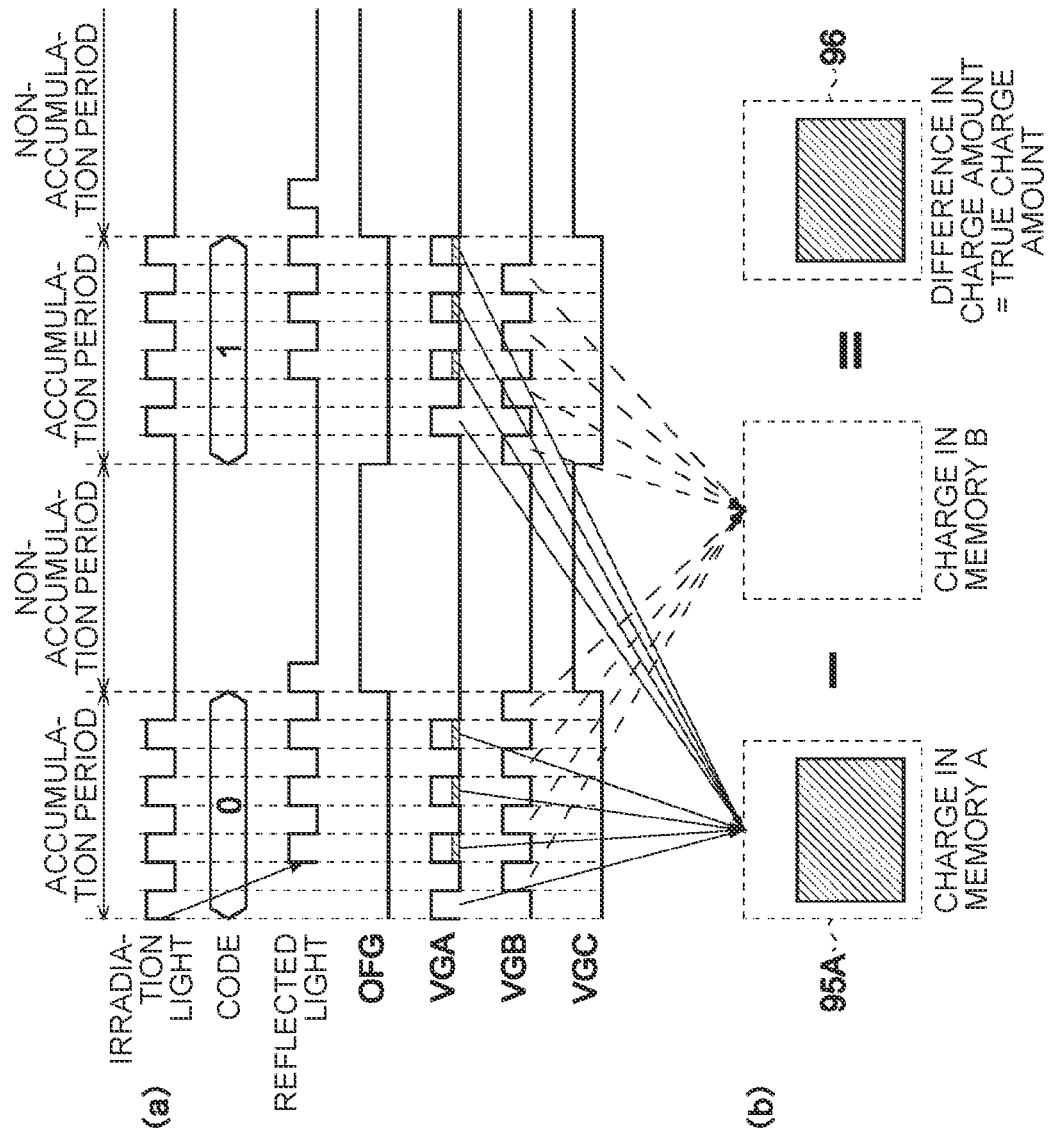
FIG. 67 is a waveform diagram for describing an example of the noise cancellation operation at the time of the phase switching according to the first embodiment (multi-tap type).

In that case, for example, as illustrated in (a) of FIG. 67, during the non-accumulation period, a high-level drive pulse VGC (or VGC and VGD) is applied to the gate of the transfer gate transistor 23C (or 23C and 23D) of the readout circuit 20C (or 20C and 20D).

As a result, the charge generated in the photodiode 21 during the non-accumulation period can be efficiently discharged, and thus, a more accurate depth frame can be acquired.

1.14 Action and Effect

As described above, according to the present embodiment, since the charges stored in the memory are transferred to the common floating diffusion region 27 at the time of the reading, it is possible to reduce the difference in the accumulated charge amount due to the characteristic difference for each readout circuit. As a result, it is possible to generate a high-quality depth frame without acquiring antiphase data, and thus, it is possible to generate a high-quality depth frame at a high frame rate.

Furthermore, according to the present embodiment, since the configuration (reset transistor 26, amplification transistor 28, selection transistor 29, vertical signal line VSL, AD converter in column processing circuit 104, and the like) downstream of the floating diffusion region 27 is shared by the plurality of readout circuits, it is possible to eliminate the characteristic difference caused by the downstream configuration, and thus, it is possible to generate a depth frame of higher quality.

Furthermore, according to the present embodiment, since a plurality of accumulation periods when one subframe is acquired is encoded, it is possible to reduce noise generated by interference with other ToF sensors and acquire a depth frame with higher accuracy.

Furthermore, according to the present embodiment, a non-accumulation period is provided between the accumulation period and the accumulation period, and the charge generated in the photodiode 21 during the non-accumulation period is discharged via the OFG transistors 221 and 222 or 221 to 224. Therefore, noise generated at the time of phase switching can be reduced, and a depth frame with higher accuracy can be acquired.

2. SECOND EMBODIMENT

Next, a second embodiment will be described in detail with reference to the drawings. In the following description, the same configurations and operations as those of the above-described embodiment are denoted by the same reference numerals, and redundant description thereof will be omitted.

In the first embodiment, the unit pixel 20 having a configuration in which the charge generated in the photodiode 21 is temporarily accumulated in the memory and then the charge in the memory is transferred to the shared floating diffusion region 27 is described with some examples. Meanwhile, in the second embodiment, a unit pixel configured to directly transfer the charge generated in the photodiode 21 to the floating diffusion region will be described with some examples.

2.1 First Configuration Example

Figure 68:
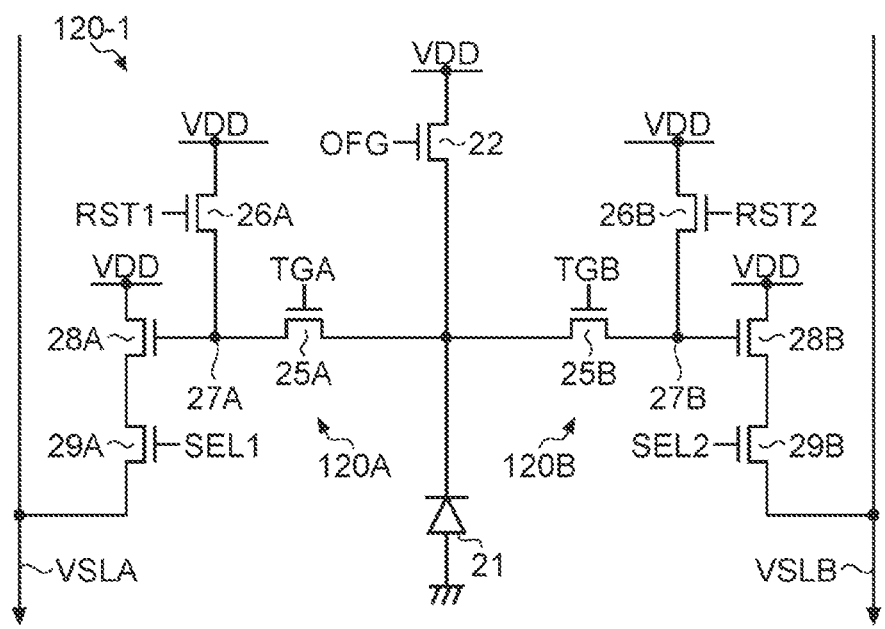
FIG. 68 is a circuit diagram illustrating a circuit configuration example of a unit pixel according to a first configuration example of the second embodiment.

FIG. 68 is a circuit diagram illustrating a circuit configuration example of a unit pixel according to a first configuration example of the second embodiment. As illustrated in FIG. 68, a unit pixel 120-1 according to the first configuration example has a configuration in which the transfer gate transistors 23A and 23B and the memories 24A and 24B in the readout circuits 20A and 20B are omitted in a configuration similar to the unit pixel 20-5 according to the fifth configuration example described with reference to FIG. 14 in the first embodiment. Furthermore, in the unit pixel 120-1, the individual reset transistors 26A or 26B, the floating diffusion regions 27A or 27B, the amplification transistors 28A or 28B, and the selection transistors 29A or 29B are provided for the readout circuits 20A and 20B, respectively.

Figure 66:
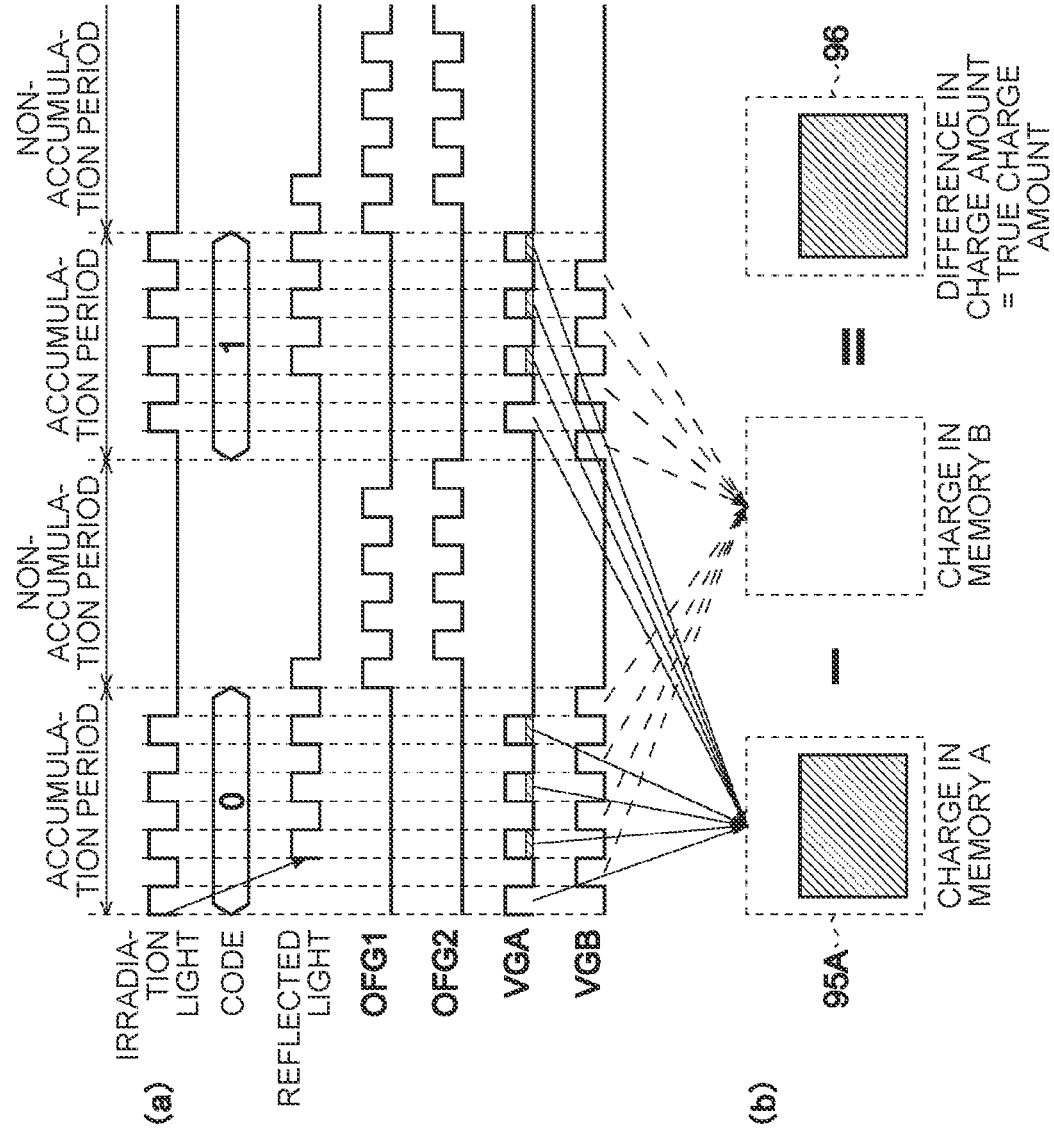
FIG. 66 is a waveform diagram for describing an example of a noise cancellation operation at the time of phase switching according to a modification example of the first embodiment.

A drive pulse supplied to the unit pixel 120-1 having such a circuit configuration may be, for example, similar to the drive pulse described with reference to FIG. 65 or 66 in the first embodiment.

As a result, in the encoding of the accumulation period, the charge generated in the photodiode 21 during the non-accumulation period is discharged via the OFG transistors 221 and 222 or 221 to 224, and thus, it is also possible to reduce noise generated at the time of phase switching and acquire a depth frame with higher accuracy.

2.2 Second Configuration Example

Figure 69:
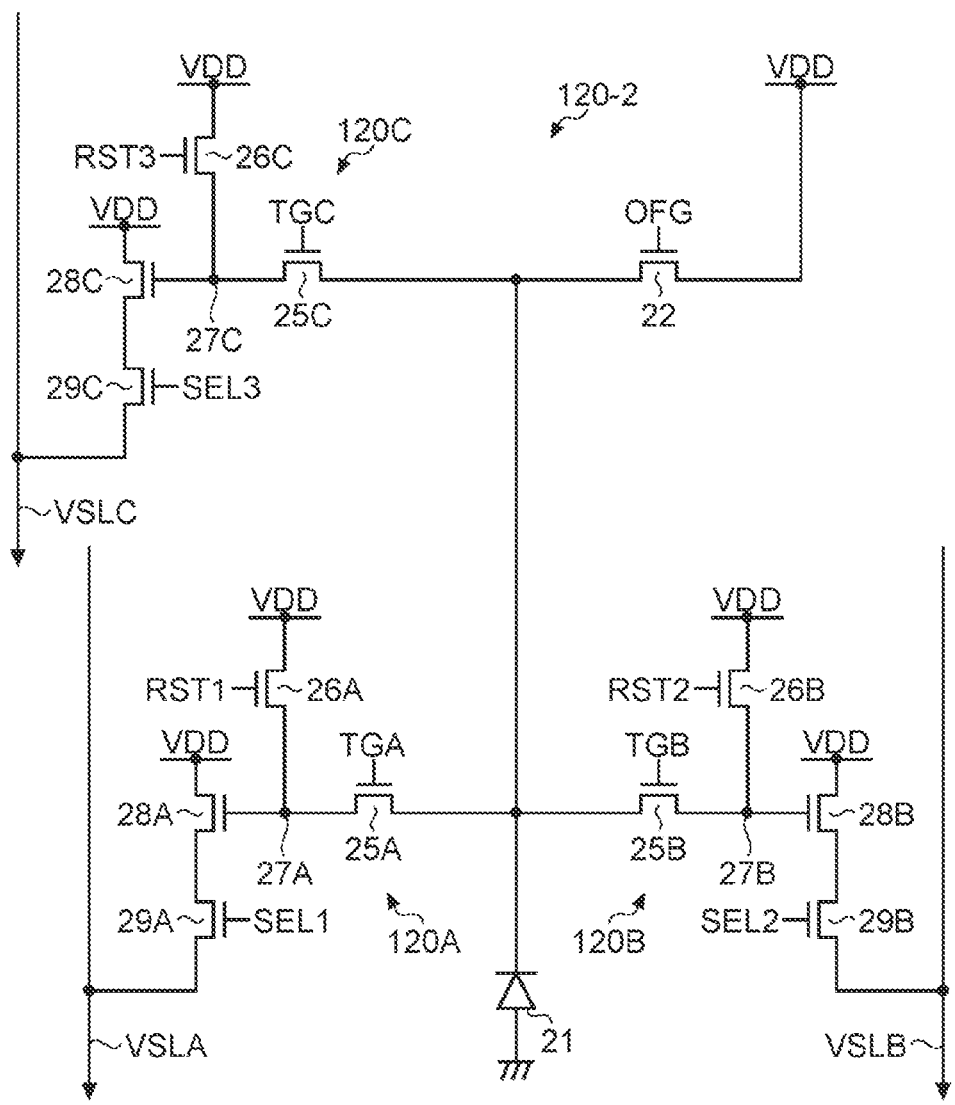
FIG. 69 is a circuit diagram illustrating a circuit configuration example of a unit pixel according to a second configuration example of the second embodiment.

FIG. 69 is a circuit diagram illustrating a circuit configuration example of a unit pixel according to a second configuration example of the second embodiment. As illustrated in FIG. 69, a unit pixel 120-2 according to the second configuration example has a configuration in which the transfer gate transistors 23A, 23B, and 23C and the memories 24A, 24B, and 24C in the readout circuits 20A, 20B, and 20C are omitted in a configuration similar to the unit pixel 20-6 according to the sixth configuration example described with reference to FIG. 15 in the first embodiment. Furthermore, in the unit pixel 120-2, the individual reset transistors 26A, 26B, or 26C, the floating diffusion regions 27A, 27B, or 27C, the amplification transistors 28A, 28B, or 28C, and the selection transistors 29A, 29B, or 29C are provided for the readout circuits 20A, 20B, and 20C, respectively.

A drive pulse supplied to the unit pixel 120-2 having such a circuit configuration may be, for example, similar to the drive pulse described with reference to FIG. 67 in the first embodiment.

As a result, the charge generated in the photodiode 21 during the non-accumulation period can be efficiently discharged via the OFG transistor 22 and the readout circuit 20C, and thus, a more accurate depth frame can be acquired.

2.3 Third Configuration Example

Figure 70:
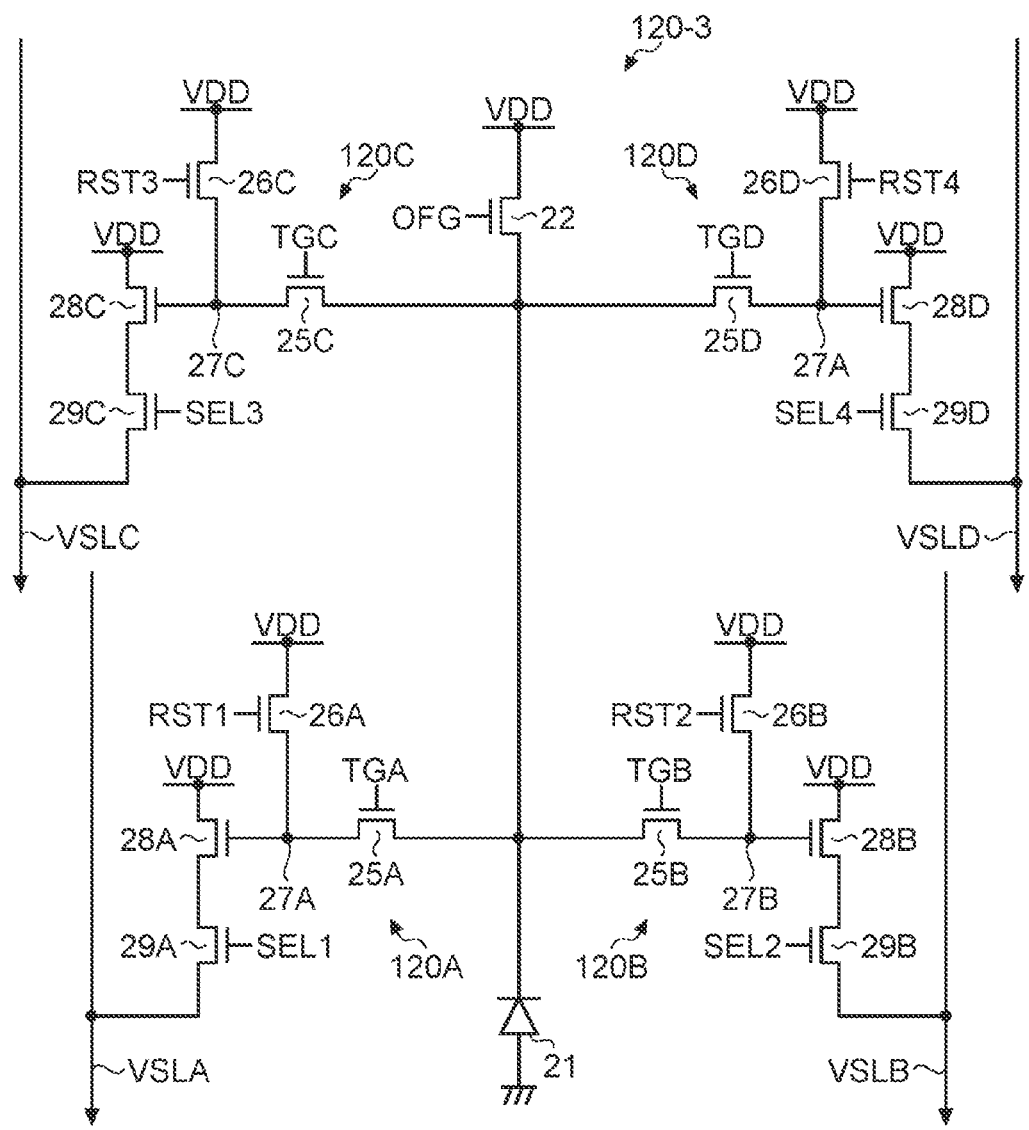
FIG. 70 is a circuit diagram illustrating a circuit configuration example of a unit pixel according to a third configuration example of the second embodiment.

FIG. 70 is a circuit diagram illustrating a circuit configuration example of a unit pixel according to a third configuration example of the second embodiment. As illustrated in FIG. 70, a unit pixel 120-3 according to the third configuration example has a configuration in which the transfer gate transistors 23A, 23B, 23C, and 23D and the memories 24A, 24B, 24C, and 24D in the readout circuits 20A, 20B, 20C, and 20D are omitted in a configuration similar to the unit pixel 20-7 according to the seventh configuration example described with reference to FIG. 16 in the first embodiment. Furthermore, in the unit pixel 120-3, the individual reset transistors 26A, 26B, 26C, or 26D, the floating diffusion regions 27A, 27B, 27C, or 27D, the amplification transistors 28A, 28B, 28C, or 28D, and selection transistors 29A, 29B, 29C, or 29D are provided for the readout circuits 20A, 20B, 20C, and 20D, respectively.

A drive pulse supplied to the unit pixel 120-3 having such a circuit configuration may be, for example, similar to the drive pulse described with reference to FIG. 67 in the first embodiment.

As a result, the charge generated in the photodiode 21 during the non-accumulation period can be efficiently discharged via the OFG transistor 22 and the readout circuits 20C and 20D, and thus, a more accurate depth frame can be acquired.

Other configurations, operations, and effects may be similar to those of the above-described embodiment, and thus detailed description thereof is omitted here.

3. CONFIGURATION EXAMPLE OF LAMINATED SOLID-STATE IMAGING DEVICE TO WHICH TECHNOLOGY ACCORDING TO PRESENT DISCLOSURE CAN BE APPLIED

Figure 71:
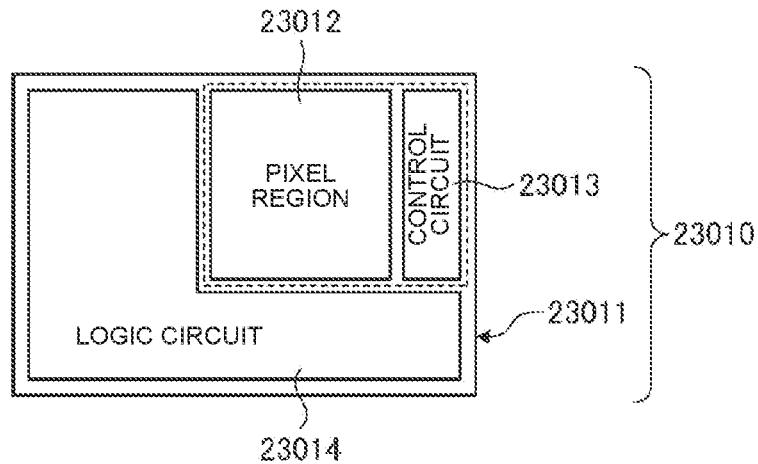
FIG. 71 is a diagram illustrating an outline of a configuration example of a non-laminated solid-state imaging device to which a technology according to the present disclosure can be applied.
Figure 72:
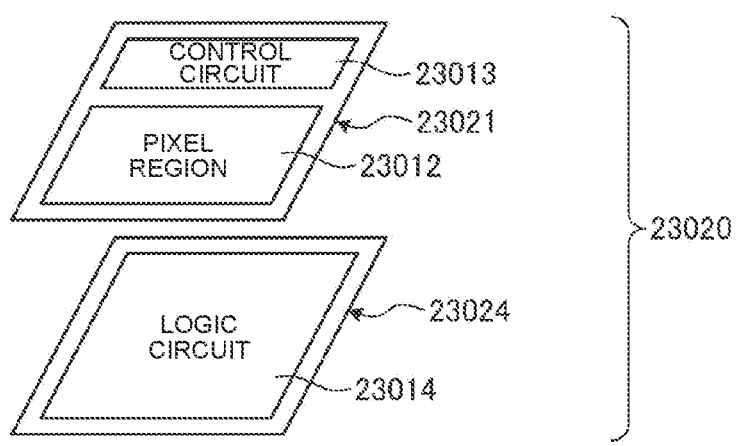
FIG. 72 is a diagram illustrating an outline of a configuration example of a laminated solid-state imaging device to which the technology according to the present disclosure can be applied (part 1).
Figure 73:
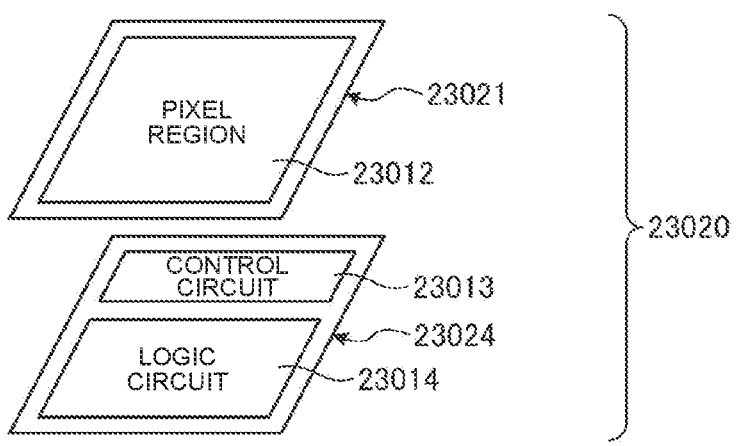
FIG. 73 is a diagram illustrating an outline of a configuration example of the laminated solid-state imaging device to which the technology according to the present disclosure can be applied (part 2).

FIG. 71 is a diagram illustrating an outline of a configuration example of a non-laminated solid-state imaging device to which a technology according to the present disclosure can be applied. FIGS. 72 and 73 are diagrams illustrating an outline of a configuration example of a laminated solid-state imaging device to which the technology according to the present disclosure can be applied.

FIG. 71 illustrates a schematic configuration example of the non-laminated solid-state imaging device. As illustrated in FIG. 71, a solid-state imaging device 23010 includes one die (semiconductor substrate) 23011. The die 23011 is mounted with a pixel region 23012 in which pixels are arranged in an array, a control circuit 23013 that performs various controls such as driving of the pixels, and a logic circuit 23014 for signal processing.

FIGS. 72 and 73 illustrate a schematic configuration example of the laminated solid-state imaging device. As illustrated in FIGS. 72 and 73, a solid-state imaging device 23020 is configured as one semiconductor chip in which two dies of a sensor die 23021 and a logic die 23024 are laminated and electrically connected.

In FIG. 72, a pixel region 23012 and a control circuit 23013 are mounted on the sensor die 23021, and a logic circuit 23014 including a signal processing circuit that performs signal processing is mounted on the logic die 23024.

In FIG. 73, a pixel region 23012 is mounted on the sensor die 23021, and a control circuit 23013 and a logic circuit 23014 are mounted on the logic die 23024.

4. EXAMPLE OF ELECTRONIC DEVICE TO WHICH TECHNOLOGY ACCORDING TO THE PRESENT DISCLOSURE CAN BE APPLIED

Figure 74:
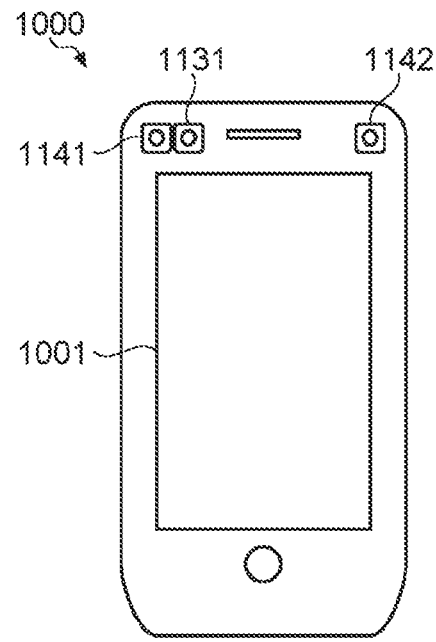
FIG. 74 is a schematic diagram illustrating an example of an electronic device to which a technology according to the present disclosure can be applied (front side).
Figure 75:
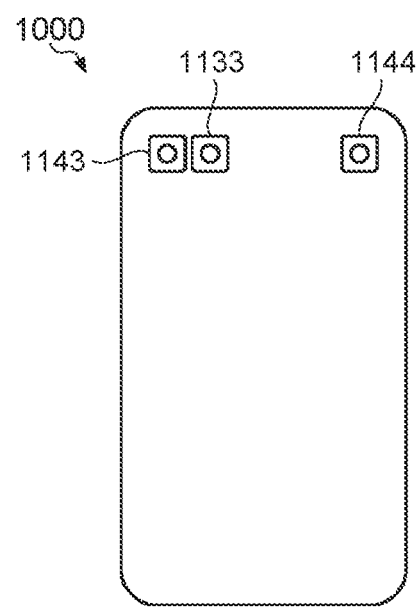
FIG. 75 is a schematic diagram illustrating an example of the electronic device to which the technology according to the present disclosure can be applied (rear side).

FIGS. 74 and 75 are schematic diagrams illustrating an example of an electronic device to which the technology according to the present disclosure can be applied. Note that, in the present description, a smartphone is exemplified as an electronic device to which the technology according to the present disclosure can be applied.

FIG. 74 illustrates a configuration example of a front side of the smartphone. As illustrated in FIG. 74, a smartphone 1000 includes an active infrared ray (IR) light source 1131 as the light emitting unit 13 and front cameras 1141 and 1142 as the light receiving unit 14 on the front side where a display 1001 is disposed.

Furthermore, as illustrated in FIG. 75, the smartphone 1000 includes an active IR light source 1133 as the light emitting unit 13 and rear cameras 1143 and 1144 as the light receiving unit 14 on a rear side opposite to the front side on which the display 1001 is disposed.

5. VARIOUS APPLICATION EXAMPLES

Next, an application example of the present technology will be described.

Figure 76:
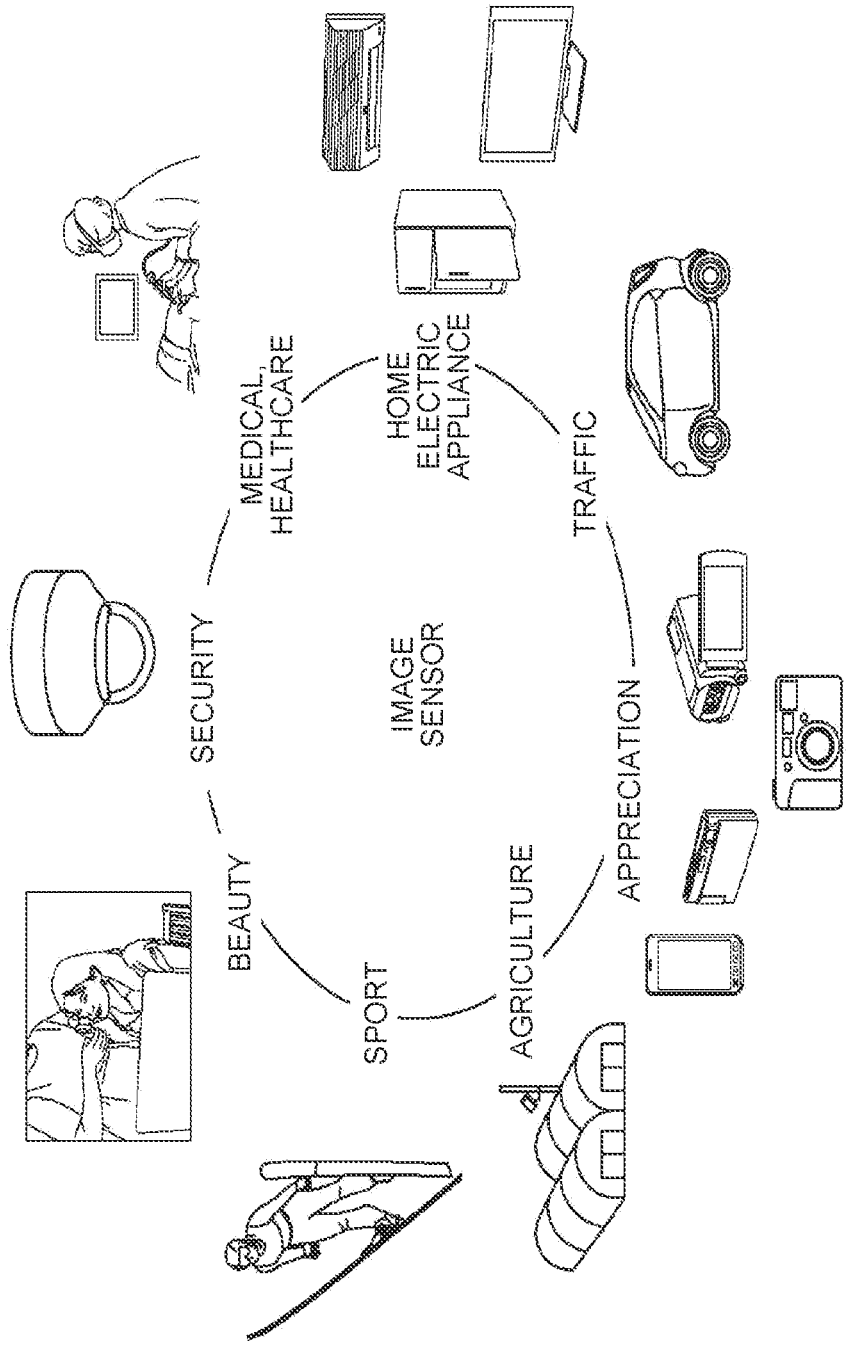
FIG. 76 is a schematic diagram illustrating a case where the technology according to the present disclosure can be applied.

For example, as illustrated in FIG. 76, the present technology can be applied to various cases of sensing light such as visible light, infrared light, ultraviolet light, and X-rays.

- A device that captures an image to be used for appreciation, such as a digital camera or a portable device with a camera function
- A device used for traffic, such as an in-vehicle sensor that captures images of the front, rear, surroundings, inside, and the like of an automobile for safe driving such as automatic stop, recognition of a driver's condition, and the like, a monitoring camera that monitors traveling vehicles and roads, and a distance measurement sensor that measures a distance between vehicles and the like
- A device used for home electric appliances such as a TV, a refrigerator, and an air conditioner in order to capture an image of a gesture of a user and perform a device operation according to the gesture
- A device used for medical care or health care, such as an endoscope or a device that performs angiography by receiving infrared light
- A device used for security, such as a monitoring camera for crime prevention or a camera for person authentication
- A device used for beauty care, such as a skin measuring instrument for photographing skin or a microscope for photographing scalp
- An apparatus used for sports, such as an action camera or a wearable camera for sports or the like
- A device used for agriculture, such as a camera for monitoring conditions of fields and crops

6. APPLICATION EXAMPLE TO MOBILE BODY

The technology according to the present disclosure can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, and a robot.

Figure 77:
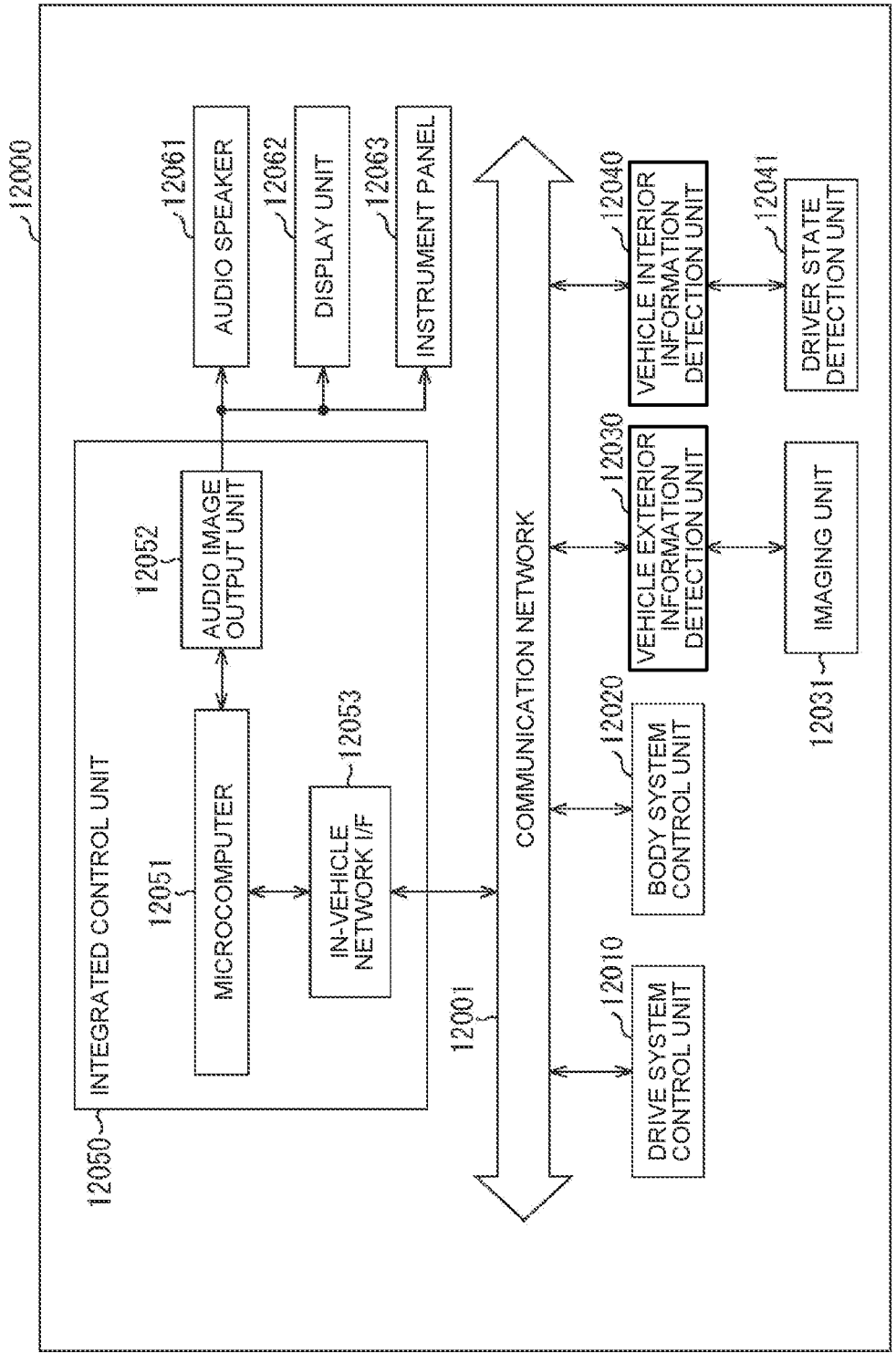
FIG. 77 is a block diagram illustrating an example of a schematic configuration of a vehicle control system.

FIG. 77 is a block diagram illustrating a schematic configuration example of a vehicle control system which is an example of a moving body control system to which the technology according to the present disclosure can be applied.

A vehicle control system 12000 includes a plurality of electronic control units connected via a communication network 12001. In the example illustrated in FIG. 77, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The drive system control unit 12010 controls operation of devices related to a drive system of the vehicle according to various programs. For example, the drive system control unit 12010 functions as a control device of a driving force generation device for generating a driving force of a vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operations of various devices mounted on a vehicle body according to various programs. For example, the body system control unit 12020 functions as a control device of a keyless entry system, a smart key system, a power window device, or various lamps such as a head lamp, a back lamp, a brake lamp, a blinker, or a fog lamp. In this case, radio waves transmitted from a portable device that substitutes for a key or signals of various switches can be input to the body system control unit 12020. The body system control unit 12020 receives input of these radio waves or signals, and controls a door lock device, a power window device, a lamp, and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the outside of the vehicle, and receives the captured image. The vehicle exterior information detection unit 12030 may perform object detection processing or distance detection processing of a person, a vehicle, an obstacle, a sign, a character on a road surface, or the like on the basis of the received image.

The imaging unit 12031 is an optical sensor that receives light and outputs an electric signal corresponding to the amount of received light. The imaging unit 12031 can output the electric signal as an image or can output the electric signal as distance measurement information. Furthermore, the light received by the imaging unit 12031 may be visible light or invisible light such as infrared rays.

The vehicle interior information detection unit 12040 detects information inside the vehicle. For example, a driver state detection unit 12041 that detects a state of a driver is connected to the vehicle interior information detection unit 12040. The driver state detection unit 12041 includes, for example, a camera that images the driver, and the vehicle interior information detection unit 12040 may calculate the degree of fatigue or the degree of concentration of the driver or may determine whether or not the driver is dozing off on the basis of the detection information input from the driver state detection unit 12041.

The microcomputer 12051 can calculate a control target value of the driving force generation device, the steering mechanism, or the braking device on the basis of the information inside and outside the vehicle acquired by the vehicle exterior information detection unit 12030 or the vehicle interior information detection unit 12040, and output a control command to the drive system control unit 12010. For example, the microcomputer 12051 can perform cooperative control for the purpose of implementing functions of an advanced driver assistance system (ADAS) including collision avoidance or impact mitigation of the vehicle, follow-up traveling based on an inter-vehicle distance, vehicle speed maintenance traveling, vehicle collision warning, vehicle lane departure warning, or the like.

Furthermore, the microcomputer 12051 controls a driving force generation device, a steering mechanism, a braking device, or the like on the basis of the information around the vehicle acquired by the vehicle exterior information detection unit 12030 or the vehicle interior information detection unit 12040, thereby performing cooperative control for the purpose of automatic driving or the like in which the vehicle autonomously travels without depending on the operation of the driver.

Furthermore, the microcomputer 12051 can output a control command to the body system control unit 12020 on the basis of the vehicle exterior information acquired by the vehicle exterior information detection unit 12030. For example, the microcomputer 12051 can perform cooperative control for the purpose of preventing glare, such as switching from a high beam to a low beam, by controlling the headlamp according to the position of a preceding vehicle or an oncoming vehicle detected by the vehicle exterior information detection unit 12030.

The audio image output unit 12052 transmits an output signal of at least one of a sound or an image to an output device capable of visually or audibly notifying an occupant of the vehicle or the outside of the vehicle of information. In the example of FIG. 77, an audio speaker 12061, a display unit 12062, and an instrument panel 12063 are illustrated as the output device. The display unit 12062 may include, for example, at least one of an on-board display and a head-up display.

Figure 78:
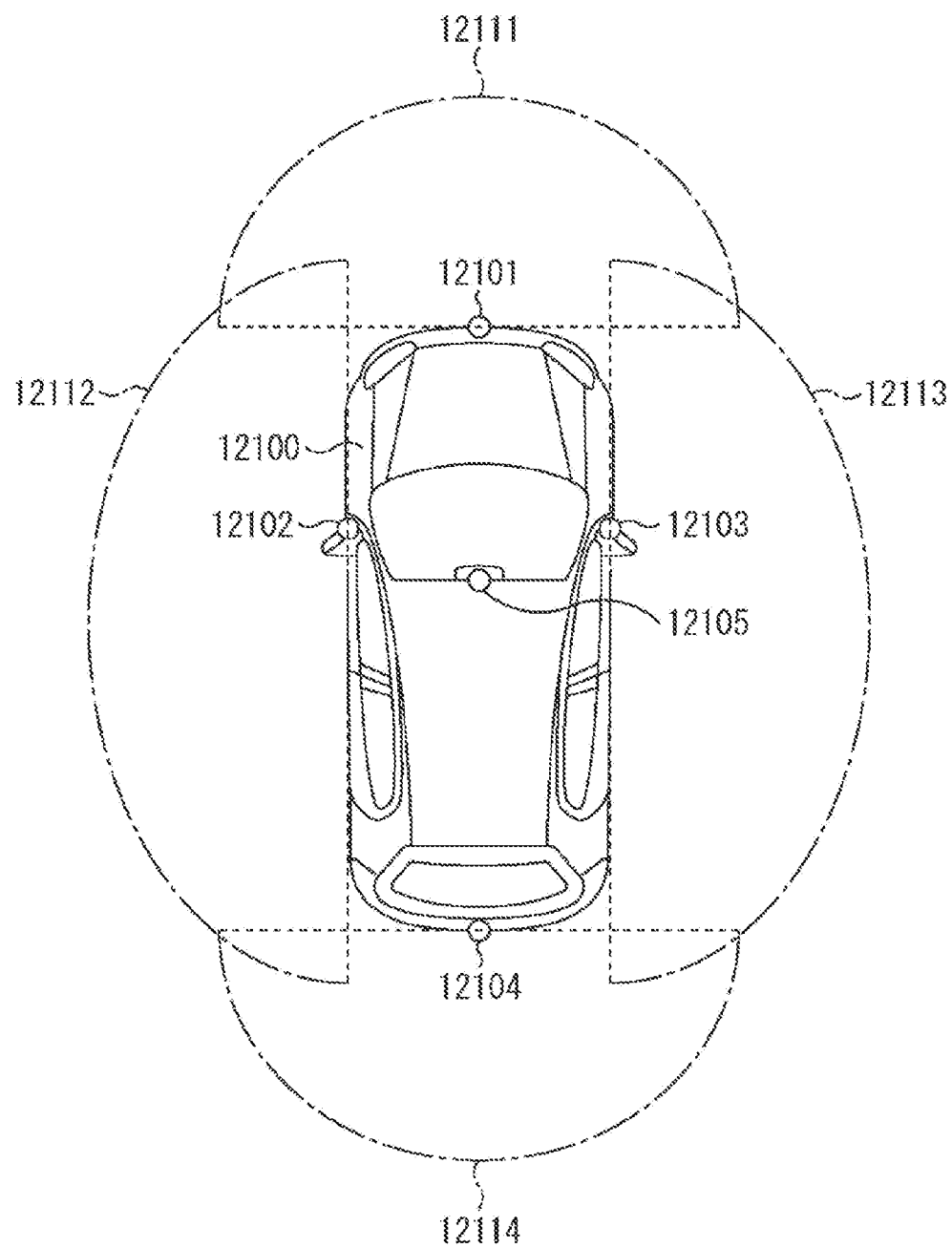
FIG. 78 is an explanatory diagram illustrating an example of installation positions of a vehicle exterior information detection unit and an imaging unit.

FIG. 78 is a diagram illustrating an example of an installation position of the imaging unit 12031.

In FIG. 78, imaging units 12101, 12102, 12103, 12104, and 12105 are included as the imaging unit 12031.

The imaging units 12101, 12102, 12103, 12104, and 12105 are provided, for example, at positions such as a front nose, a side mirror, a rear bumper, a back door, and an upper portion of a windshield in a vehicle interior of a vehicle 12100. The imaging unit 12101 provided at the front nose and the imaging unit 12105 provided at the upper portion of the windshield in the vehicle interior mainly acquire images in front of the vehicle 12100. The imaging units 12102 and 12103 provided at the side mirrors mainly acquire images of the sides of the vehicle 12100. The imaging unit 12104 provided on the rear bumper or the back door mainly acquires an image behind the vehicle 12100. The imaging unit 12105 provided at the upper portion of the windshield in the vehicle interior is mainly used to detect a preceding vehicle, a pedestrian, an obstacle, a traffic light, a traffic sign, a lane, or the like.

Note that FIG. 78 illustrates an example of imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by superimposing image data captured by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 obtains a distance to each three-dimensional object in the imaging ranges 12111 to 12114 and a temporal change (relative speed with respect to the vehicle 12100) of the distance on the basis of the distance information obtained from the imaging units 12101 to 12104, thereby extracting, as a preceding vehicle, a three-dimensional object traveling at a predetermined speed (for example, 0 km/h or more) in substantially the same direction as the vehicle 12100, in particular, the closest three-dimensional object on a traveling path of the vehicle 12100. Furthermore, the microcomputer 12051 can set an inter-vehicle distance to be secured in advance in front of the preceding vehicle, and can perform automatic brake control (including follow-up stop control), automatic acceleration control (including follow-up start control), and the like. As described above, it is possible to perform cooperative control for the purpose of automatic driving or the like in which the vehicle autonomously travels without depending on the operation of the driver.

For example, on the basis of the distance information obtained from the imaging units 12101 to 12104, the microcomputer 12051 can classify three-dimensional object data regarding three-dimensional objects into two-wheeled vehicles, ordinary vehicles, large vehicles, pedestrians, and other three-dimensional objects such as utility poles, extract the three-dimensional object data, and use the three-dimensional object data for automatic avoidance of obstacles. For example, the microcomputer 12051 identifies obstacles around the vehicle 12100 as obstacles that can be visually recognized by the driver of the vehicle 12100 and obstacles that are difficult to visually recognize. Then, the microcomputer 12051 determines a collision risk indicating a risk of collision with each obstacle, and when the collision risk is a set value or more and there is a possibility of collision, the microcomputer can perform driving assistance for collision avoidance by outputting an alarm to the driver via the audio speaker 12061 or the display unit 12062 or performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is present in the captured images of the imaging units 12101 to 12104. Such pedestrian recognition is performed by, for example, a procedure of extracting feature points in the captured images of the imaging units 12101 to 12104 as infrared cameras and a procedure of performing pattern matching processing on a series of feature points indicating the outline of an object to determine whether or not the object is a pedestrian. When the microcomputer 12051 determines that a pedestrian is present in the captured images of the imaging units 12101 to 12104 and recognizes the pedestrian, the audio image output unit 12052 controls the display unit 12062 to superimpose and display a square contour line for emphasis on the recognized pedestrian. Furthermore, the audio image output unit 12052 may control the display unit 12062 to display an icon or the like indicating a pedestrian at a desired position.

An example of the vehicle control system to which the technology according to the present disclosure can be applied has been described above. The technology according to the present disclosure can be applied to the imaging unit 12031, the driver state detection unit 12041, and the like among the configurations described above. Specifically, the ToF sensor 1 according to the present disclosure can be applied to the imaging units 12101, 12102, 12103, 12104, 12105, and the like. As a result, the situation around the vehicle 12100 can be detected more accurately, and thus, more accurate control in automatic driving and the like, more accurate grasping of the state of the driver, and the like can be realized.

Although the embodiments of the present disclosure have been described above, the technical scope of the present disclosure is not limited to the above-described embodiments as it is, and various modifications can be made without departing from the gist of the present disclosure. In addition, components of different embodiments and modification examples may be appropriately combined.

Furthermore, the effects of each embodiment described in the present specification are merely examples and are not limited, and other effects may be provided.

Furthermore, each of the above-described embodiments may be used alone, or may be used in combination with another embodiment.

Note that the present technology can also have the following configurations.

(1)

A solid-state imaging device comprising a pixel array part in which a plurality of pixels is arranged in a matrix, wherein each of the pixels includes a plurality of photoelectric conversion units that each photoelectrically converts incident light to generate charges, a floating diffusion region that accumulates charges, a plurality of transfer circuits that transfer charges generated in each of the plurality of photoelectric conversion units to the floating diffusion region, and a first transistor that causes a pixel signal of a voltage value corresponding to a charge amount of the charges accumulated in the floating diffusion region to appear in a signal line.

(2)

The solid-state imaging device according to (1), wherein each of the plurality of pixels is arranged in a pixel region individually allocated on a first surface of a semiconductor substrate, the plurality of transfer circuits includes a plurality of first transfer circuits arranged point-symmetrically or line-symmetrically with respect to a center of the pixel region or a straight line passing through the center as an axis, and a plurality of second transfer circuits arranged point-symmetrically or line-symmetrically with respect to the center or the straight line as an axis, and each of the photoelectric conversion units is provided on a one-to-one basis for a combination of a first transfer circuit and a second transfer circuit arranged in a predetermined direction in the matrix arrangement.

(3)

The solid-state imaging device according to (2), wherein each of the transfer circuits includes a second transistor having a vertical structure that reaches the photoelectric conversion unit arranged in the semiconductor substrate from the first surface of the semiconductor substrate.

(4)

The solid-state imaging device according to (3), in which the second transistor has two of the vertical structures.

(5)

The solid-state imaging device according to any one of (2) to (4), further comprising a drive unit configured to drive transfer of the charge by the plurality of transfer circuits, wherein the drive unit drives the first and second transfer circuits such that transfer of the charge via the first transfer circuit is different in timing from transfer of the charge via the second transfer circuit.

(6)

The solid-state imaging device according to (5), wherein the drive unit inputs a first drive pulse having a first phase angle with respect to a pulse of a predetermined cycle and the predetermined cycle to the first transfer circuit, and inputs a second drive pulse whose phase is shifted by 180 degrees with respect to the first drive pulse to the second transfer circuit.

(7)

The solid-state imaging device according to (6), wherein the drive unit drives the plurality of first transfer circuits at the same phase and drives the plurality of second transfer circuits at the same phase.

(8)

The solid-state imaging device according to (7), wherein the plurality of first transfer circuits and the plurality of second transfer circuits are arranged point-symmetrically or line-symmetrically with respect to the center or the straight line as an axis.

(9)

The solid-state imaging device according to (7) or (8), wherein the plurality of transfer circuits further includes a plurality of third transfer circuits and a plurality of fourth transfer circuits, and the drive unit inputs a third drive pulse whose phase is shifted by 90 degrees with respect to the first drive pulse to each of the plurality of third transfer circuits and drives the third drive pulse in the same phase, and inputs a fourth drive pulse whose phase is shifted by 180 degrees with respect to the third drive pulse to each of the plurality of fourth transfer circuits and drives the fourth drive pulse in the same phase.

(10)

The solid-state imaging device according to (9), wherein the first drive pulse has the first phase angle of 0 degrees with respect to the pulse of the predetermined cycle, the second drive pulse has a second phase angle of 180 degrees with respect to the pulse of the predetermined cycle, the third drive pulse has a third phase angle of 90 degrees with respect to the pulse of the predetermined cycle, and the fourth drive pulse has a fourth phase angle of 270 degrees with respect to the pulse of the predetermined cycle.

(11)

The solid-state imaging device according to (9) or (10), wherein the plurality of first transfer circuits, the plurality of second transfer circuits, the plurality of third transfer circuits, and the plurality of fourth transfer circuits are arranged point-symmetrically or line-symmetrically with respect to the center or the straight line as an axis.

(12)

The solid-state imaging device according to any one of (9) to (11), wherein each of the transfer circuits includes a memory that holds the charge generated in the photoelectric conversion unit, and the drive unit inputs a first drive pulse having a phase angle of 0 degrees with respect to the pulse of the predetermined cycle and the predetermined cycle to the plurality of first transfer circuits to accumulate the charge in the memory of each of the plurality of first transfer circuits, inputs a second drive pulse having a phase angle of 180 degrees with respect to the pulse of the predetermined cycle and the predetermined cycle to the plurality of second transfer circuits to accumulate the charge in the memory of each of the plurality of second transfer circuits, inputs a third drive pulse having a phase angle of 90 degrees with respect to the pulse of the predetermined cycle and the predetermined cycle to the plurality of third transfer circuits to accumulate the charge in the memory of each of the plurality of third transfer circuits, and inputs a fourth drive pulse having a phase angle of 270 degrees with respect to the pulse of the predetermined cycle and the predetermined cycle to the plurality of fourth transfer circuits to accumulate the charge in the memory of each of the plurality of fourth transfer circuits.

(13)

The solid-state imaging device according to (12), in which the memory is a metal-oxide-semiconductor (MOS) type memory.

(14)

The solid-state imaging device according to any one of (9) to (13), further comprising a signal processing unit that generates distance information on a basis of a ratio between a difference between the charge transferred via the first transfer circuit and the charge transferred via the second transfer circuit and a difference between the charge transferred via the third transfer circuit and the charge transferred via the fourth transfer circuit.

(15)

The solid-state imaging device according to (2), wherein each of the pixels further includes a third transistor that discharges a charge generated in the photoelectric conversion unit.

(16)

The solid-state imaging device according to (15), wherein the third transistor has a vertical structure that reaches the photoelectric conversion unit arranged in the semiconductor substrate from the first surface of the semiconductor substrate to.

(17)

The solid-state imaging device according to (16), in which the third transistor has two of the vertical structures.

(18)

The solid-state imaging device according to (6), wherein the drive unit divides the charge generated in each of the photoelectric conversion units into a plurality of accumulation periods and transfers the divided charge to the floating diffusion region, and the drive unit inverts a phase of each of the first and second drive pulses for each of the accumulation periods.

(19)

The solid-state imaging device according to (18), wherein each of the pixels further includes a third transistor that discharges the charge generated in the photoelectric conversion unit, the drive unit sets a non-accumulation period in which the charge generated in each of the photoelectric conversion units is not transferred to the floating diffusion region during the accumulation period, and the drive unit discharges the charge generated in the photoelectric conversion unit via the third transistor during the non-accumulation period.

(20)

The solid-state imaging device according to any one of (2) to (19), further comprising a pixel separation portion that is provided along a boundary portion of the pixel region and optically separates the adjacent pixels from each other.

(21)

The solid-state imaging device according to (20), in which the pixel separation portion is provided in a trench that penetrates the semiconductor substrate from the first surface to a second surface opposite to the first surface or that reaches from the first surface to a middle of the semiconductor substrate.

(22)

The solid-state imaging device according to (20) or (21), in which the pixel separation portion includes at least one of a dielectric containing silicon oxide as a main component and a metal having an optical characteristic of reflecting near-infrared rays.

(23)

The solid-state imaging device according to any one of (20) to (22), further comprising an element separation portion that is provided at least partially between the plurality of photoelectric conversion elements in the pixel region and optically separates adjacent photoelectric conversion elements from each other.

(24)

The solid-state imaging device according to (23), in which the element separation portion is provided in a trench that penetrates the semiconductor substrate from the first surface to a second surface opposite to the first surface or that reaches from the first surface to a middle of the semiconductor substrate.

(25)

The solid-state imaging device according to (23) or (24), in which the element separation portion includes at least one of a dielectric containing silicon oxide as a main component and a metal having an optical characteristic of reflecting near-infrared rays.

(26)

The solid-state imaging device according to any one of (1) to (25), wherein a periodic uneven structure is provided on a light receiving surface of each of the photoelectric conversion units.

(27)

The solid-state imaging device according to (26), in which a period of the periodic uneven structure is 300 nanometers (nm) or more.

(28)

A distance measurement device comprising:

a light receiving unit including a pixel array part in which a plurality of pixels is arranged in a matrix; and a light emitting unit that emits pulsed irradiation light of a predetermined cycle, wherein each of the pixels includes
a plurality of photoelectric conversion units that each photoelectrically converts incident light to generate charges,
a floating diffusion region that accumulates charges,
a plurality of transfer circuits that transfer charges generated in each of the plurality of photoelectric conversion units to the floating diffusion region, and
a first transistor that causes a pixel signal of a voltage value corresponding to a charge amount of the charges accumulated in the floating diffusion region to appear in a signal line.

REFERENCE SIGNS LIST

1 ToF SENSOR
11 CONTROL UNIT
13 LIGHT EMITTING UNIT
14 LIGHT RECEIVING UNIT
15 CALCULATION UNIT
19 EXTERNAL I/F
20, 20-1 to 20-7, 120-1, 120-2, 120-3, 920 UNIT PIXEL
20A, 20A1 to 20A4, 20B, 20B1 to 20B4, 20C, 20C1, 20C2, 20D1, 20D2, 120A, 120B, 120C, 120D, 920A, 920B READOUT CIRCUIT
21, 211 to 214 PHOTODIODE
22, 221 to 224 OFG TRANSISTOR
23A, 23A1 to 23A4, 23B, 23B1 to 23B4, 23C1, 23C2, 23D1, 23D2 TRANSFER GATE TRANSISTOR
24A, 24A1 to 24A4, 24B, 24B1 to 24B4, 24C, 24C1, 24C2, 24D, 24D1, 24D2 MEMORY
25A, 25A1 to 25A4, 25B, 25B1 to 25B4, 25C, 25C1, 25C2, 25D, 25D1, 25D2 TRANSFER TRANSISTOR
26, 26A, 26B RESET TRANSISTOR
27, 27A, 27B FLOATING DIFFUSION REGION
28, 28A, 28B AMPLIFICATION TRANSISTOR
29, 29A, 29B SELECTION TRANSISTOR
30 BOUNDARY PORTION
31, 33, 34, 35 PIXEL SEPARATION PORTION
32 ELEMENT SEPARATION PORTION
40 SEMICONDUCTOR SUBSTRATE
42 n− TYPE SEMICONDUCTOR REGION
43 n TYPE SEMICONDUCTOR REGION
44 n+ TYPE SEMICONDUCTOR REGION
45 UNEVEN STRUCTURE
50 WIRING LAYER
51 INSULATING FILM
52 WIRE
61 INSULATING FILM
62 LIGHT SHIELDING FILM
63 FLATTENING FILM
64 ON-CHIP LENS
70 PIXEL REGION
71 to 74 DIVIDED REGION
80 HOST
90 OBJECT
100 SOLID-STATE IMAGING DEVICE
101 PIXEL ARRAY PART
102 SYSTEM CONTROL UNIT
103 VERTICAL DRIVE CIRCUIT
104 COLUMN PROCESSING CIRCUIT
105 HORIZONTAL DRIVE CIRCUIT
106 SIGNAL PROCESSING UNIT
107 DATA STORAGE UNIT
341, 351 INSULATING FILM
342, 352 LIGHT SHIELDING PORTION
LD PIXEL DRIVE LINE
VGA, VGB, VGC, VGD DRIVE LINE (DRIVE PULSE)
VSL, VSLA, VSLB VERTICAL SIGNAL LINE

What is claimed is:

1. A solid-state imaging device, comprising:
a pixel array part in which a plurality of pixels is arranged in a matrix,
wherein each of the pixels includes:
a plurality of photoelectric conversion units that each photoelectrically converts incident light to generate charges,
a floating diffusion region that accumulates charges,
a plurality of transfer circuits that transfer charges generated in each of the plurality of photoelectric conversion units to the floating diffusion region, and
a first transistor that causes a pixel signal of a voltage value corresponding to a charge amount of the charges accumulated in the floating diffusion region to appear in a signal line, wherein each of the plurality of pixels is arranged in a pixel region individually allocated on a first surface of a semiconductor substrate,
wherein the plurality of transfer circuits includes:
a plurality of first transfer circuits arranged point-symmetrically or line-symmetrically with respect to a center of the pixel region or a straight line passing through the center as an axis, and
a plurality of second transfer circuits arranged point-symmetrically or line-symmetrically with respect to the center or the straight line as an axis, wherein each of the photoelectric conversion units is provided on a one-to-one basis for a combination of a first transfer circuit and a second transfer circuit arranged in a predetermined direction in the matrix arrangement; and
a drive unit configured to drive transfer of the charge by the plurality of transfer circuits, wherein the drive unit drives the first and second transfer circuits such that transfer of the charge via the first transfer circuit is different in timing from transfer of the charge via the second transfer circuit, wherein the drive unit inputs a first drive pulse having a first phase angle with respect to a pulse of a predetermined cycle and the predetermined cycle to the first transfer circuit, and inputs a second drive pulse whose phase is shifted by 180 degrees with respect to the first drive pulse to the second transfer circuit, and wherein the drive unit drives the plurality of first transfer circuits at a same phase and drives the plurality of second transfer circuits at the same phase.

2. The solid-state imaging device according to claim 1, wherein each of the transfer circuits includes a second transistor having a vertical structure that reaches the photoelectric conversion unit arranged in the semiconductor substrate from the first surface of the semiconductor substrate.

3. The solid-state imaging device according to claim 1, wherein the plurality of first transfer circuits and the plurality of second transfer circuits are arranged point-symmetrically or line-symmetrically with respect to the center or the straight line as an axis.

4. The solid-state imaging device according to claim 1, wherein
the plurality of transfer circuits further includes a plurality of third transfer circuits and a plurality of fourth transfer circuits, and
the drive unit
inputs a third drive pulse whose phase is shifted by 90 degrees with respect to the first drive pulse to each of the plurality of third transfer circuits and drives the third drive pulse in the same phase, and inputs a fourth drive pulse whose phase is shifted by 180 degrees with respect to the third drive pulse to each of the plurality of fourth transfer circuits and drives the fourth drive pulse in the same phase.

5. The solid-state imaging device according to claim 4, wherein the first drive pulse has the first phase angle of 0 degrees with respect to the pulse of the predetermined cycle, the second drive pulse has a second phase angle of 180 degrees with respect to the pulse of the predetermined cycle, the third drive pulse has a third phase angle of 90 degrees with respect to the pulse of the predetermined cycle, and the fourth drive pulse has a fourth phase angle of 270 degrees with respect to the pulse of the predetermined cycle.

6. The solid-state imaging device according to claim 4, wherein the plurality of first transfer circuits, the plurality of second transfer circuits, the plurality of third transfer circuits, and the plurality of fourth transfer circuits are arranged point-symmetrically or line-symmetrically with respect to the center or the straight line as an axis.

7. The solid-state imaging device according to claim 4, wherein each of the transfer circuits includes a memory that holds the charge generated in the photoelectric conversion unit, and the drive unit;

inputs a first drive pulse having a phase angle of 0 degrees with respect to the pulse of the predetermined cycle and the predetermined cycle to the plurality of first transfer circuits to accumulate the charge in the memory of each of the plurality of first transfer circuits;

inputs a second drive pulse having a phase angle of 180 degrees with respect to the pulse of the predetermined cycle and the predetermined cycle to the plurality of second transfer circuits to accumulate the charge in the memory of each of the plurality of second transfer circuits;

inputs a third drive pulse having a phase angle of 90 degrees with respect to the pulse of the predetermined cycle and the predetermined cycle to the plurality of third transfer circuits to accumulate the charge in the memory of each of the plurality of third transfer circuits; and inputs a fourth drive pulse having a phase angle of 270 degrees with respect to the pulse of the predetermined cycle and the predetermined cycle to the plurality of fourth transfer circuits to accumulate the charge in the memory of each of the plurality of fourth transfer circuits.

8. The solid-state imaging device according to claim 4, further comprising a signal processing unit that generates distance information on a basis of a ratio between a difference between the charge transferred via the first transfer circuit and the charge transferred via the second transfer circuit and a difference between the charge transferred via the third transfer circuit and the charge transferred via the fourth transfer circuit.

9. The solid-state imaging device according to claim 1, further comprising a pixel separation portion that is provided along a boundary portion of the pixel region and optically separates the adjacent pixels from each other.

10. The solid-state imaging device according to claim 9, further comprising an element separation portion that is provided at least partially between the plurality of photoelectric conversion elements-units in the pixel region and optically separates adjacent photoelectric conversion elements-units from each other.

11. The solid-state imaging device according to claim 1, wherein a periodic uneven structure is provided on a light receiving surface of each of the photoelectric conversion units.

12. A solid-state imaging device, comprising:
a pixel array part in which a plurality of pixels is arranged in a matrix,
wherein each of the pixels includes:
a plurality of photoelectric conversion units that each photoelectrically converts incident light to generate charges,
a floating diffusion region that accumulates charges,
a plurality of transfer circuits that transfer charges generated in each of the plurality of photoelectric conversion units to the floating diffusion region, and
a first transistor that causes a pixel signal of a voltage value corresponding to a charge amount of the charges accumulated in the floating diffusion region to appear in a signal line, wherein each of the plurality of pixels is arranged in a pixel region individually allocated on a first surface of a semiconductor substrate,
wherein the plurality of transfer circuits includes:
a plurality of first transfer circuits arranged point-symmetrically or line-symmetrically with respect to a center of the pixel region or a straight line passing through the center as an axis, and
a plurality of second transfer circuits arranged point-symmetrically or line-symmetrically with respect to the center or the straight line as an axis, wherein each of the photoelectric conversion units is provided on a one-to-one basis for a combination of a first transfer circuit and a second transfer circuit arranged in a predetermined direction in the matrix arrangement; and
a drive unit configured to drive transfer of the charge by the plurality of transfer circuits, wherein the drive unit drives the first and second transfer circuits such that transfer of the charge via the first transfer circuit is different in timing from transfer of the charge via the second transfer circuit, wherein the drive unit inputs a first drive pulse having a first phase angle with respect to a pulse of a predetermined cycle and the predetermined cycle to the first transfer circuit, and inputs a second drive pulse whose phase is shifted by 180 degrees with respect to the first drive pulse to the second transfer circuit, wherein the drive unit divides the charge generated in each of the photoelectric conversion units into a plurality of accumulation periods and transfers the divided charge to the floating diffusion region, and wherein the drive unit inverts a phase of each of the first and second drive pulses for each of the accumulation periods.

13. The solid-state imaging device according to claim 12, wherein each of the pixels further includes a third transistor that discharges the charge generated in the photoelectric conversion unit, the drive unit sets a non-accumulation period in which the charge generated in each of the photoelectric conversion units is not transferred to the floating diffusion region during the accumulation period, and the drive unit discharges the charge generated in the photoelectric conversion unit via the third transistor during the non-accumulation period.

14. The solid-state imaging device according to claim 12, further comprising a pixel separation portion that is provided along a boundary portion of the pixel region and optically separates adjacent pixels from each other.

15. The solid-state imaging device according to claim 14, further comprising an element separation portion that is provided at least partially between the plurality of photoelectric conversion units in the pixel region and optically separates adjacent photoelectric conversion units from each other.

16. The solid-state imaging device according to claim 12, wherein a periodic uneven structure is provided on a light receiving surface of each of the photoelectric conversion units.

17. A distance measurement device, comprising:
a light receiving unit including a pixel array part in which a plurality of pixels is arranged in a matrix; and
a light emitting unit that emits pulsed irradiation light of a predetermined cycle, wherein
each of the pixels includes:
a plurality of photoelectric conversion units that each photoelectrically converts incident light to generate charges;
a floating diffusion region that accumulates charges;
a plurality of transfer circuits that transfer charges generated in each of the plurality of photoelectric conversion units to the floating diffusion region, and
a first transistor that causes a pixel signal of a voltage value corresponding to a charge amount of the charges accumulated in the floating diffusion region to appear in a signal line, wherein each of the plurality of pixels is arranged in a pixel region individually allocated on a first surface of a semiconductor substrate,
wherein the plurality of transfer circuits includes:
a plurality of first transfer circuits arranged point-symmetrically or line-symmetrically with respect to a center of the pixel region or a straight line passing through the center as an axis, and
a plurality of second transfer circuits arranged point-symmetrically or line-symmetrically with respect to the center or the straight line as an axis, wherein each of the photoelectric conversion units is provided on a one-to-one basis for a combination of a first transfer circuit and a second transfer circuit arranged in a predetermined direction in the matrix arrangement; and
a drive unit configured to drive transfer of the charge by the plurality of transfer circuits, wherein the drive unit drives the first and second transfer circuits such that transfer of the charge via the first transfer circuit is different in timing from transfer of the charge via the second transfer circuit, wherein the drive unit inputs a first drive pulse having a first phase angle with respect to a pulse of a predetermined cycle and the predetermined cycle to the first transfer circuit, and inputs a second drive pulse whose phase is shifted by 180 degrees with respect to the first drive pulse to the second transfer circuit, and wherein the drive unit drives the plurality of first transfer circuits at a same phase and drives the plurality of second transfer circuits at the same phase.

* * * * *